US011605730B2

(12) United States Patent
Hersam et al.

(10) Patent No.: US 11,605,730 B2
(45) Date of Patent: Mar. 14, 2023

(54) SELF-ALIGNED SHORT-CHANNEL ELECTRONIC DEVICES AND FABRICATION METHODS OF SAME

(71) Applicant: NORTHWESTERN UNIVERSITY, Evanston, IL (US)

(72) Inventors: Mark C. Hersam, Wilmette, IL (US); Vinod K. Sangwan, Evanston, IL (US); Megan E. Beck, Evanston, IL (US)

(73) Assignee: NORTHWESTERN UNIVERSITY, Evanston, IL (US)

( * ) Notice: Subject to any disclaimer, the term of this patent is extended or adjusted under 35 U.S.C. 154(b) by 319 days.

(21) Appl. No.: 16/955,268

(22) PCT Filed: Jan. 16, 2019

(86) PCT No.: PCT/US2019/013759
§ 371 (c)(1),
(2) Date: Jun. 18, 2020

(87) PCT Pub. No.: WO2019/143664
PCT Pub. Date: Jul. 25, 2019

(65) Prior Publication Data
US 2020/0395473 A1 Dec. 17, 2020

Related U.S. Application Data

(60) Provisional application No. 62/619,170, filed on Jan. 19, 2018.

(51) Int. Cl.
*H01L 51/05* (2006.01)
*H01L 29/76* (2006.01)
(Continued)

(52) U.S. Cl.
CPC ...... *H01L 29/7606* (2013.01); *H01L 21/0262* (2013.01); *H01L 21/02164* (2013.01);
(Continued)

(58) Field of Classification Search
CPC ........... H01L 29/7606; H01L 21/02164; H01L 21/02238; H01L 21/02521;
(Continued)

(56) References Cited

U.S. PATENT DOCUMENTS 9,472,649 B1 10/2016 Bayraktaroglu et al.
2008/0220562 A1 9/2008 Dimmler et al.
(Continued)

FOREIGN PATENT DOCUMENTS

KR 10-2012-0075110 A 7/2012
WO 2017-079620 A1 5/2017

OTHER PUBLICATIONS

Bower, R. W.; Dill, R. G. IEEE Int. Elect. Dev. Meeting 1966, 12, 102-104.
(Continued)

*Primary Examiner* — David Vu
*Assistant Examiner* — Brandon C Fox
(74) *Attorney, Agent, or Firm* — Locke Lord LLP; Tim Tingkang Xia, Esq.

(57) ABSTRACT

A self-aligned short-channel SASC electronic device includes a first semiconductor layer formed on a substrate; a first metal layer formed on a first portion of the first semiconductor layer; a first dielectric layer formed on the first metal layer and extended with a dielectric extension on a second portion of the first semiconductor layer that extends from the first portion of the first semiconductor layer, the dielectric extension defining a channel length of a channel in the first semiconductor layer; and a gate electrode formed on the substrate and capacitively coupled with the channel. The dielectric extension is conformally grown on the first semiconductor layer in a self-aligned manner. The channel length is less than about 800 nm, preferably, less than about 200 nm, more preferably, about 135 nm.

41 Claims, 34 Drawing Sheets

(51) Int. Cl.

| | | |
|---|---|---|
| H01L 21/02 | (2006.01) | |
| H01L 21/78 | (2006.01) | |
| H01L 29/24 | (2006.01) | |
| H01L 29/45 | (2006.01) | |
| H01L 29/51 | (2006.01) | |
| H01L 29/66 | (2006.01) | |
| H01L 51/00 | (2006.01) | |
| H01L 51/10 | (2006.01) | |

(52) U.S. Cl.
CPC .. *H01L 21/02238* (2013.01); *H01L 21/02521* (2013.01); *H01L 21/02568* (2013.01); *H01L 21/02631* (2013.01); *H01L 21/7806* (2013.01); *H01L 29/24* (2013.01); *H01L 29/45* (2013.01); *H01L 29/51* (2013.01); *H01L 29/66969* (2013.01); *H01L 51/003* (2013.01); *H01L 51/0008* (2013.01); *H01L 51/0048* (2013.01); *H01L 51/0525* (2013.01); *H01L 51/0545* (2013.01); *H01L 51/0562* (2013.01); *H01L 51/105* (2013.01)

(58) Field of Classification Search
CPC ........... H01L 21/02568; H01L 21/0262; H01L 21/02631; H01L 21/7806; H01L 29/24; H01L 29/45; H01L 29/51; H01L 29/66969; H01L 51/0008; H01L 51/003; H01L 51/0048; H01L 51/0525; H01L 51/0545; H01L 51/0562; H01L 51/105
See application file for complete search history.

(56) References Cited

U.S. PATENT DOCUMENTS

| | | | | |
|---|---|---|---|---|
| 2009/0302310 | A1* | 12/2009 | Rinzler | B82Y 10/00 977/734 |
| 2010/0214012 | A1* | 8/2010 | Raza | H01L 29/778 977/734 |
| 2011/0108815 | A1 | 5/2011 | Kummell et al. | |
| 2014/0197459 | A1* | 7/2014 | Kis | H01L 29/40111 257/194 |
| 2016/0155839 | A1* | 6/2016 | Strachan | H01L 29/778 257/29 |
| 2016/0284811 | A1* | 9/2016 | Yu | H01L 21/28506 |

OTHER PUBLICATIONS

Bettis Homan, S.; Sangwan, V. K.; Balla, I.; Bergeron, H.; Weiss, E. A.; Hersam, M. C. Nano Lett. 2017, 17, 164-169.
Jariwala, D.; Howell, S. L.; Chen, K.-S.; Kang, J.; Sangwan, V. K.; Filippone, S. A.; Turrisi, R.; Marks, T. J.; Lauhon, L. J.; Hersam, M. C. Nano Lett. 2016, 16, 497-503.
Jariwala, D.; Marks, T. J.; Hersam, M. C. Nat. Mater. 2016, 16, 170-181.
Desai, S. B.; Madhvapathy, S. R.; Sachid, A. B.; Llinas, J. P.; Wang, Q.; Ahn, G. H.; Pitner, G.; Kim, M. J.; Bokor, J.; Hu, C.; Wong, H.-S. P.; Javey, A. Science 2016, 354, 99-102.
Yan, R.; Fathipour, S.; Han, Y.; Song, B.; Xiao, S.; Li, M.; Ma, N.; Protasenko, V.; Muller, D. A.; Jena, D.; Xing, H. G. Nano Lett. 2015, 15, 5791-5798.
Grigorieva, I. V.; Geim, A. K. Nature 2013, 499, 419-425.
Jariwala, D.; Sangwan, V. K.; Seo, J.-W. T.; Xu, W.; Smith, J.; Kim, C. H.; Lauhon, L. J.; Marks, T. J.; Hersam, M. C. Nano Lett. 2015, 15, 416-421.
Jariwala, D.; Sangwan, V. K.; Wu, C.-C.; Prabhumirashi, P. L.; Geier, M. L.; Marks, T. J.; Lauhon, L. J.; Hersam, M. C. Proc. Natl. Acad. Sci. U.S.A. 2013, 110, 18076-18080.
Cheng, R.; Bai, J.; Liao, L.; Zhou, H.; Chen, Y.; Liu, L.; Lin, Y.-C.; Jiang, S.; Huang, Y.; Duan, X. Proc. Natl. Acad. Sci. U.S.A. 2012, 109, 11588-11592.

Liu, H.; Neal, A. T.; Ye, P. D. ACS Nano 2012, 6, 8563-8569.
Hattori, R.; Shirafuji, J. J. J. Appl. Phys. 1994, 33, 612.
Shannon, J. M.; Gerstner, E. G. IEEE Elec. Dev. Lett. 2003, 24, 405-407.
Valletta, A.; Mariucci, L.; Rapisarda, M.; Fortunato, G. JAP 2013, 114, 064501.
Sze, S. M.; Ng, K. K., Physics of Semiconductor Devices. Wiley-Interscience: 2006.
Balon, F.; Shannon, J. M. Sol. Stat. Electron. 2006, 50, 378-383.
Lindner, T.; Paasch, G.; Scheinert, S. IEEE Trans. Electron Dev. 2005, 52, 47-55.
Sporea, R. A.; Trainor, M. J.; Young, N. D.; Guo, X.; Shannon, J. M.; Silva, S. R. P. Sol. Stat. Electron. 2011, 65, 246-249.
Sanne, A.; Ghosh, R.; Rai, A.; Yogeesh, M. N.; Shin, S. H.; Sharma, A.; Jarvis, K.; Mathew, L.; Rao, R.; Akinwande, D. Banerjee, S. Nano Lett. 2015, 15, 5039-5045.
Lee, C.-H.; Lee, G.-H.; van der Zande, A. M.; Chen, W.; Li, Y.; Han, M.; Cui, X.; Arefe, G.; Nuckolls, C.; Heinz, T. F.; Guo, J.; Hone, J.; Kim, P. Nat. Nanotechnol. 2014, 9, 676-681.
Nourbakhsh, A.; Zubair, A.; Dresselhaus, M. S.; Palacios, T. Nano Lett. 2016, 16, 1359-1366.
Roy, T.; Tosun, M.; Cao, X.; Fang, H.; Lien, D.-H.; Zhao, P.; Chen, Y.-Z.; Chueh, Y.-L.; Guo, J.; Javey, A. ACS Nano 2015, 9, 2071-2079.
Withers, F.; Del Pozo-Zamudio, O.; Mishchenko, A.; Rooney, A. P.; Gholinia, A.; Watanabe, K.; Taniguchi, T.; Haigh, S. J.; Geim, A. K.; Tartakovskii, A. I.; Novoselov, K. S. Nat Mater 2015, 14, 301-306.
Zhou, R.; Ostwal, V.; Appenzeller, J. Nano Lett. 2017, 17, 4787-4792.
Deng, Y.; Luo, Z.; Conrad, N. J.; Liu, H.; Gong, Y.; Najmaei, S.; Ajayan, P. M.; Lou, J.; Xu, X.; Ye, P. D. ACS Nano 2014, 8, 8292-8299.
Liu, X.; Qu, D.; Li, H.-M.; Moon, I.; Ahmed, F.; Kim, C.; Lee, M.; Choi, Y.; Cho, J. H.; Hone, J. C.; Yoo, W. J. ACS Nano 2017, 11, 9143-9150.
Wood, J. D.; Wells, S. A.; Jariwala, D.; Chen, K.-S.; Cho, E.; Sangwan, V. K.; Liu, X.; Lauhon, L. J.; Marks, T. J.; Hersam, M. C. Nano Lett. 2014, 14, 6964-6970.
Crespo, J. L.; Duro, R. J.; Pena, F. L. IEEE Trans. Instr. & Measure. 2003, 52, 724-732.
Chuang, S.; Battaglia, C.; Azcatl, A.; McDonnell, S.; Kang, J. S.; Yin, X.; Tosun, M.; Kapadia, R.; Fang, H.; Wallace, R. M.; Javey, A. Nano Lett. 2014, 14, 1337-1342.
Jariwala, D.; Sangwan, V. K.; Lauhon, L. J.; Marks, T. J.; Hersam, M. C. ACS Nano 2014, 8, 1102-1120.
Lotsch, B. V. Annu. Rev. Mater. Res. 2015, 45, 85-109.
Howell, S. L.; Jariwala, D.; Wu, C.-C.; Chen, K.-S.; Sangwan, V. K.; Kang, J.; Marks, T. J.; Hersam, M. C.; Lauhon, L. J. Nano Lett. 2015, 15, 2278-2284.
Nan, M.; Debdeep, J. 2D Materials 2015, 2, 015003.
Ma, N.; Jena, D. Phys. Rev. X 2014, 4, 011043.
Caughey, D. M.; Thomas, R. E. Proceedings of the IEEE 1967, 55, 2192-2193.
Khakifirooz, A.; Nayfeh, O. M.; Antoniadis, D. IEEE Trans. Electron Dev. 2009, 56, 1674-1680.
Liu, W.; Sarkar, D.; Kang, J.; Cao, W.; Banerjee, K. ACS Nano 2015, 9, 7904-7912.
Zhang, C.; Johnson, A.; Hsu, C.-L.; Li, L.-J.; Shih, C.-K. Nano Lett. 2014, 14, 2443-2447.
Sup Choi, M.; Lee, G.-H.; Yu, Y.-J.; Lee, D.-Y.; Hwan Lee, S.; Kim, P.; Hone, J.; Jong Yoo, W. Nat. Commun. 2013, 4, 1624.
Cheiwchanchamnangij, T.; Lambrecht, W. R. L. Phys. Rev. B 2012, 85, 205302.
Wickramaratne, D.; Zahid, F.; Lake, R. K. J. Chem. Phys. 2014, 140, 124710.
Padilha, J. E.; Peelaers, H.; Janotti, A.; Van de Walle, C. G. Phys. Rev. B 2014, 90, 205420.
Sangwan, V. K.; Jariwala, D.; Filippone, S. A.; Karmel, H. J.; Johns, J. E.; Alaboson, J. M. P.; Marks, T. J.; Lauhon, L. J.; Hersam, M. C. Nano Lett. 2013, 13, 1162-1167.

(56) References Cited

OTHER PUBLICATIONS

He, G.; Ghosh, K.; Singisetti, U.; Ramamoorthy, H.; Somphonsane, R.; Bohra, G.; Matsunaga, M.; Higuchi, A.; Aoki, N.; Najmaei, S.; Gong, Y.; Zhang, X.; Vajtai, R.; Ajayan, P. M.; Bird, J. P. Nano Lett. 2015, 15, 5052-5058.

Fiori, G.; Szafranek, B. N.; Iannaccone, G.; Neumaier, D. Appl. Phys. Lett. 2013, 103, 233509.

Edmonds, M. T.; Tadich, A.; Carvalho, A.; Ziletti, A.; O'Donnell, K. M.; Koenig, S. P.; Coker, D. F.; Özyilmaz, B.; Neto, A. H. C.; Fuhrer, M. S. ACS Appl. Mater. & Inter. 2015, 7, 14557-14562.

Nagahama, T.; Kobayashi, M.; Akahama, Y.; Endo, S.; Narita, S.-i. J. Phys. Soc. Japan 1985, 54, 2096-2099.

Qiao, J.; Kong, X.; Hu, Z.-X.; Yang, F.; Ji, W. Nat. Commun. 2014, 5, 4475.

Yuchen, D.; Adam, T. N.; Hong, Z.; Peide, D. Y. 2D Materials 2016, 3, 024003.

Ling, Z.-P.; Sakar, S.; Mathew, S.; Zhu, J.-T.; Gopinadhan, K.; Venkatesan, T.; Ang, K.-W. Scientific Reports 2015, 5, 18000.

Korean Intellectual Property Office (ISR/KR), "International Search Report for PCT/US2019/013759", Korea, dated May 9, 2019.

Lee, C.; Yan, H.; Brus, L. E.; Heinz, T. F.; Hone, J.; Ryu, S. ACS Nano 2010, 4, 2695-2700.

\* cited by examiner

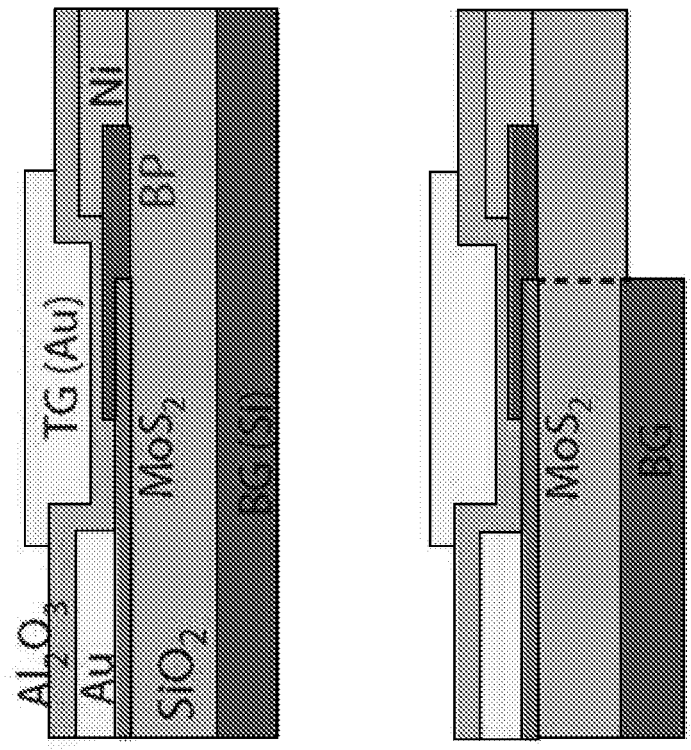
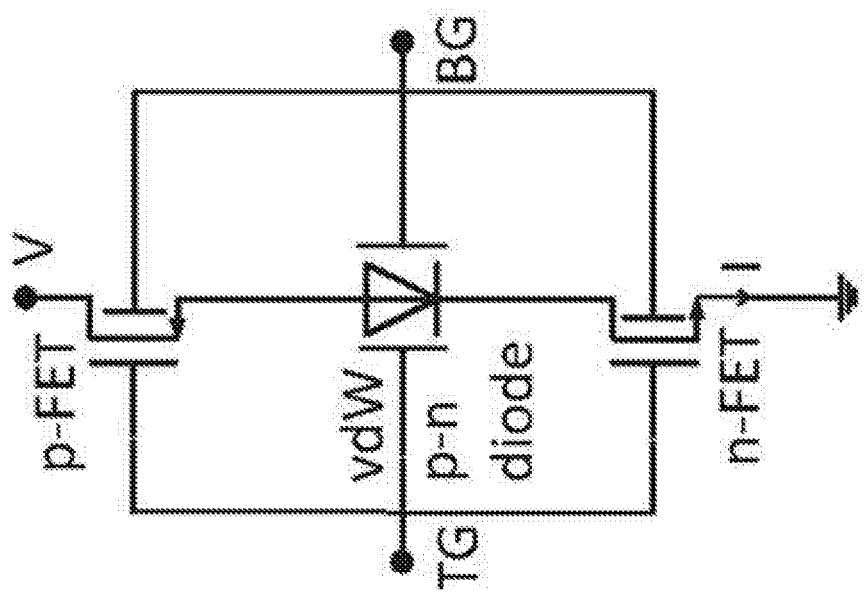
FIG. 4A
FIG. 4B

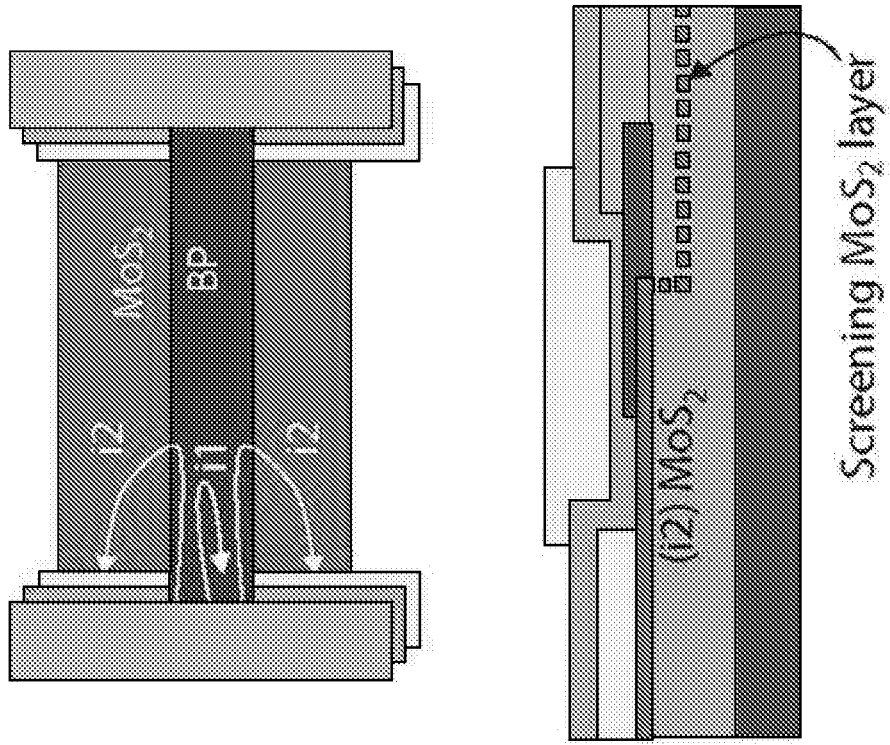
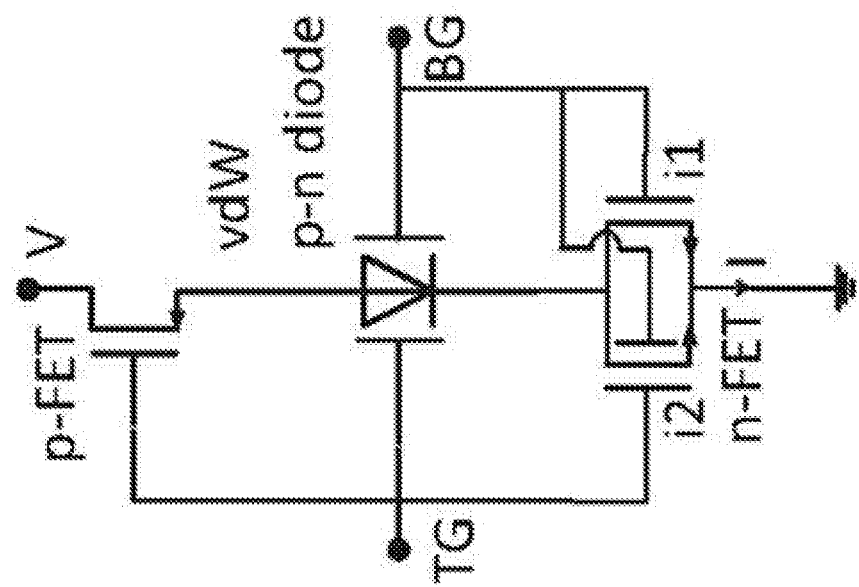
FIG. 4E
FIG. 4F

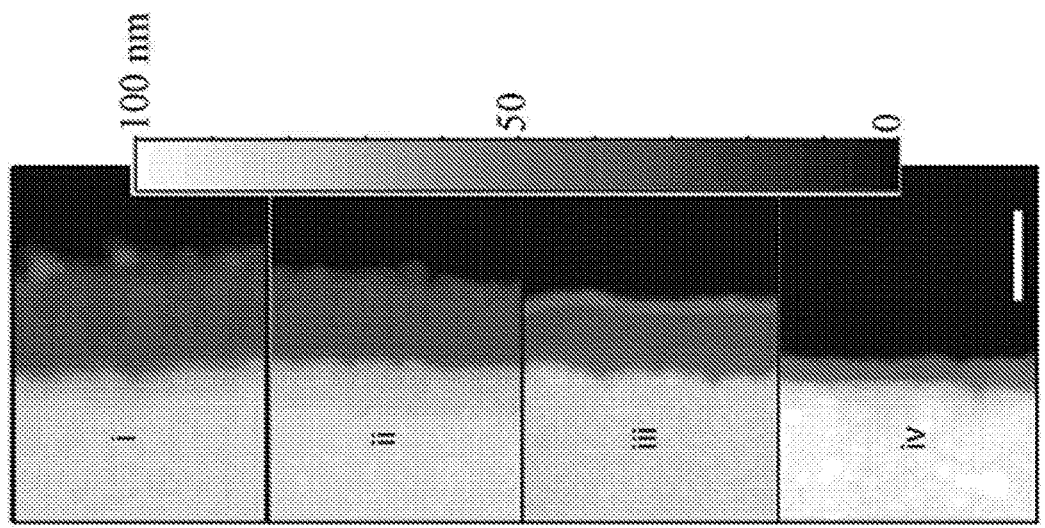
FIG. 5A
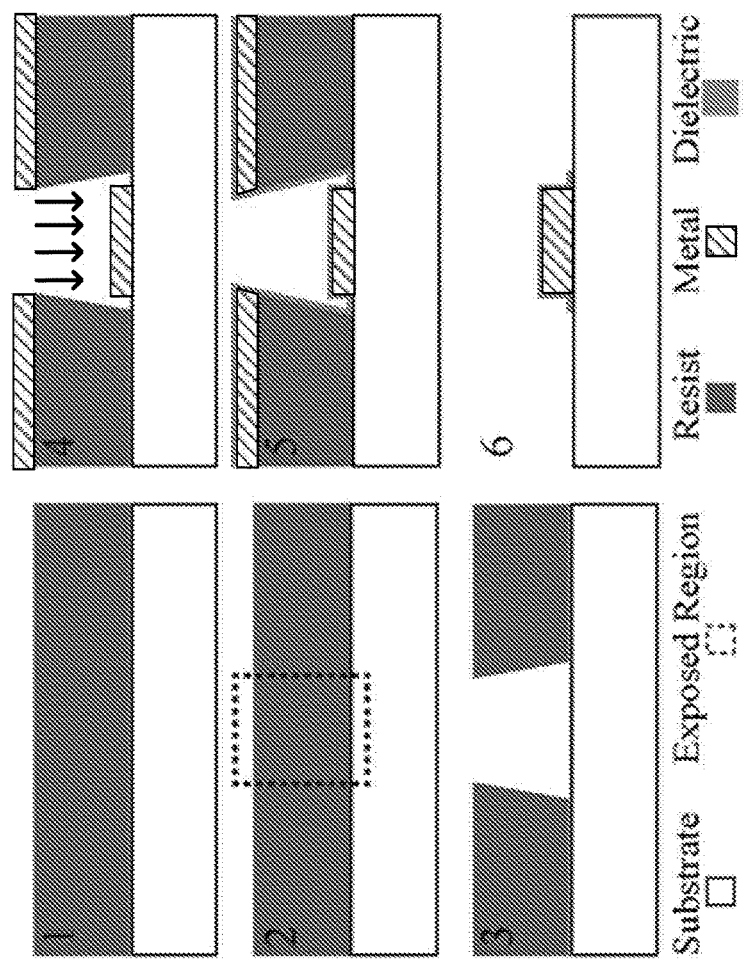
FIG. 5B
FIG. 5C

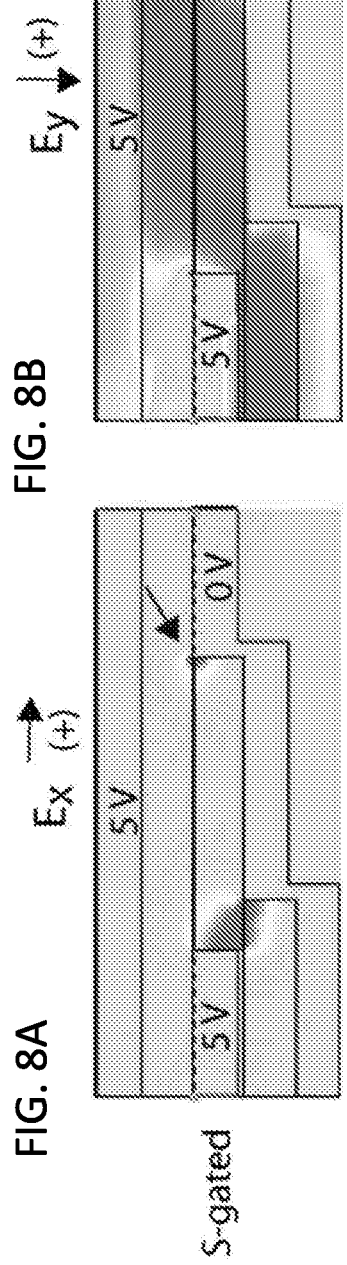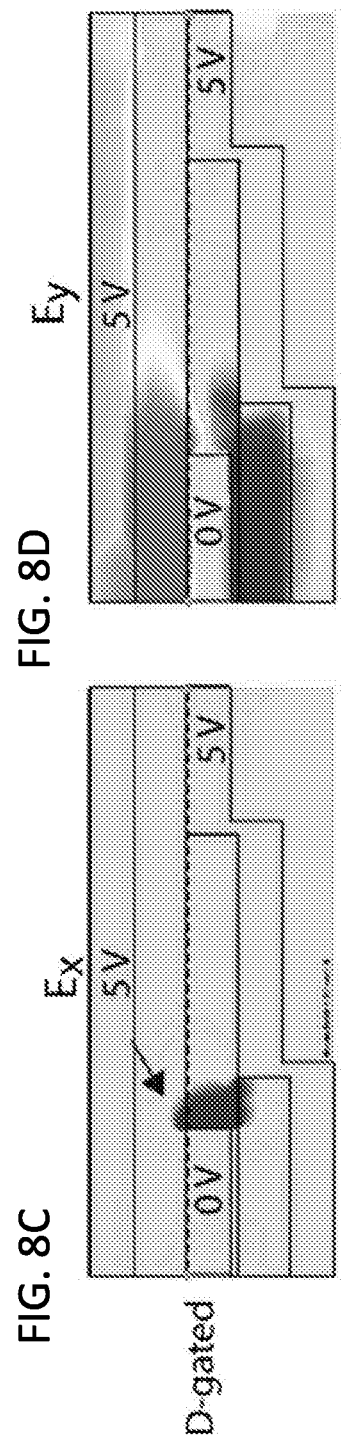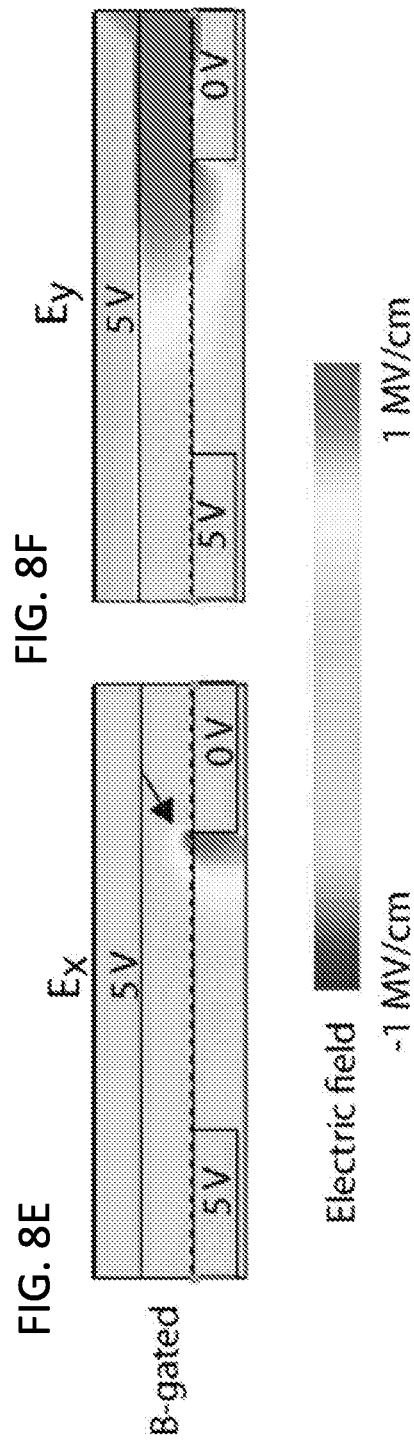

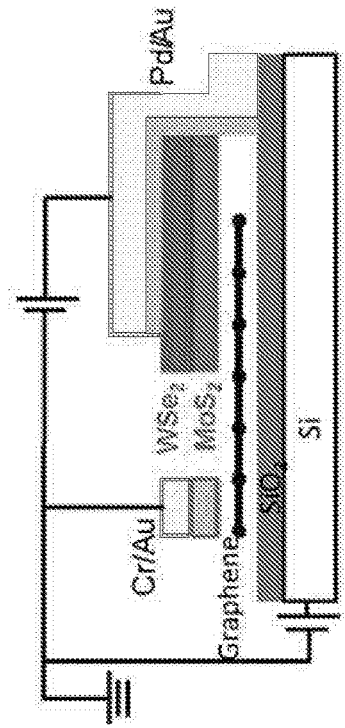
FIG. 11E
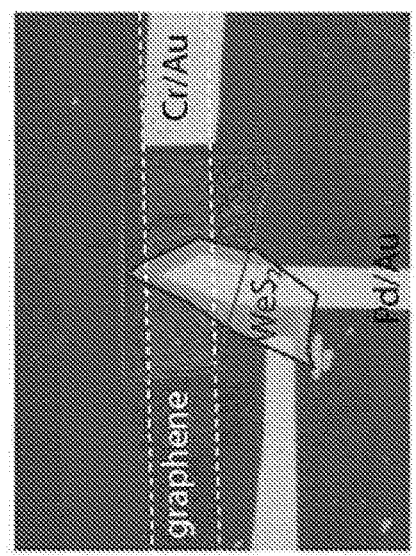
FIG. 11F
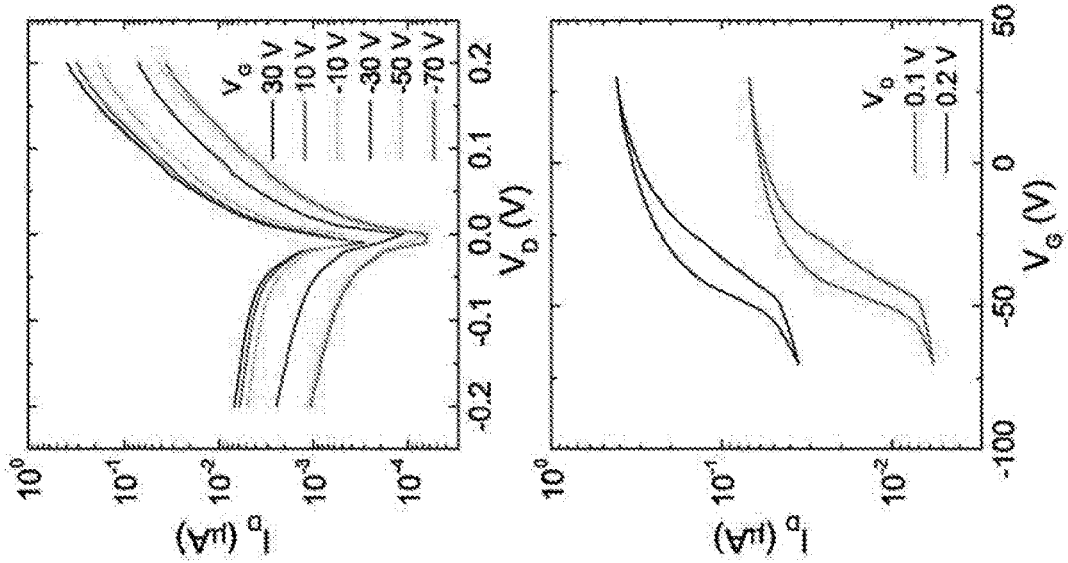
FIG. 11G
FIG. 11H

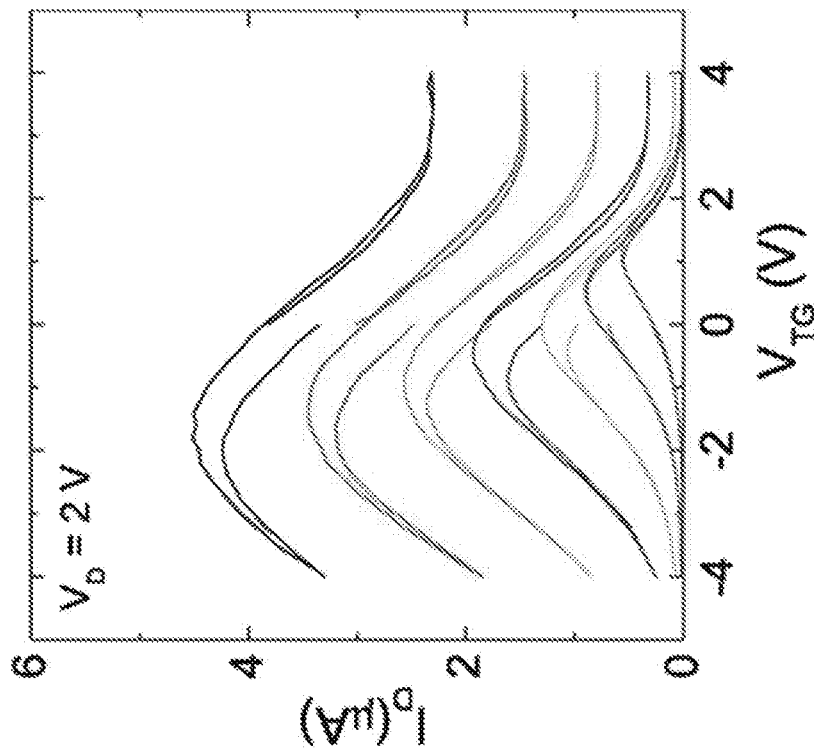
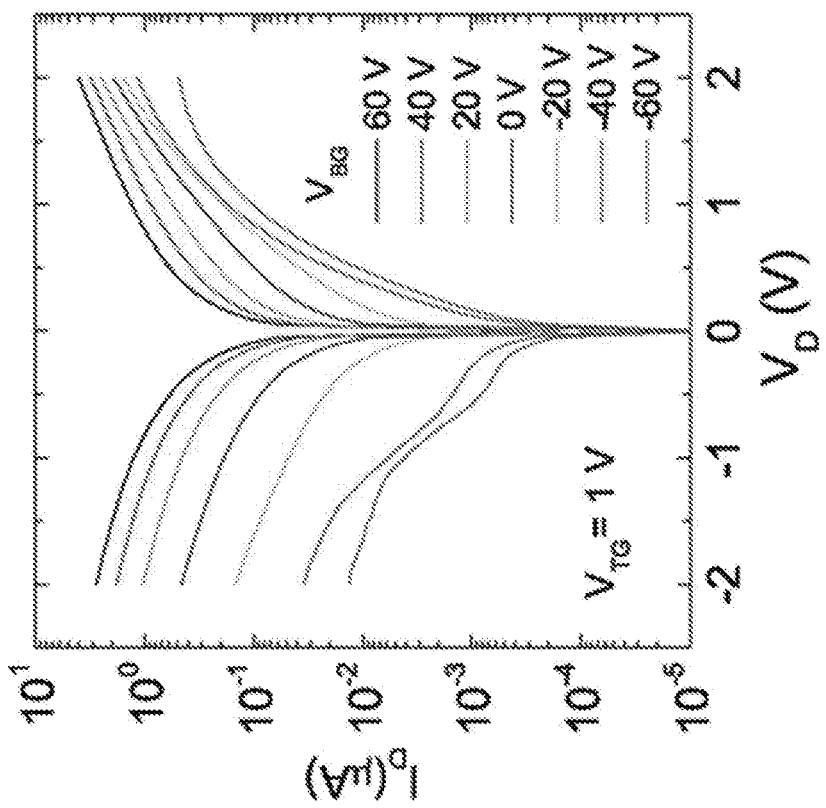
FIG. 12B
FIG. 12A

FIG. 17A
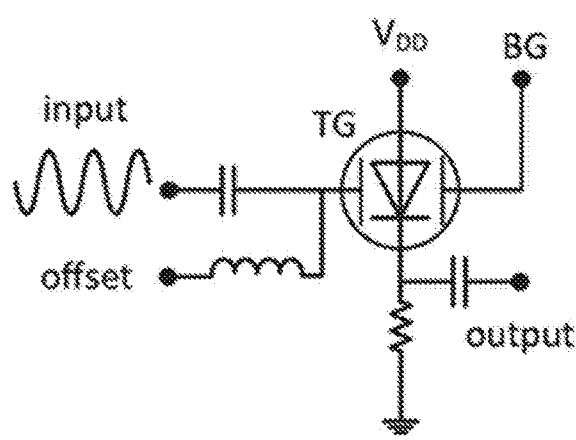
FIG. 17B
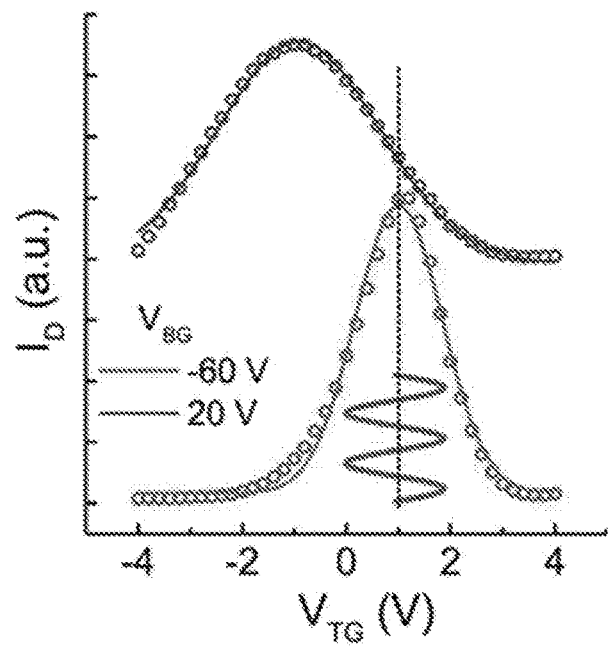
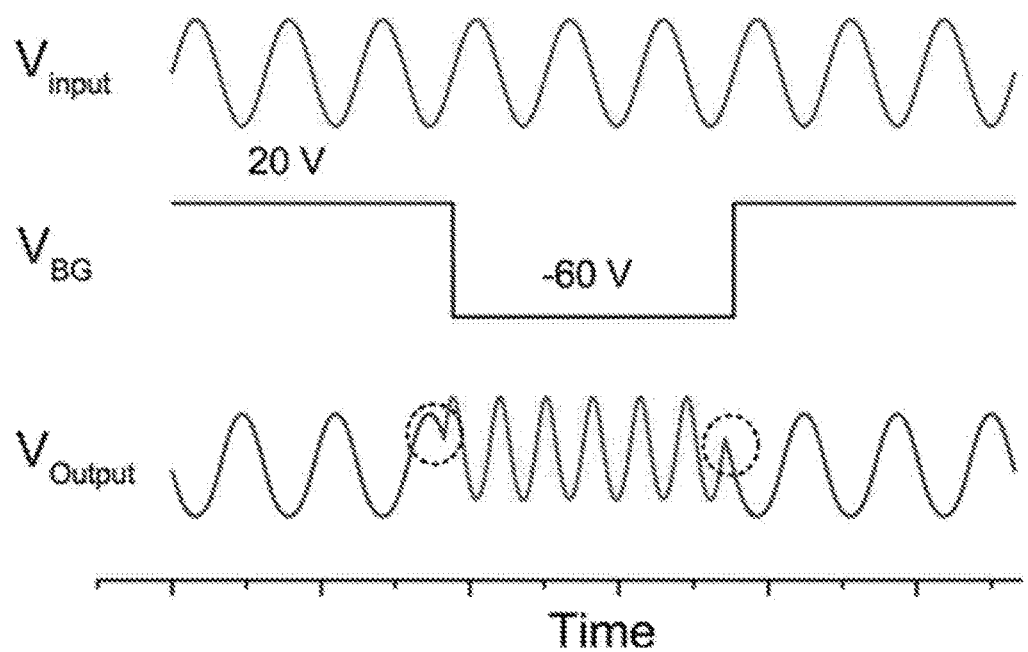
FIG. 17C

SELF-ALIGNED SHORT-CHANNEL ELECTRONIC DEVICES AND FABRICATION METHODS OF SAME

CROSS-REFERENCE TO RELATED PATENT APPLICATION

This application claims priority to and the benefit of U.S. provisional patent application Ser. No. 62/619,170, filed Jan. 19, 2018, entitled "SELF-ALIGNED VAN DER WAALS HETEROJUNCTION DIODES AND TRANSISTORS AND METHOD OF MAKING SAME," by Vinod K. Sangwan, Megan E. Beck and Mark C. Hersam, which is incorporated herein in its entirety by reference.

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference. In terms of notation, hereinafter, "[n]" represents the nth reference cited in the reference list. For example, [2] represents the 2nd reference cited in the reference list, namely, Bettis Homan, S.; Sangwan, V. K.; Balla, I.; Bergeron, H.; Weiss, E. A.; Hersam, M. C. *Nano Lett.* 2017, 17, 164-169.

STATEMENT AS TO RIGHTS UNDER FEDERALLY-SPONSORED RESEARCH

This invention was made with government support under EFRI-1433510 and DMR-1720139 awarded by the National Science Foundation, and 70NANB14H012 awarded by the National Institute of Standards and Technology. The government has certain rights in the invention.

FIELD OF THE INVENTION

The present invention relates generally to semiconductors, and more particularly, to self-aligned short channel electronic devices, fabrication methods and applications of the same.

BACKGROUND OF THE INVENTION

The background description provided herein is for the purpose of generally presenting the context of the invention. The subject matter discussed in the background of the invention section should not be assumed to be prior art merely as a result of its mention in the background of the invention section. Similarly, a problem mentioned in the background of the invention section or associated with the subject matter of the background of the invention section should not be assumed to have been previously recognized in the prior art. The subject matter in the background of the invention section merely represents different approaches, which in and of themselves may also be inventions. Work of the presently named inventors, to the extent it is described in the background of the invention section, as well as aspects of the description that may not otherwise qualify as prior art at the time of filing, are neither expressly nor impliedly admitted as prior art against the invention.

Parallel self-aligned fabrication methods in modern silicon-based microelectronics have enabled sub-lithographic registration between processing steps, ultimately facilitating substantial advances in circuit complexity over the past few decades W. However, two-dimensional (2D) material devices have not yet exploited parallel self-aligned fabrication to achieve both short channels and large area fabrication while 2D materials have shown significant potential for digital and analog electronics due to their high mobilities, ultrathin geometry, and broad range of permutations in van der Waals heterojunctions (vdWHs) [2-9]. Thus far, short-channel 2D material transistors and vdWHs have been achieved using serial processing methods such as electron-beam lithography or mechanical placement on nanotube or nanowire gates [5, 10, 11]. Similarly, the relative alignment of different layers in vdWHs has been inhibited by the diffraction-limited resolution of transfer and alignment methods. Therefore, a heretofore unaddressed need exists in the art to address the aforementioned deficiencies and inadequacies.

SUMMARY OF THE INVENTION

One of the objectives of this invention is to provide a self-aligned processing methodology that enables the fabrication of 2D material transistors with channel lengths below about 150 nm with minimal short-channel effects and improved current saturation, as demonstrated with monolayer $MoS_2$. In vdWHs based on black phosphorus (BP) and $MoS_2$, this self-aligned approach allows dual-gate electrostatic control of the carrier density in both of the constituent semiconductors while concurrently achieving independent gate control of the short-channel series transistors. Since the self-aligned methodology is compatible with a diverse range of nanomaterials and can be implemented in parallel via large-area lithographic processes without sacrificing lateral spatial resolution, it has applications in fabrications of a wide range of 2D and mixed-dimensional vdWH devices.

In certain embodiments, a general self-aligned fabrication method is disclosed for a diverse class of electronic devices based on van der Waals materials and heterojunctions. In particular, self-alignment enables the fabrication of source-gated transistors in monolayer $MoS_2$ with near-ideal current saturation characteristics and channel lengths down to about 135 nm. Furthermore, self-alignment of van der Waals p-n heterojunction diodes achieves complete electrostatic control of both the p-type and n-type constituent semiconductors in a dual-gated geometry, resulting in gate-tunable mean and variance of anti-ambipolar Gaussian characteristics. Through finite-element device simulations, the operating principles of source-gated transistors and dual-gated anti-ambipolar devices are elucidated, thus providing design rules for additional devices that employ self-aligned geometries. In certain embodiments, the versatility of this method is demonstrated via contact-doped $MoS_2$ homojunction diodes and mixed-dimensional heterojunctions based on organic semiconductors. The scalability of this method is also shown by fabricating self-aligned short-channel transistors with sub-diffraction channel lengths in the range of about 150 nm to about 800 nm using photolithography on large-area $MoS_2$ films grown by chemical vapor deposition. Overall, this self-aligned fabrication method represents an important step towards the scalable integration of van der Waals heterojunction devices into more sophisticated circuits and systems.

In one aspect, the invention relates to a self-aligned short-channel (SASC) electronic device. In one embodiment, the SASC electronic device includes a first semiconductor layer formed on a substrate; a first metal layer formed on a first portion of the first semiconductor layer; a first dielectric layer formed on the first metal layer and extended with a dielectric extension on a second portion of the first semiconductor layer that extends from the first portion of the first semiconductor layer, the dielectric extension defining a channel length of a channel in the first semiconductor layer; and a gate electrode formed on the substrate and capacitively coupled with the channel. In one embodiment, the channel length is less than about 800 nm, preferably, less than about 200 nm, more preferably, about 135 nm.

In one embodiment, the SASC electronic device further includes a gate dielectric layer formed between the first semiconductor layer and the gate electrode. In one embodiment, the gate dielectric layer is formed of oxidized silicon ($SiO_2$), or a dielectric material rather than $SiO_2$.

In one embodiment, the gate electrode is formed of highly doped silicon (Si), or a conductive material rather than Si.

In one embodiment, the substrate comprises a Si layer that forms the gate electrode, and an $SiO_2$ layer that forms a gate dielectric layer formed between the first semiconductor layer and the gate electrode.

In one embodiment, the first semiconductor layer formed of an atomically thin material comprising $MoS_2$, $MoSe_2$, $WS_2$, $WSe_2$, InSe, GaTe, black phosphorus (BP), or related two-dimensional materials.

In one embodiment, the SASC electronic device further includes a second metal layer formed on the first dielectric layer and a third portion of the first semiconductor layer that extends from the second portion of the first semiconductor layer.

In one embodiment, the SASC electronic device is a transistor or a contact-doped diode.

In one embodiment, the SASC electronic device further includes a second semiconductor layer formed on the first dielectric layer and a third portion of the first semiconductor layer that extends from the second portion of the first semiconductor layer; a second metal layer formed on a first portion of the second semiconductor layer that is overlapped with the first metal layer; and a second dielectric layer formed on the second metal layer and extended on a second portion of the second semiconductor layer that extends from the first portion of the second semiconductor layer.

In one embodiment, the first and second dielectric layers are formed of a same dielectric material or different dielectric materials. In one embodiment, each of the first and second dielectric layers is formed by atomic layer deposition (ALD). In one embodiment, the first and second dielectric layers comprise $Al_2O_3$, $HfO_2$, $ZrO_2$, or ZnO.

In certain embodiments, the first semiconductor layer is formed of an atomically thin material comprising one of $MoS_2$, $MoSe_2$, $WS_2$, $WSe_2$, InSe, GaTe and BP, and the second semiconductor layer is formed of a second semiconductor comprising BP, $WSe_2$, or single-walled carbon nanotubes (SWCNTs).

In one embodiment, the SASC electronic device comprises self-aligned van der Waals heterojunctions (vdWHs).

In one embodiment, the SASC electronic device further includes a top gate electrode formed on the second dielectric layer.

In one embodiment, the first and second metal layers are formed of a same metallic material or different metallic materials, and serve as a bottom contact (BC) and a top contact (TC) for minimum contact resistance with the first and second semiconductors, respectively. In one embodiment, each of the first and second metal layers is formed one of gold (Au), titanium (Ti), aluminum (Al), nickel (Ni), chromium (Cr), and other conductive materials. In one embodiment, the first and second metal layers comprise Au and Ni, respectively.

In another aspect, the invention relates to a circuitry having one or more SASC electronic devices according to the above disclosure.

In yet another aspect, the invention relates to a method for fabricating an SASC electronic device. In one embodiment, the method includes forming an undercut profile with a bilayer resist on a first semiconductor layer that is formed on a substrate; forming a first metal layer on the undercut profile and the bilayer resist by a directional deposition process; forming a first dielectric layer on the first metal layer by ALD so that the first dielectric layer on the first metal layer in the undercut profile has a dielectric extension conformally grown on the first semiconductor layer in a self-aligned manner; and forming an encapsulated metal contact in the undercut profile by directional evaporation of metal of the first metal layer on the bilayer resist and lift-off process to remove the bilayer resist, where the encapsulated metal contact comprises the first metal covered by the first dielectric layer with the dielectric extension on the first semiconductor, so as to form an SASC electronic device, where the dielectric extension defines a channel length of a channel of the SASC electronic device in the first semiconductor layer, where the substrate comprises a silicon layer defining a gate electrode capacitively coupled with the channel.

In one embodiment, the first semiconductor layer is formed of an atomically thin material on an $SiO_2$ layer of the substrate by chemical vapor deposition (CVD).

In one embodiment, the $SiO_2$ layer is disposed between the gate electrode and the first semiconductor layer.

In one embodiment, the bilayer resist comprises a first resist formed on the first semiconductor layer and a second resist formed on the first resist, where the first resist has a molecular weight that is lower than that of the second resist, whereby the first resist has sensitivity to electron dose being higher than that of the second resist. In one embodiment, the step of forming the undercut profile with the bilayer resist is formed by electron-beam lithography, such that the undercut profile has a first gap between edges defined by the first resist being wider than a second gap between edges defined by the second resist.

In one embodiment, the method further comprises forming a second metal layer on the first dielectric layer with the dielectric extension and the first semiconductor layer. In one embodiment, the step of forming the second metal layer is performed by evaporation of the same metal or a different metal of the first metal layer.

In one embodiment, the SASC electronic device is a transistor or a contact-doped diode.

In one embodiment, the method further comprises forming a second semiconductor layer on the first dielectric layer with the dielectric extension and the first semiconductor; forming a second metal layer on a first portion of the second semiconductor layer that is overlapped with the first metal layer; and forming a second dielectric layer on the second metal layer and a second portion of the second semiconductor layer that extends from the first portion of the second semiconductor layer, by the ALD.

In one embodiment, the step of forming the second semiconductor layer on the first dielectric layer with the dielectric extension and the first semiconductor comprises mechanically exfoliating flakes of a second semiconductor onto a polydimethylsiloxane (PDMS) substrate; and transferring the mechanically exfoliated flakes of the second semiconductor from the PDMS substrate to the first dielectric layer with the dielectric extension and the first semiconductor using a micromanipulator and/or an optical microscope.

In one embodiment, the first and second semiconductor layers are formed of different semiconductors. In certain embodiments, the first semiconductor layer is formed of an atomically thin material comprising one of $MoS_2$, $MoSe_2$, $WS_2$, $WSe_2$, InSe, GaTe and BP, and the second semiconductor layer is formed of a second semiconductor comprising BP, $WSe_2$, or single-walled carbon nanotubes (SWCNTs).

In one embodiment, the first and second dielectric layers are formed of a same dielectric material or different dielectric materials.

In one embodiment, the first and second metal layers are formed of a same metallic material or different metallic materials.

In one embodiment, the method further comprises forming a top gate electrode on the second dielectric layer.

In one embodiment, the SASC electronic device comprises forming van der Waals heterojunctions (vdWHs).

In one aspect, the invention relates to a method for fabricating a SASC electronic device. In one embodiment, the method includes forming a 2D semiconductor device having a channel length being less than about 200 nm. The 2D semiconductor device comprises a first semiconductor layer formed of an atomically thin material on a substrate; a first metal layer formed on the first semiconductor layer; and a first dielectric layer formed on the first metal layer and extended with a dielectric extension on the first semiconductor layer, where the dielectric extension defines the channel length in the first semiconductor layer.

In one embodiment, the step of forming the 2D semiconductor device comprises forming an undercut profile with a bilayer resist on the first semiconductor layer by electron-beam lithography, where the bilayer resist comprises a first resist formed on the first semiconductor layer and a second resist formed on the first resist, where the first resist has a molecular weight that is lower than that of the second resist, such that the formed undercut profile has a first gap between edges defined by the first resist being wider than a second gap between edges defined by the second resist; directionally depositing a first metal in the undercut profile to form the first metal layer; and ALD growing a first dielectric material on the first metal layer to form the first dielectric layer with the dielectric extension conformally grown on the first semiconductor layer in the undercut profile in a self-aligned manner.

In one embodiment, the step of forming the 2D semiconductor device further comprises directionally evaporating the first metal on the bilayer resist, and removing the bilayer resist.

In one embodiment, the 2D semiconductor device is a transistor or a contact-doped diode.

In one embodiment, van der Waals heterojunctions (vdWHs) are achieved by transferring another 2D semiconductor device followed by metallization.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

FIG. 1A shows a fabrication scheme for a dielectric extension on a 2D semiconducting layer, where (i) an undercut profile is achieved using a bilayer resist; (ii) an encapsulated metal contact is fabricated by directional evaporation of metal followed by conformal atomic layer deposition (ALD) of the dielectric followed by (iii) lift-off to remove the resist bilayer; (iv, left) a transistor or a contact-doped diode is achieved by subsequent evaporation of the same or a different metal, respectively, with the channel length (L) defined by the dielectric extension; and (v, right) Van der Waals heterojunctions (vdWHs) are achieved by transferring another 2D semiconductor followed by metallization. FIG. 1B shows a schematic of a self-aligned short-channel (SASC) $MoS_2$ field-effect transistor (FET) with a local gate on an undoped Si substrate with thermal oxide coating, where the top electrode on the right-hand side overlaps the dielectric extension and thus also overlaps the channel. FIG. 1C shows an optical micrograph of a SASC $MoS_2$ transistor, where the source-gated (S-gated) case refers to a biasing condition where the electrode under the dielectric extension (left) (i.e., the drain (D) electrode) is biased and the overlapping electrode (right) (i.e., source (S) electrode) is grounded; and the drain-gated (D-gated) case employs the opposite biasing scheme. FIG. 1D shows an atomic force microscopy topography image of the dielectric extension (dashed circle in FIG. 1A). FIG. 1E shows a height profile along the white dashed line in FIG. 1D showing the dielectric extension length of about 135 nm by taking into account both vertical and horizontal growth of the ALD oxide on the metal edge. FIG. 1F shows output characteristics of an S-gated SASC $MoS_2$ transistor with L=200 nm showing current saturation. FIG. 1G shows output characteristics of the same transistor in the D-gated configuration showing loss of current saturation, where the gate bias ($V_G$) legend between FIG. 1F and FIG. 1G corresponds to both of the plots. FIG. 1H shows transfer characteristics of the S-gated and D-gated cases at $V_D$=1 V, where the inset shows the same data using a linear scale.

FIG. 2A shows a 2D spatial map of the electrostatic potential of the SASC FET model (L=200 nm) in the source-gated (S-gated) and drain-gated (D-gated) biasing schemes with $V_D$=$V_G$=5 V and $V_S$=0 V, where, for comparison, the electrostatic potential map of a traditional back-gated (B-gated) FET (L=200 nm) is also shown where the left electrode is the drain. FIG. 2B shows a simulated output and transfer (inset) characteristics of the S-gated, D-gated, and B-gated FETs at $V_G$=5 V and $V_D$=5 V assuming Ohmic contacts. FIG. 2C shows a simulated output characteristics of the S-gated and D-gated devices with varying $V_G$, assuming more realistic thermionic emission and tunneling through the Schottky contacts that better reproduces the experimental data from FIGS. 1A-1H. FIG. 2D shows a calculated profile of the conduction band edge ($E_c$) as a function of distance along the channel for the S-gated, D-gated, and B-gated FETs from FIG. 2A. FIG. 2E shows a profile of calculated carrier density (n) for the S-gated, D-gated, and B-gated FETs, where $E_c$ and n profiles for the D-gated case in FIG. 2D and FIG. 2E are inverted to keep the drain electrode on the left side for facile comparison. FIGS. 2F and 2G show evolution of the energy profiles as $V_D$ is increased from 0 to 5 V in steps of 0.25 V for the S-gated FET (FIG. 2F) and B-gated FET (FIG. 2G). Superior current saturation in the S-gated case is achieved by an additional pinch-off point near the source contact (<50 nm from the electrode) at $V_D$=2 V (gray dots in FIG. 2B and FIG. 2F).

FIG. 3A shows a schematic of a self-aligned van der Waals heterojunction (vdWH) p-n diode using $MoS_2$ 340 as semiconductor 1 (S1), few-layered black phosphorus (BP) 360 as semiconductor 2 (S2), and ALD-grown 30 nm thick $Al_2O_3$ 350 for both the dielectric extension and top gate dielectric (TD) 380, where Au and Ni serve as the bottom contact (BC) 330 and the top contact (TC) 370 for minimum contact resistance with S1 and S2, respectively; a doped Si substrate functions as global bottom gate (BG) 310 with 300 nm thick thermal oxide as the bottom gate dielectric (BD) 320; offsets between layers in the y-direction are enabled by the self-aligned process; and artificial offsets in the x-direction are shown for clear visualization. FIG. 3B shows an optical micrograph of a BP—$MoS_2$ self-aligned p-n heterojunction taken before the last step of ALD growth/metallization for TD/TG through a patterned resist bilayer to assist visualization of different layers, where the device includes two p-n heterojunction diodes: one with BC1/TC1 electrode set on the left and the other with BC2/TC2 electrode set on the right; and outlines of the $MoS_2$ and BP flakes are shown by a red dashed line 341 and a purple dashed line 361, respectively. FIG. 3C shows an atomic structure of bilayer BP and monolayer $MoS_2$. FIG. 3D shows an energy band diagram of the BP—$MoS_2$ p-n heterojunction. FIG. 3E shows current-voltage ($I_D$-$V_D$) characteristics of a BP—$MoS_2$ device at a bottom gate bias $V_{BG}$=−40 V and top gate biases $V_{TG}$=4, 0, −4 V. Inset shows reversal of diode rectification at $V_{TG}$=0 (normal diode) and 4 V (Zener-like), where the BP TC is the drain electrode (i.e., biased) and the $MoS_2$ BC is the source (i.e., grounded) throughout the vdWH measurements and simulations in FIGS. 4A-4H. FIG. 3F shows rectification ratio versus $V_{TG}$ for different values of $V_{BG}$ where the rectification ratio is defined as the ratio of the forward and reverse bias currents at $V_D$=2 V and −2 V, respectively. FIG. 3G shows $I_D$-$V_{TG}$ characteristics of the same device at different $V_{BG}$ values showing tunability of the anti-ambipolar response, where the inset in FIG. 3G shows the variation in transconductance ($g_m$=$dI_D/dV_{TG}$) obtained by fitting the $I_D$-$V_{TG}$ data with Gaussian profiles (see FIGS. 17A-17C). The $V_{BG}$ legend in FIG. 3F also applies to the main plot and inset in FIG. 3G.

FIGS. 4A-4H show device simulations for the dual-gated BP—$MoS_2$ p-n heterojunction according to embodiments of the invention. Specifically, FIG. 4A shows a circuit diagram corresponding to the dual-gated vdWH where the p-n diode and both series transistors from the semiconductor extensions (p-type and n-type) are controlled by both of the gates. FIG. 4B shows a schematic of a dual-gated vdWH without (top) and with (bottom) alignment of the bottom gate with n-type $MoS_2$, (see FIGS. 14A-14C for the exact model geometry). FIG. 4C shows simulated $I_D$-$V_{TG}$ characteristics ($V_D$=2 V) of the vdWH at different $V_{BG}$ corresponding to the top panel in FIG. 4B. The curves for $V_{BG}$=−40 V and −60 V (dashed oval) show parasitic gating. FIG. 4D shows simulated $I_D$-$V_{TG}$ characteristics ($V_D$=2 V) of the vdWH at different $V_{BG}$ corresponding to the bottom panel in FIG. 4B, where the curves for $V_{BG}$=−60 V (dashed circle) show parasitic gating from the fringing field from the bottom gate despite the alignment with the $MoS_2$ edge; and the $V_{BG}$ legend is shown in FIG. 4C. FIG. 4E shows a circuit diagram corresponding to the dual-gated vdWH where the p-n diode and $MoS_2$ FET are controlled by both gates while the BP FET is controlled only by the top gate. FIG. 4F shows (top) schematic of dual-gated self-aligned vdWH (with TG/TD removed) showing two paths of current flow: i1 is from the BP to the region of $MoS_2$ directly underneath the BP; i2 is from the BP to the regions of $MoS_2$ that are not overlapping with the BP. i1 and i2 regions act as two transistors in parallel as shown in FIG. 4E; and (bottom) equivalent planar model corresponding to the self-aligned vdWH where a screening $MoS_2$ layer (dashed red line) is embedded in the bottom dielectric, thereby isolating the BP transistor from the bottom gate. Transistor i1 in FIG. 4E and FIG. 4F is ignored for the planar model (see FIGS. 14A-14C for details). FIG. 4G shows simulated $I_D$-$V_{TG}$ characteristics ($V_D$=2 V) of the BP—$MoS_2$ vdWH at different $V_{TG}$ for the planar model in bottom panel in FIG. 4F showing no parasitic gating. $V_{BG}$ legend is shown in FIG. 4C. FIG. 4H shows simulated $I_D$-$V_D$ characteristics ($V_{BG}$=−40 V) of the BP—$MoS_2$ vdWH, which reveal a gradual reversal of rectification between $V_{TG}$=0 V and −2 V, in qualitative agreement with the experimental data in FIG. 3E.

FIGS. 5A-5C show atomic force microscopy analysis of the dielectric extension according to embodiments of the invention. Specifically, FIG. 5A shows a schematic process-flow for dielectric extension formation using single resist photolithography, where the natural undercut in the photoresist is used in conjunction with isotropic metal evaporation and conformal ALD growth to realize the dielectric extension. FIG. 5B shows an atomic force microscopy of the dielectric extension ranging from 800 nm (i) to 150 nm (iv) achieved by varying processing conditions, where the scale bar is of 1 μm. FIG. 5C shows optimized processing conditions such as spin speed, exposure time, and photoresist development time are used to control the dielectric extension length. Metal thickness=50 nm, where the dielectric thickness=30 nm.

FIG. 7A shows photoluminescence spectra of CVD-grown single-layer $MoS_2$ showing characteristic A and B peaks. FIG. 7B shows Raman spectra of a CVD-grown $MoS_2$ confirming single-layer thickness from a separation of less than 20 $cm^{-1}$ between $A_{1g}$ and $E^1_{2g}$ peaks [53]. FIG. 7C shows Raman spectra of a few-layer BP flake showing characteristic $A_{1g}$, $A_{2g}$, and $B_{2g}$ peaks [27].

FIGS. 8A-8F show 2D maps of electric fields in source-gated, drain-gated, and back-gated FET geometries according to embodiments of the invention. Specifically, FIGS.

8A-8B show contour maps of lateral electric field ($E_x$) and vertical electric field ($E_y$), respectively, in the source-gated (S-gated) biasing condition in a self-aligned short-channel (SASC) $MoS_2$ field-effect transistor (FET) (i.e., corresponding to potential contour maps shown in FIG. 2A). FIGS. 8C-8D show contour maps of lateral electric field ($E_x$) and vertical electric field ($E_y$), respectively, in the drain-gated (D-gated) biasing condition shown in FIG. 2A. FIGS. 8E-8F show contour maps of lateral electric field ($E_x$) and vertical electric field ($E_y$), respectively, in a traditional back-gated (B-gated) transistor where the left electrode (drain) is biased at 5 V while the right electrode (source) is grounded. The gate electrode is biased at 5 V in all cases. The x-axis is defined as the lateral dimension (left-right) and the y-axis as the vertical dimension (top-bottom). The source electrode is highlighted by black arrows in FIGS. 8A, 8C and 8E, showing smaller $E_x$ near the source in the S-gated case compared to the D-gated case, resulting in smaller current in the S-gated case.

FIGS. 9D-9F show calculated electron density profile: for an SASC $MoS_2$ transistor with source-gated biasing (FIG. 9D), an SASC $MoS_2$ transistor with drain-gated biasing (FIG. 9E), and a back-gated transistor (FIG. 9F) with the same biasing conditions. $V_D$ is varied from 0 V to 5 V in steps of 0.25 V (from purple to red) and $V_G$ is kept fixed at 5 V. The x-axis of the electron density profile for the drain-gated case (FIG. 9E) is reversed to keep the biased electrode (drain) on the left side for comparison with the other two cases. Source-gated biasing first shows a depletion region formation near the source-electrode (right side) and then a depletion region formation near the drain electrode (left side), resulting in superior current saturation behavior.

FIG. 10A shows $E_c$ profile for the drain-gated biasing condition as drain bias ($V_D$) is varied from 0 V to 5 V in steps of 0.25 V while the gate bias ($V_G$) is kept fixed at 5 V. The plot shows the absence of any pinch-off point near the source electrode as seen in the case of a source-gated device (FIG. 2F), resulting in the poor current saturation characteristics (i.e., smaller output impedance) shown in FIG. 2C. The x-axis of the energy profile is reversed to keep the biased electrode (drain) on the left side. FIG. 10B shows the calculated intrinsic gain (i.e., transconductance divided by output conductance in the saturation regime) for a source-gated SASC $MoS_2$ transistor is compared with a back-gated transistor at $V_D=V_G=5$ V. The room temperature field-effect mobility is varied from 1 to 300 $cm^2/Vs$ to consider all reported values for single-layer $MoS_2$ [30]. The source-gated case shows roughly three times larger gain independent of mobility.

FIGS. 11A-11H show device architecture and characteristics of fully vertical BP—$MoS_2$ and $WSe_2$—$MoS_2$ vdWH using graphene according to embodiments of the invention. FIG. 11A shows architecture of a vertical BP—$MoS_2$ vdWH p-n diode using graphene as the bottom contact to a junction between mechanically exfoliated few-layer $MoS_2$ and mechanically exfoliated (and transferred) few-layer BP contacted by Ni/Au metal on top. FIG. 11B shows an optical micrograph of the vertical BP—$MoS_2$ vdWH where the graphene strip is outlined by a dashed white line, the BP flake is outlined by a solid blue line, and the $MoS_2$ flake is outlined by a solid red line. The image is taken before the final patterning of the Ni/Au electrode (solid black line) to enhance clarity. FIG. 11C shows $I_D$-$V_D$ characteristics of the vertical BP—$MoS_2$ vdWH shows gate tunability with contributions from the graphene-$MoS_2$Schottky barrier and BP—$MoS_2$ p-n diode. FIG. 11D shows $I_D$-$V_{TG}$ characteristics of the vertical BP—$MoS_2$ vdWH does not show anti-ambipolar behavior. FIG. 11E shows architecture of the vertical $WSe_2$—$MoS_2$ vdWH p-n diode using graphene as the bottom contact to a mechanically exfoliated few-layer $MoS_2$ flake and (30 nm Pd)/(30 nm Au) metal as the top contact to a mechanically exfoliated (and transferred) few-layer $WSe_2$ flake. FIG. 11F shows optical micrograph of the vertical $WSe_2$—$MoS_2$ vdWH where the graphene strip is outlined by the dashed white line, the $MoS_2$ flake is outlined by the solid red line, and $WSe_2$ flake is outlined by the solid blue line. FIG. 11G shows $I_D$-$V_D$ characteristics of a vertical $WSe_2$—$MoS_2$ vdWH showing gate tunability and larger rectification in comparison to BP—$MoS_2$ (FIG. 11C) due to the larger band gap of $WSe_2$ compared to BP. FIG. 11H shows $I_D$-$V_{TG}$ characteristics of the vertical $WSe_2$—$MoS_2$ vdWH showing no anti-ambipolar behavior.

FIGS. 12A-12B show measured characteristics of a self-aligned BP—$MoS_2$ vdWH according to embodiments of the invention. FIG. 12A shows bottom gate ($V_{BG}$) controlled rectification in a self-aligned BP—$MoS_2$ vdWH while the top gate ($V_{TG}$) is fixed at 1 V. The rectification ratio is varied from about 1 to about 50 as $V_{BG}$ is varied from 60 V to −60 V (see FIG. 3F). FIG. 12A shows the data from FIG. 3G with full gate bias sweep showing commonly observed hysteresis in BP-based devices.

FIG. 13A shows a 2D model of the self-aligned BP—$MoS_2$ vdWH mimicking the cross-section of the real device in FIG. 3A. The 2D model assumes equal overlapping width (out of the plane) of BP and $MoS_2$ in the p-n heterojunction. The length (x-axis) of BP—$MoS_2$ heterojunction is set to 1 μm. All dimensions are shown in 1:1 aspect ratio. FIG. 13B shows an electrostatic potential profile of the vdWH while both top gate (Au) and bottom gate (Si) are set to 10 V and electrical contacts to both semiconductors are grounded. FIG. 13C shows an equivalent circuit diagram corresponding to the 2D model in FIG. 13A. Complete overlap between the semiconductors (near-complete screening of the gate-induced field) insures that each semiconductor is controlled by only one of the dual gates, allowing complete independence of electrostatic doping in the two semiconductors. FIG. 13D shows calculated $I_D$-$V_{TG}$ characteristics of the model showing no anti-ambipolar behavior due to the absence of electrostatic coupling between the top gate and $MoS_2$. Instead, the conduction minima near $V_{TG}=0.5$ V result from the ambipolar behavior of the small bandgap (0.4 eV) of BP. The overall heterojunction current decreases with decreasing $V_{BG}$ bias as the $MoS_2$ extension transistor turns off.

FIG. 14A shows a 2D model of a dual-gated BP—MoS$_2$ vdWH with two transistors in series with the p-n heterojunction diode shown in the top panel of FIG. 4B (model-(1)). Single-layer MoS$_2$ extends from 0 to 0.8 µm, and 5 nm thick BP layer extends from 0.4 to 1 µm resulting in the channel length of the MoS$_2$ extension transistor=400 nm, channel length of the BP extension transistor=200 nm, and BP—MoS$_2$ overlap length=400 nm. Both semiconductors are controlled by both the gates (FIG. 4A). FIG. 14B shows a 2D model of a dual-gated BP—MoS$_2$ vdWH where the edge of bottom gate is aligned with the edge of the MoS$_2$ in an attempt to avoid electrostatic coupling between the bottom gate and the BP extension transistor (as shown in bottom panel of FIG. 4B, model-(2)). FIG. 14C shows a 2D model of the dual-gated BP—MoS$_2$ vdWH that is an approximation (ignoring i1 current pathway) of the real self-aligned BP—MoS$_2$ discussed in FIGS. 3A-3G (as shown in the bottom panel of FIG. 4F, model-(3)). A hypothetical MoS$_2$ layer is extended beyond 0.8 µm and is separated from BP by a dielectric (SiO$_2$) of thickness $X_1$ and from the bottom gate by a dielectric of thickness $X_2$ such that the ratio of $X_2/X_1$ (about 16) is equal to the ratio of the bottom and top gate capacitances in the real devices. In this geometry, there is no electrostatic coupling between the BP extension transistor and the bottom gate, whereas gate-tunable anti-ambipolar behavior is achieved by dual-gate control of the p-n vdWH and MoS$_2$ extension transistor.

FIGS. 15A-15B show calculated electric field profiles of model-(2) from FIG. 14B in the x-direction ($E_x$) and y-direction ($E_y$), respectively. Biasing conditions are $V_{BG}=-60$ V, $V_{TG}=5$ V, and $V_D=2$ V. $E_x$ is pointing from right to left and $E_y$ is pointing from top to bottom. Parasitic coupling between the bottom gate and the BP extension transistor via fringing fields shows up in the region between 0.8 µm and 1 µm.

FIG. 16A shows a calculated profile of conductance band minima ($E_c$), valence band maxima ($E_v$) and Fermi level ($E_f$) of model-(3) BP—MoS$_2$ vdWH from FIG. 14C at the equilibrium condition where all electrodes are grounded. FIG. 16B shows a calculated $I_D$-$V_D$ characteristics of a model-(3) BP—MoS$_2$ vdWH showing tunable rectification with $V_{TG}$ while $V_{BG}$ is fixed at 0 V. $I_D$—$V_D$ characteristics for $V_{BG}=-40$ V are shown in FIG. 4H. FIG. 16C shows a calculated rectification ratio for different $V_{TG}$ and $V_{BG}$ for comparison with the experimental data in FIG. 3F.

FIGS. 17A-17C show simulated phase-shift keying and frequency doubling from dual-gate tunable anti-ambipolar characteristics according to embodiments of the invention. FIG. 17A shows a circuit diagram used for simulation of the frequency response in a self-aligned BP—MoS$_2$ vdWH. A bias-tee is shown at the input to introduce a DC offset in the AC input at the desired $V_{TG}$ bias for a single-gated vdWH without the dual gates. Gate-tunable anti-ambipolar device do not require this bias-tee. FIG. 17B shows experimental $I_D$—$V_{TG}$ characteristics at $V_{BG}=-60$ V and 20 V are fitted with Gaussian functions that are used for the frequency response simulations. Both mean and variance of the Gaussian is controlled by the top gate. Schematic of the input sine wave is shown with $V_{offset}=1$ V. FIG. 17C shows waveforms of input ($V_{TG}$), $V_{BG}$ pulses, and output bias showing frequency shift keying (FSK) achieved via $V_{BG}$ without varying $V_{offset}$, thus not requiring a bias-tee at input. Output signal in red is twice the frequency than that in blue (frequency doubling). Binary phase shift keying (BPSK) (shown by dashed circles) with phase shift of 90 degrees is also achieved from the opposite polarity of the transconductance in the two branches of anti-ambipolar characteristics. $V_{input}=1.0+1.0$ sin(wt) and $V_{output}=0.7+0.3$ sin(wt) at $V_{BG}=20$ V and 0.8+0.2 sin(wt) at $V_{BG}=-60$ V.

FIG. 18A shows a device architecture (top) and band diagram (bottom) of a self-aligned MoS$_2$ homojunction diode achieved by Au and MoO$_3$ contacts. FIG. 18B shows an optical micrograph of the self-aligned contact-doped MoS$_2$ diode. A triangular MoS$_2$ crystal is highlighted with the dashed red line. FIG. 18C shows output characteristics of the MoS$_2$ diode at different $V_G$ showing tunable rectification. FIG. 18D shows a log-linear plot of the I-V characteristics at $V_G=-60$ V fit with a Shockley diode equation assuming an ideality factor (n) of 2.5.

FIG. 19A shows architecture of a self-aligned pentacene-MoS$_2$ vdWH where the top electrode is directly on top of pentacene. Thermal evaporation of pentacene and metal is patterned via the same resist pattern. The resist undercut is utilized to cover the side of the pentacene films via ALD-grown Al$_2$O$_3$, thus allowing lift-off of the soluble pentacene film. FIG. 19B shows optical micrograph of a self-aligned semi-vertical pentacene-MoS$_2$ vdWH. The MoS$_2$ crystal is highlighted with the dashed red triangle. The pentacene film is completely covered by the top contact. FIG. 19C shows $I_D$-$V_D$ characteristics of the pentacene-MoS$_2$ vdWH showing gate-tunable rectification. FIG. 19D shows $I_D$-$V_G$ characteristics of the pentacene-MoS$_2$ vdWH showing about 20 times larger current density than lateral pentacene-MoS$_2$ vdWHs [3]. Note that these single-gate semi-vertical devices do not show anti-ambipolar behavior due to absence of electrostatic coupling between the gate and pentacene film due to screening from the MoS$_2$ crystal.

FIG. 20A shows optical micrograph of a 300 nm SiO$_2$/Si substrate (7 mm by 5 mm) showing scalable fabrication of SASC transistors (channel length about 500 nm) on a continuous film of CVD-grown MoS$_2$ by following the photolithography protocol outlined in FIG. 5A. FIG. 20B shows $I_D$-$V_{TG}$ characteristics of a SASC transistor showing the expected positive shift in the curve in the source-gated device in comparison to the drain-gated device due to overall reduced electrostatic doping in the channel (see FIGS. 2A-2G). FIG. 20C shows Histogram of relative voltage shift in the source-gated device in comparison to the drain-gated device at a current level of 0.1 µA. 19 of 20 devices show the expected positive shift in the threshold voltage. The devices that were not conductive due to inhomogeneity in the MoS$_2$ film coverage are not included in the histogram. The spread in the distribution results from thickness inhomogeneity in CVD-grown MoS$_2$.

DETAILED DESCRIPTION OF THE INVENTION

Figure 1A:
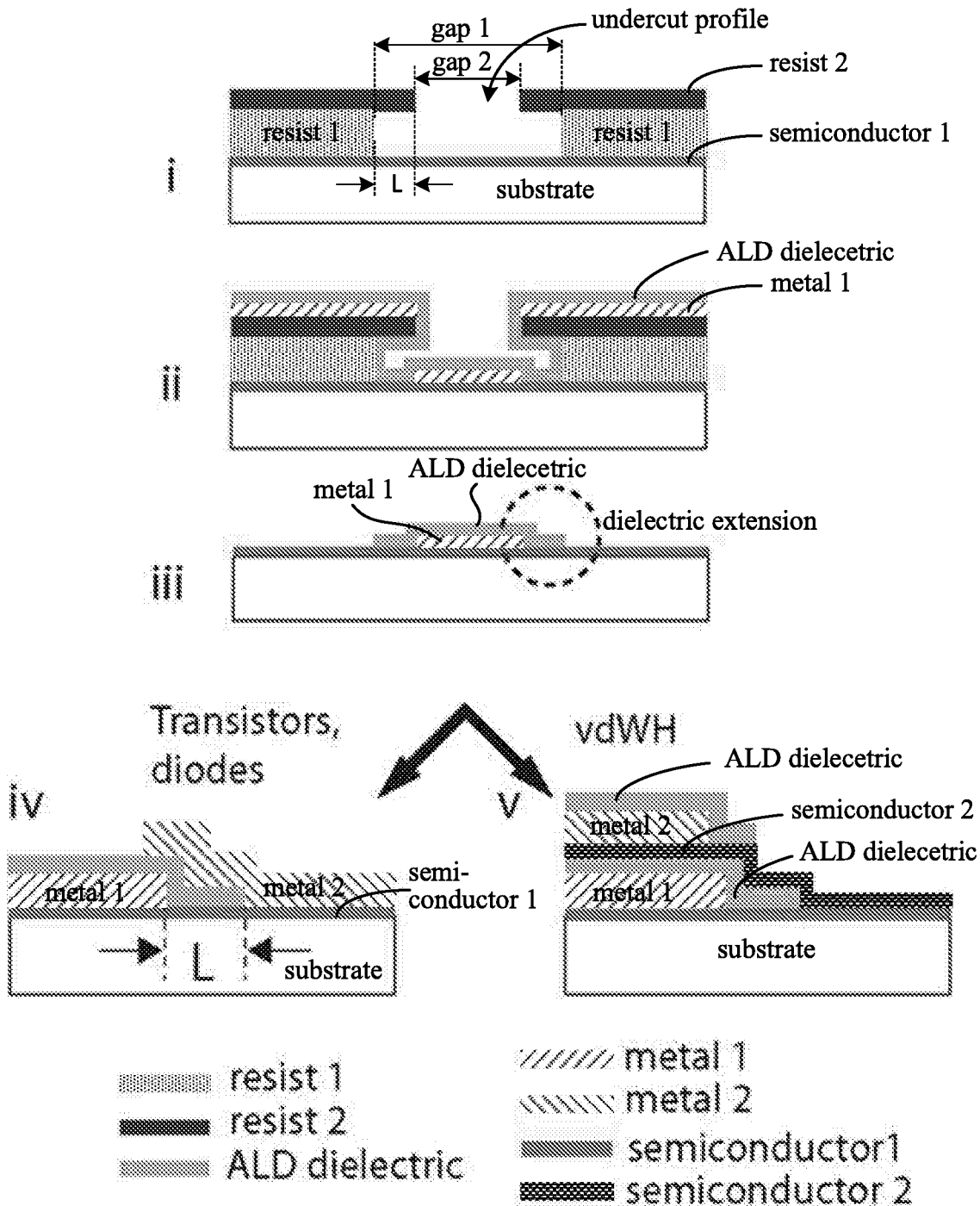
FIGS. 1A-1H show a process-flow and self-aligned short-channel $MoS_2$ transistors and their characteristics according to embodiments of the invention. Specifically.

The present invention will now be described more fully hereinafter with reference to the accompanying drawings, in which exemplary embodiments of the present invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting and/or capital letters has no influence on the scope and meaning of a term; the scope and meaning of a term are the same, in the same context, whether or not it is highlighted and/or in capital letters. It will be appreciated that the same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only and in no way limits the scope and meaning of the invention or of any exemplified term. Likewise, the invention is not limited to various embodiments given in this specification.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below can be termed a second element, component, region, layer or section without departing from the teachings of the present invention.

It will be understood that, as used in the description herein and throughout the claims that follow, the meaning of "a", "an", and "the" includes plural reference unless the context clearly dictates otherwise. Also, it will be understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It will also be appreciated by those of skill in the art that references to a structure or feature that is disposed "adjacent" to another feature may have portions that overlap or underlie the adjacent feature.

It will be further understood that the terms "comprises" and/or "comprising," or "includes" and/or "including" or "has" and/or "having" when used in this specification specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation shown in the figures. For example, if the device in one of the figures is turned over, elements described as being on the "lower" side of other elements would then be oriented on the "upper" sides of the other elements. The exemplary term "lower" can, therefore, encompass both an orientation of lower and upper, depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used in this disclosure, "around", "about", "approximately" or "substantially" shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated.

As used in this disclosure, the phrase "at least one of A, B, and C" should be construed to mean a logical (A or B or C), using a non-exclusive logical OR. As used herein, the term "and/or" includes any and all combinations of one or more of the associated listed items.

The description below is merely illustrative in nature and is in no way intended to limit the invention, its application, or uses. The broad teachings of the invention can be implemented in a variety of forms. Therefore, while this invention includes particular examples, the true scope of the invention should not be so limited since other modifications will become apparent upon a study of the drawings, the specification, and the following claims. For purposes of clarity, the same reference numbers will be used in the drawings to identify similar elements. It should be understood that one or more steps within a method may be executed in different order (or concurrently) without altering the principles of the invention.

Van der Waals heterojunctions (vdWHs) between two-dimensional (2D) materials such as graphene and $MoS_2$ have shown promise for low-power tunneling transistors, high-gain photodetectors, and gate-tunable analog applications. However, all methods to date either layer micron-scale flakes in an unscalable manner or use undesired transistors in series with vertical van der Waals heterojunctions that limit their performance.

One of the objectives of this invention is to provide self-aligned short-channel (SASC) electronic devices and generalized self-aligned fabrication methods for a diverse class of electronic devices based on van der Waals layered materials and their heterojunctions.

In one embodiment shown in panel (iv) of FIG. 1A, the SASC electronic device includes a first semiconductor layer (semiconductor 1) formed on a substrate; a first metal layer (metal 1) formed on a first portion of the first semiconductor layer; a first dielectric layer (ALD dielectric) formed on the first metal layer and extended with a dielectric extension on a second portion of the first semiconductor layer, the dielectric extension defining a channel length (L) of a channel in the first semiconductor layer; a second metal layer (metal 2) formed on the first dielectric layer and a third portion of the first semiconductor layer; and a gate electrode (see FIG. 1B) formed on the substrate and capacitively coupled with the channel. The channel length is less than about 800 nm, preferably, less than about 200 nm, more preferably, about 135 nm.

For the first semiconductor layer (semiconductor 1), the second portion extends from the first portion and the third portion extends from the second portion. It should be appreciated that the first, second and third portions are used to differentiate portions on which the first metal layer (metal 1), the dielectric extension and the second metal layer (metal 2) are formed only, and are not structurally different from each other. In one exemplary embodiment, the first semiconductor layer (semiconductor 1) is formed of an atomically thin material, such as $MoS_2$, $MoSe_2$, $WS_2$, $WSe_2$, InSe, GaTe, black phosphorus (BP), or related two-dimensional materials, on an $SiO_2$ layer of the substrate by chemical vapor deposition (CVD).

Figure 1B:
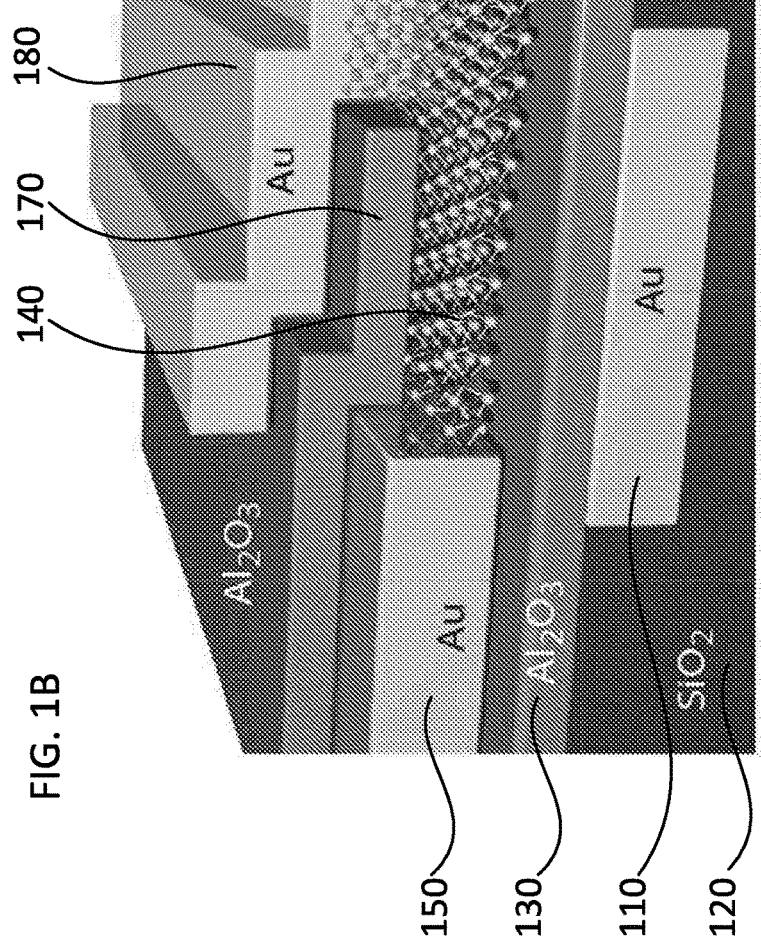

In one embodiment, as shown in FIG. 1B, the SASC electronic device further includes a gate dielectric layer 130 formed between the first semiconductor layer 140 and the gate electrode 110. The gate dielectric layer is formed of oxidized silicon ($SiO_2$), or a dielectric material rather than $SiO_2$, e.g., $Al_2O_3$ in FIG. 1B. The gate electrode 110 is formed of highly doped silicon (Si), or a conductive material rather than Si, e.g., Au in FIG. 1B.

In certain embodiments, the substrate comprises a Si layer or a highly doped Si layer that forms the gate electrode, and an $SiO_2$ layer that forms the gate dielectric layer formed between the first semiconductor layer and the gate electrode.

As shown in FIGS. 1A-1H, the SASC electronic device is a transistor or a contact-doped diode.

In another embodiment shown in panel (v) of FIG. 1A, the SASC electronic device further includes a second semiconductor layer (semiconductor 2) formed on the first dielectric layer (ALD dielectric) and the third portion of the first semiconductor layer (semiconductor 1); a second metal layer (metal 2) formed on a first portion of the second semiconductor layer that is overlapped with the first metal layer (metal 1); and a second dielectric layer (ALD dielectric) formed on the second metal layer (metal 2) and extended on a second portion of the second semiconductor layer. In one embodiment, the first and second dielectric layers are formed of a same dielectric material or different dielectric materials. In one embodiment shown in panel (v) of FIG. 1A, both of the first and second dielectric layers are formed of $Al_2O_3$ by atomic layer deposition (ALD). In addition, the first and second dielectric layers can also be formed of $HfO_2$, $ZrO_2$, or ZnO.

Similarly, for the second semiconductor layer (semiconductor 1), the second portion extends from the first portion. It should be appreciated that the first and second portions are used to differentiate portions on which the second metal layer (metal 2) and an dielectric extension of the second dielectric layer are formed only.

In one embodiment, the first and second semiconductor layers are formed of different semiconductors. In one embodiment, the first semiconductor layer is formed of an atomically thin material comprising one of $MoS_2$, $MoSe_2$, $WS_2$ and $WSe_2$, InSe, GaTe and BP, and the second semiconductor layer is formed of a second semiconductor comprising BP or $WSe_2$, or single-walled carbon nanotubes (SWCNTs).

In certain embodiments, the first and second metal layers are formed of a same metallic material or different metallic materials, and serve as a bottom contact (BC) and a top contact (TC) for minimum contact resistance with the first and second semiconductors, respectively. In one embodiment, each of the first and second metal layers is formed one of gold (Au), titanium (Ti), aluminum (Al), nickel (Ni), chromium (Cr), and other conductive materials. In one embodiment, the first and second metal layers comprise Au and Ni, respectively.

Accordingly, the SASC electronic device shown in panel (v) of FIG. 1A comprises self-aligned van der Waals heterojunctions (vdWHs).

Figure 3A:
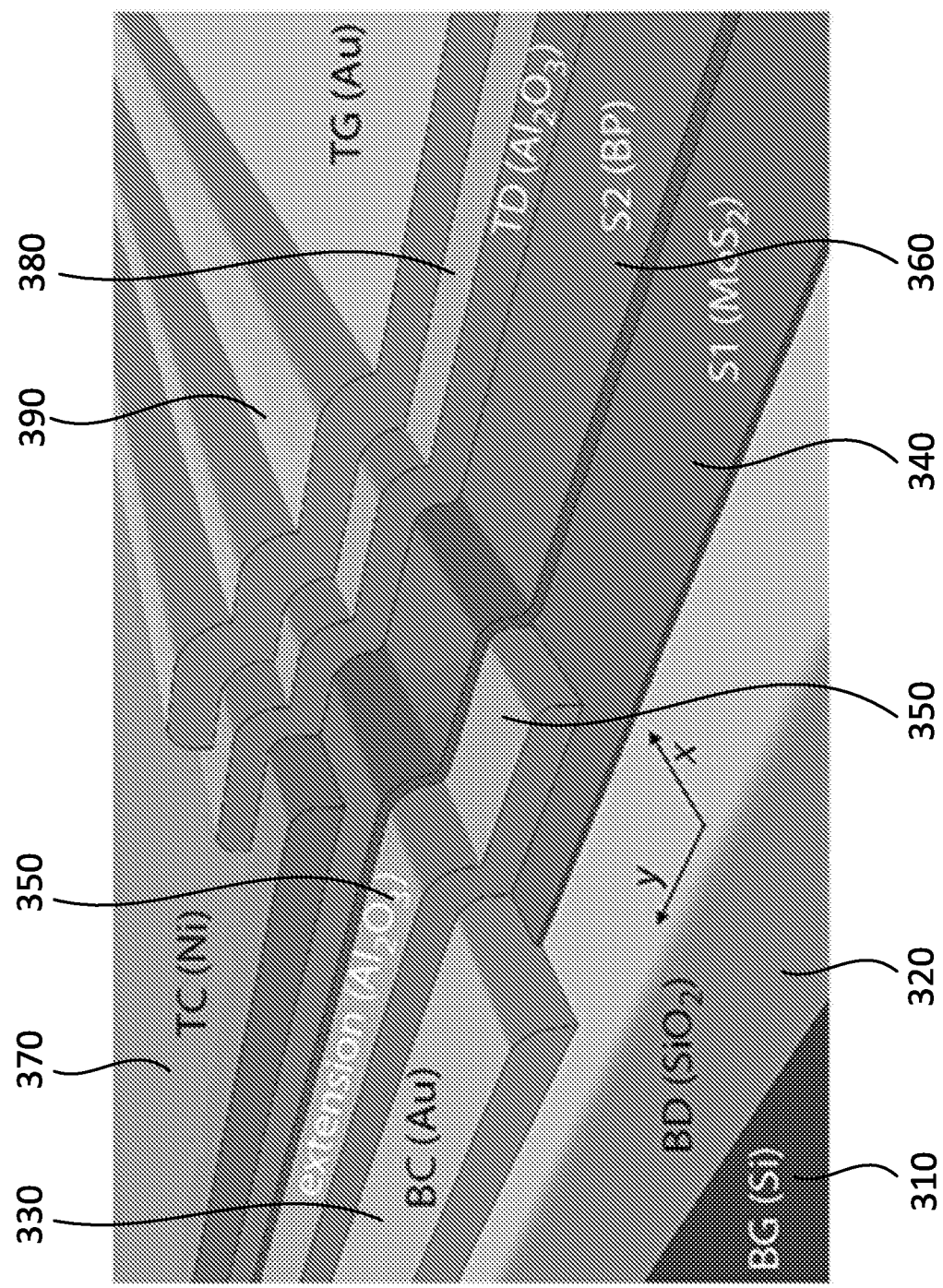
FIGS. 3A-3G show a self-aligned van der Waals heterojunction p-n diode according to embodiments of the invention. Specifically.

Another embodiment of the vdWHs is also shown FIG. 3A, where a top gate electrode 390 is formed on the second dielectric layer 380.

In one aspect, the invention relates to a circuitry having one or more SASC electronic devices according to the above disclosure.

Figure 6:
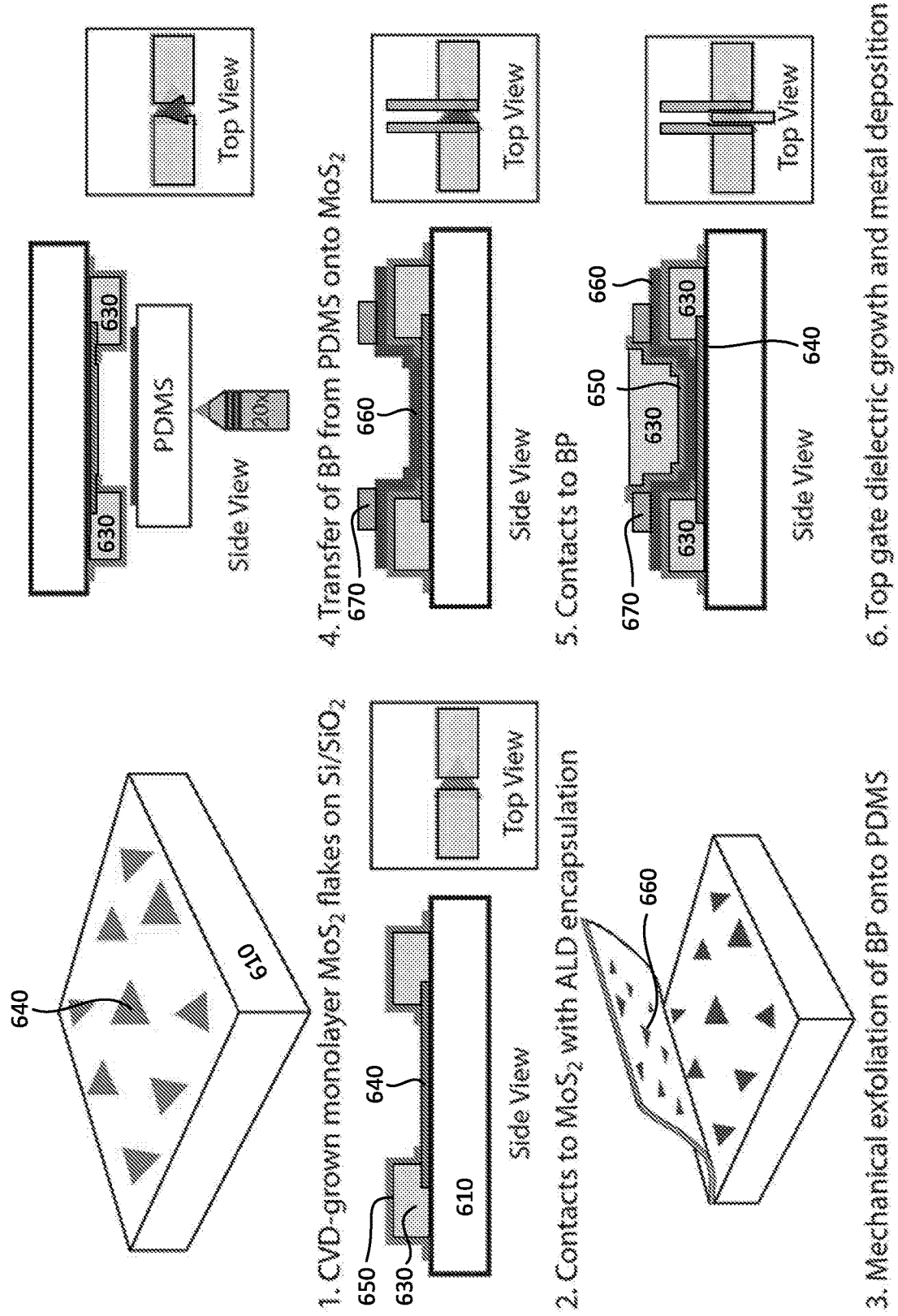
FIG. 6 shows a fabrication process-flow of a self-aligned BP—$MoS_2$ vdWH according to embodiments of the invention. Schematic of the device substrate and components during different stages of fabrication starting with contact metal (Au) evaporation and ALD growth of a dielectric extension on CVD-grown $MoS_2$ (1, 2). Mechanically exfoliated BP flakes are transferred on CVD $MoS_2$ flakes using PDMS substrates, a micromanipulator and an optical microscope (3, 4). Ni/Au contacts are fabricated on BP followed by top gate dielectric growth by ALD. The top gate dielectric and metal electrodes were grown via the same resist pattern (5, 6). Color scheme: red—$MoS_2$ flakes 640, purple—BP flakes 660, green—metal oxide extension 650, yellow—Au electrodes 630, orange—Ni/Au electrodes 670.

In another aspect, the invention relates to a method for fabricating an SASC electronic device. Referring to FIGS. 1A, 5A and 6, in certain embodiments, the method includes the following steps.

At first, the first semiconductor layer (semiconductor 1) is formed of an atomically thin material on an $SiO_2$ layer of the substrate by CVD.

An undercut profile is then formed in a bilayer resist (resist 1 and resist 2) on a first semiconductor layer (semiconductor 1), by electron-beam lithography, as shown in panel (i) of FIG. 1A. The bilayer resist has a first resist (resist 1) formed on the first semiconductor layer (semiconductor 1) and a second resist (resist 2) formed on the first resist (resist 1). In certain embodiments, the first resist (resist 1) has a molecular weight that is lower than that of the second resist (resist 2), whereby the first resist (resist 1) has sensitivity to electron dose being higher than that of the second resist (resist 2). Accordingly, the undercut profile has a first gap (gap 1) between edges defined by the first resist (resist 1) being wider than a second gap (gap 2) between edges defined by the second resist (resist 2).

Further, as shown in panel (ii) of FIG. 1A, a first metal layer (metal 1) is formed on the undercut profile and the bilayer resist by a directional deposition process. Then, a first dielectric layer (ALD dielectric) is formed on the first metal layer (metal 1) by atomic layer deposition so that the first dielectric layer on the first metal layer in the undercut profile has a dielectric extension conformally grown on the first semiconductor layer in a self-aligned manner.

In addition, as shown in panel (iii) of FIG. 1A, an encapsulated metal contact is formed in the undercut profile by directional evaporation of metal of the first metal layer on the bilayer resist and a lift-off process to remove the bilayer resist. As such, the encapsulated metal contact comprises the first metal covered by the first dielectric layer with the dielectric extension on the first semiconductor, where the dielectric extension defines a channel length of a channel in the first semiconductor layer.

Moreover, as shown in panel (iv) of FIG. 1A, a second metal layer (metal 2) is formed on the first dielectric layer with the dielectric extension and the first semiconductor layer, for example, by evaporation of the same metal or a different metal of the first metal layer.

In certain embodiments, the substrate comprises a silicon layer defining a gate electrode capacitively coupled with the channel, and the SiO$_2$ layer is disposed between the gate electrode and the first semiconductor layer.

As shown in panel (v) of FIG. 1A, the method further includes forming a second semiconductor layer (semiconductor 2) on the first dielectric layer (ALD dielectric) with the dielectric extension (L) and the first semiconductor; forming a second metal layer (metal 2) on a first portion of the second semiconductor layer that is overlapped with the first metal layer (metal 1); and forming a second dielectric layer (ALD dielectric) on the second metal layer (metal 1) and a second portion of the second semiconductor layer (semiconductor 2) by the ALD.

In one embodiment as shown in FIG. 6, the step of forming the second semiconductor layer (semiconductor 2) includes mechanically exfoliating flakes of a second semiconductor onto a polydimethylsiloxane (PDMS) substrate; and transferring the mechanically exfoliated flakes of the second semiconductor from the PDMS substrate to the first dielectric layer with the dielectric extension and the first semiconductor using a micromanipulator and/or an optical microscope.

Furthermore, the method may include forming a top gate (TG) electrode on the second dielectric layer, as shown in FIG. 3A.

In certain embodiments, the first and second semiconductor layers are formed of different semiconductors. In certain embodiments, the first semiconductor layer is formed of an atomically thin material comprising one of MoS$_2$, MoSe$_2$, WS$_2$ and WSe$_2$, InSe, GaTe, BP, and the second semiconductor layer is formed of the second semiconductor comprising BP, WSe$_2$, or SWCNTs.

In certain embodiments, the first and second dielectric layers are formed of a same dielectric material or different dielectric materials.

In certain embodiments, the first and second metal layers are formed of a same metallic material or different metallic materials.

In one embodiment, the SASC electronic device comprises forming van der Waals heterojunctions (vdWHs).

In yet another aspect of the invention, the method for fabricating a SASC electronic device includes forming a 2D semiconductor device having a channel length being less than about 200 nm. The 2D semiconductor device has a first semiconductor layer formed of an atomically thin material on a substrate; a first metal layer formed on the first semiconductor layer; and a first dielectric layer formed on the first metal layer and extended with a dielectric extension on the first semiconductor layer, where the dielectric extension defines the channel length in the first semiconductor layer.

In certain embodiments, the step of forming the 2D semiconductor device includes forming an undercut profile with a bilayer resist on the first semiconductor layer by electron-beam lithography, where the bilayer resist comprises a first resist formed on the first semiconductor layer and a second resist formed on the first resist, where the first resist has a molecular weight that is lower than that of the second resist, such that the formed undercut profile has a first gap between edges defined by the first resist being wider than a second gap between edges defined by the second resist; directionally depositing a first metal in the undercut profile to form the first metal layer; and ALD growing a first dielectric material on the first metal layer to form the first dielectric layer with the dielectric extension conformally grown on the first semiconductor layer in the undercut profile in a self-aligned manner.

In addition, the step of forming the 2D semiconductor device further comprises directionally evaporating the first metal on the bilayer resist, and removing the bilayer resist.

As disclosed above, the self-alignment fabrication method enables the fabrication of source-gated transistors using monolayer MoS$_2$ with near-ideal current saturation characteristics and channel lengths down to about 135 nm. In addition, self-alignment for van der Waals p-n heterojunction diodes provides complete electrostatic control of both the p-type and n-type constituent semiconductors in a dual-gated geometry, resulting in gate-tunable anti-ambipolar characteristics. The versatility of the fabrication method is further demonstrated via contact-doped MoS$_2$ homojunction diodes and mixed-dimensional heterojunctions based on organic semiconductors. The fabrication method is scalable to large areas as demonstrated by the fabrication of self-aligned short-channel (SASC) transistors with sub-diffraction channel lengths in the range of about 150 nm to about 800 nm using photolithography on large-area MoS$_2$ films grown by chemical vapor deposition.

The exemplary implementations of the fabrication methods and SASC devices, and their characterizations are described below in detail.

In certain embodiments of the fabrication method, photolithography and electron beam lithography resists are used to obtain sub-micron undercuts in the resist profiles. Subsequent evaporation of metals and conformal growth of metal oxides by atomic layer deposition results in dielectric extensions as small as about 135 nm. The dielectric extension on the semiconductor defines the channel of a transistor (with the same metal contacts) or homojunction diode (with different metal contacts) as demonstrated with monolayer MoS$_2$. The fabrication method is modular, which implies that the self-aligned dielectric extension can be applied to other devices such as dual-gated p-n heterojunction diodes as demonstrated with a black phosphorus-MoS$_2$ heterojunction. Dual gates allow complete electrostatic control of both sides of the heterojunction while minimizing series resistance from the constituent materials. The resulting anti-ambipolar characteristics are highly tunable with potential applications in next-generation integrated circuited technology.

In certain embodiments, the underlying building block of the self-aligned method is a dielectric extension protruding from metal electrodes, which is formed by exploiting resist undercuts that are ubiquitous in lithographic processes. Both electron-beam lithography and photolithography resist undercuts have been optimized to obtain dielectric extensions in the range of about 100 nm to about 800 nm, as shown in FIGS. 5A-5C and 6. For example, as shown in FIG. 1A, a bilayer of two poly(methyl methacrylate) electron-beam lithography resists, in which the lower molecular weight resist (resist 1, higher sensitivity to electron dose) is under the higher molecular weight resist (resist 2, lower sensitivity), results in an undercut down to about 135 nm. The metal electrodes (metal 1) are obtained by directional evaporation (i.e., edges defined by resist 2), and the dielectric extension is obtained by conformal growth of a dielectric (i.e., edges defined by resist 1) by atomic layer deposition (ALD), followed by liftoff processes. When used for field-effect transistors (FETs), the dielectric extension defines the semiconducting (semiconductor 1) channel length (L) formed by subsequent metal evaporation (metal 2).

Figure 1D:
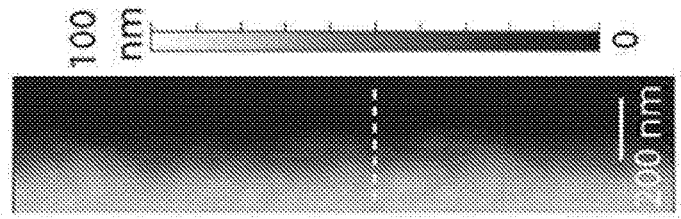
Figure 1E:
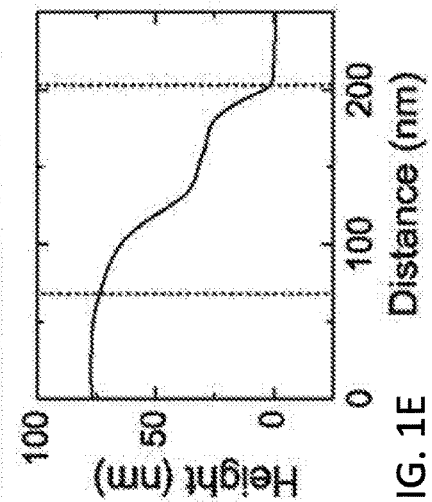
Figure 1C:
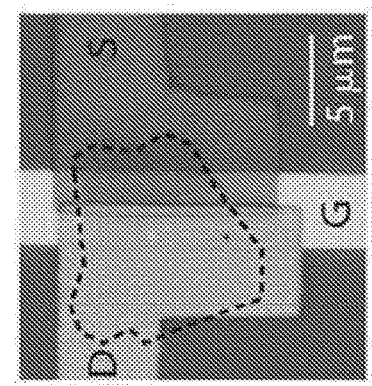
Figures 1F, 1G, 1H:
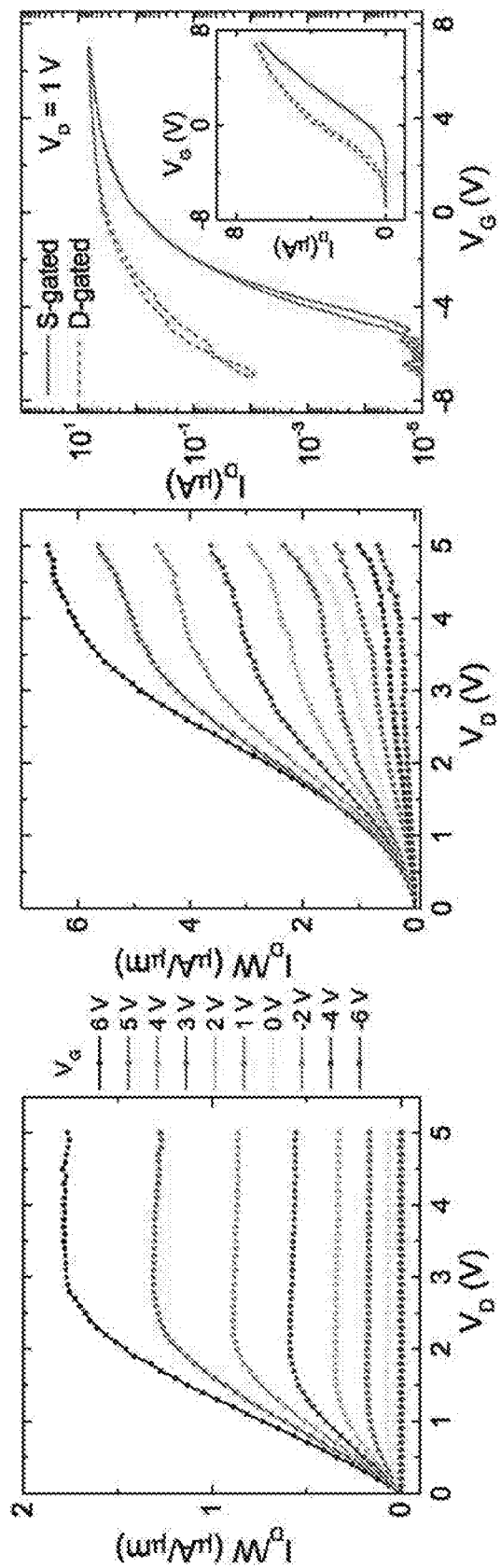

Using this methodology, SASC MoS$_2$ FETs were fabricated on local gates (Au) 110 on undoped Si wafers with about 300 nm thick thermal oxide 120, as shown in FIGS. 1B and 1C. The undoped wafers minimize parasitic capacitance, and the thermal oxide aids optical visualization of MoS$_2$ monolayers. The gate dielectric 130 and the dielectric extension 170 are both about 30 nm thick ALD-grown Al$_2$O$_3$. Atomic force microscopy (AFM) reveals a dielectric extension length of about 135 nm, as shown in FIGS. 1D and 1E, and optical microscopy shows that the top electrode 180 overlaps the bottom electrode 110 and thus the channel 140 (FIG. 1C). The inherent asymmetry in the resulting transistor geometry allows device operation in two biasing conditions: the source-gated configuration where the bottom electrode 110 is biased and the overlapping electrode 180 is grounded, and the drain-gated configuration where the overlapping electrode 180 is biased and the bottom electrode 110 is grounded. Source-gated biasing exhibits significantly improved current saturation (quantified by output impedance, $r_o = \partial V_D/\partial I_D$ at fixed $V_G$) at large $V_D$ compared to drain-gated biasing where $I_D$ continues to increase with $V_D$ for all $V_G$, as shown in FIGS. 1F and 1G. The saturation regime for the source-gated case at large $V_G = 6$ V is nearly ideal ($g_D = 1/r_o = \partial I_D/\partial V_D < 10$ pS) with a high $I_{on}/I_{off}$ ratio (about $10^5$), as shown in FIG. 1H. In contrast, the drain-gated case shows channel-width-normalized $g_D = 0.5$ μS/μm that cannot be turned off even at large $V_G = -7$ V, resulting in poor on/off ratios (about $10^3$), as shown in FIG. 1H.

This behavior is similar to conventional source-gated transistors (SGTs) that evolved from the staggered Schottky Barrier Transistor [12]. SGTs possess increased $r_o$ and intrinsic gain and decreased saturation drain voltage ($V_{SAT} = V_G - V_{TH}$) in comparison to standard FETs [13, 14]. Unlike conventional FETs where the depletion region is formed only near the drain contact [15], the depletion region in SGTs forms first near the source contact at low $V_D$ biases, and another depletion region emerges near the drain contact at higher biases, resulting in nearly ideal current saturation and immunity against short-channel effects such as channel length modulation [13-15]. The device characteristics of conventional SGTs have been explained by three models: gate-induced source barrier lowering [16], series resistance of the depletion region between source and channel [17], and a thermionic emission-diffusion model with current injection concentrated at the edge of the source electrode [14]. However, most conventional SGTs use an amorphous or polycrystalline silicon semiconducting layer with thicknesses (about 100 nm) comparable to the gate dielectric, in contrast to the 0.7 nm thick monolayer MoS$_2$ used here. Thus, one can expect that the electrostatics and resulting charge transport of the SASC MoS$_2$ FETs are significantly different from those of previously reported SGTs [14, 16].

Figure 2A:
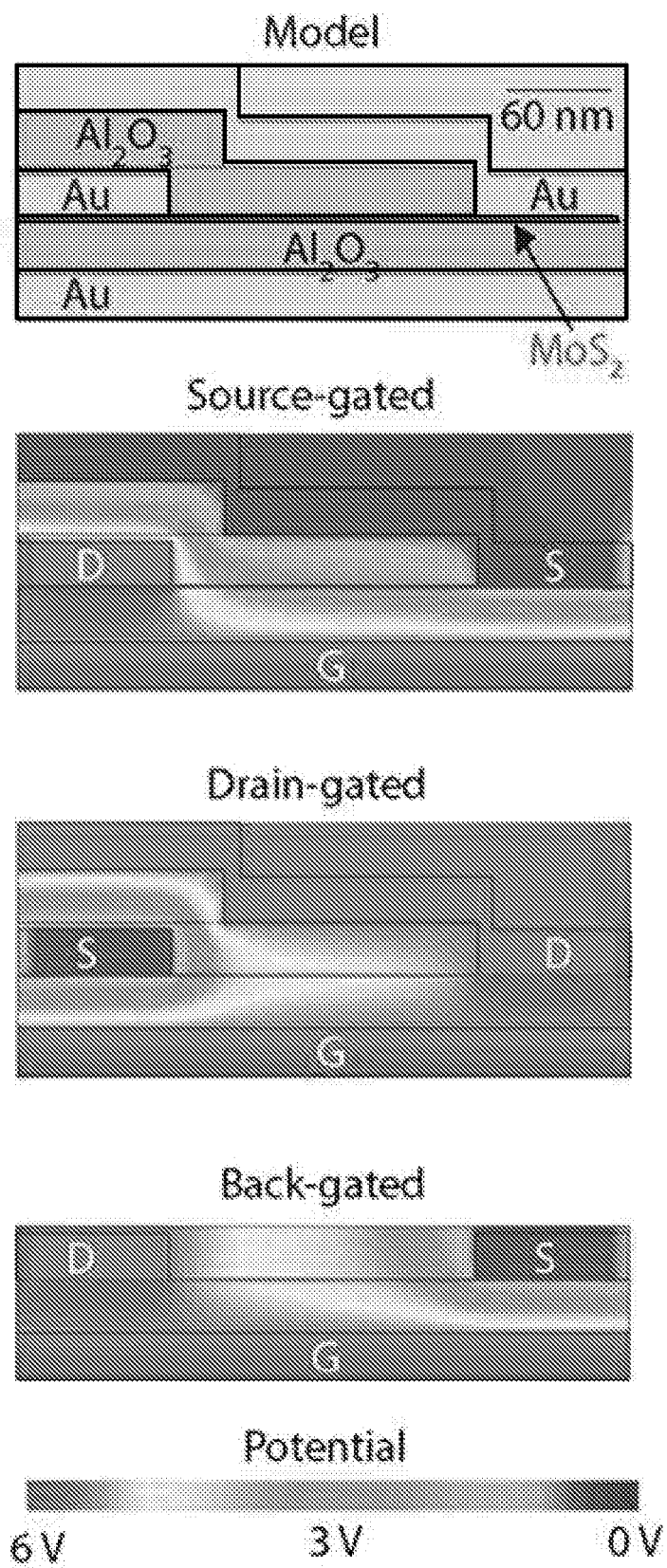
FIGS. 2A-2G show electrostatics and charge transport simulations of SASC $MoS_2$ transistors according to embodiments of the invention. Specifically.
Figure 2F:
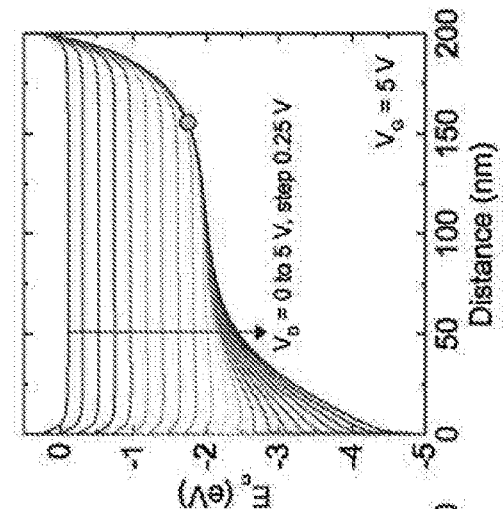
Figure 2G:
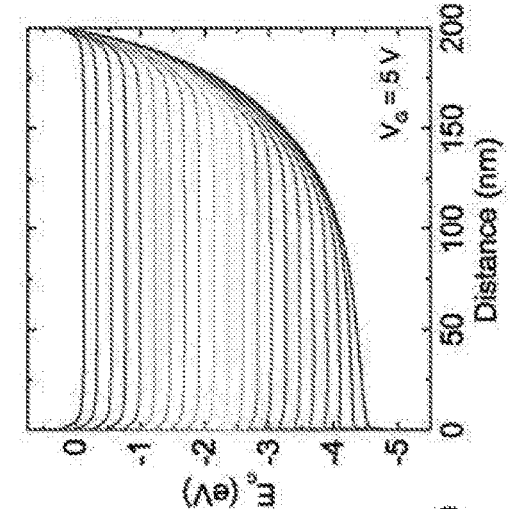
Figure 2D:
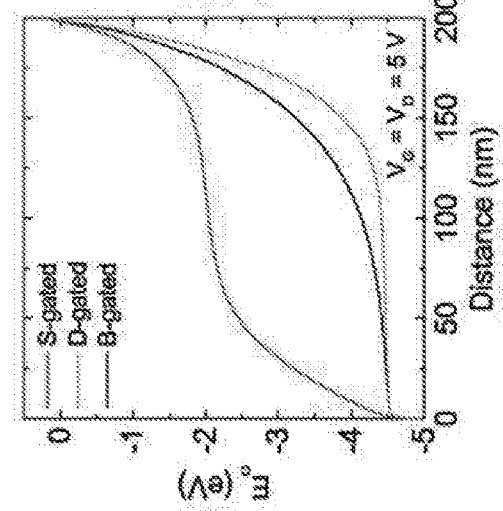
Figure 2E:
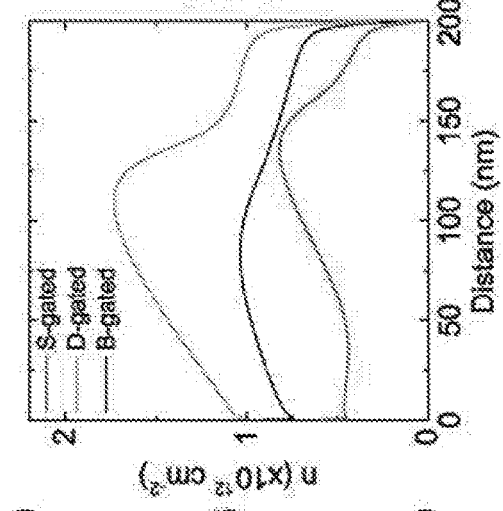
Figure 2B:
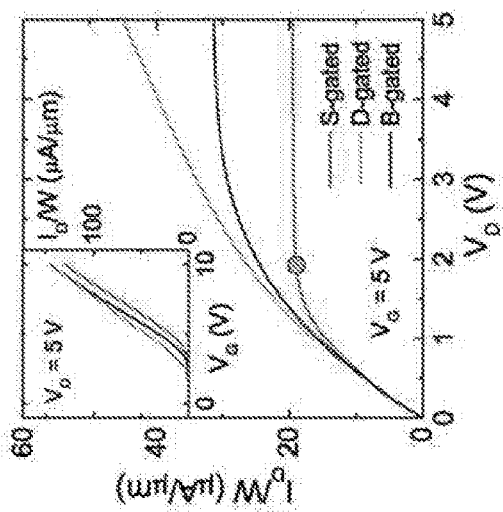
Figure 2C:
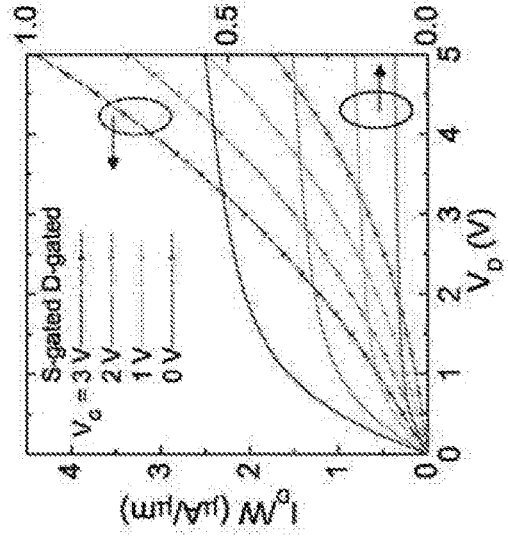

To explore the operating principles of the SASC MoS$_2$ FETs, a device simulator (Sentaurus, Synopsys) was used to model carrier densities, potential distributions, and resulting charge transport for different short-channel device geometries and bias configurations, as shown in FIGS. 2A-2G. Simulated output characteristics assuming Ohmic contacts show a 2-fold reduced $V_{SAT}$ and a 7-fold reduced $g_D$ of 0.052 μS/μm at $V_D = 5$ V for the source-gated configuration in comparison to the output curve of a back-gated FET ($g_D = 0.37$ μS/μm) with symmetric electrode arrangement, as shown in FIGS. 2A and 2B. Conversely, the output curve of the drain-gated FET does not saturate, showing about 13-fold larger $g_D$ of 5.1 μS/μm compared to the back-gated FET. The bias configuration determines whether the overlapping electrode reduces or increases the carrier density in the channel via a field-effect, as is reflected in the transfer characteristics (inset of FIG. 2B) and respective $V_{TH}$, which is larger for source-gated device operation (4.5 V) and lower for drain-gated device operation (3.0 V) relative to $V_{TH} = 3.7$ V for the back-gated FET. Although the assumption of Ohmic contacts is sufficient to reveal how the channel potential profiles lead to different current saturation characteristics [18], we find that thermionic emission and tunneling models of transport at the metal/semiconductor interfaces are needed to reproduce the low-bias ($V_D < 2$ V) nonlinearity in the output characteristics for the drain-gated configuration, as shown in FIG. 2C.

Simulated energy band profiles, as shown in FIGS. 2D, 8A-8F and 9A-9F, and electric field maps reveal the formation of an additional depletion region for the source-gated device, which leads to pinch-off near the source electrode. Consequently, the carrier density (n) in the semiconducting channel near the source contact is lower for the source-gated configuration than for the drain-gated configuration and the back-gated FET, as shown in FIG. 2E. The depletion region near the source electrode emerges in the source-gated FET for $V_D \geq 2$ V, as shown in FIG. 2F, whereas it is not observed for the back-gated FET, as shown in FIG. 2G, or under drain-gated device operation, as shown in FIGS. 9A-9F and 10A. Consequently, the dielectric extension acts as the 'field-relief' used in conventional SGTs by screening the drain field [17]. The evolution of the carrier density distribution in the MoS$_2$ channel as a function of the bias and the formation of depletion regions is shown in FIGS. 9A-9F for all devices. Despite a smaller transconductance ($g_m = 0.5$ μS/μm versus 38 μS/μm) and a shorter L (150 nm versus 250 nm), the simulated values of $r_o$ (>20 MΩ) for the SASC MoS$_2$ FETs are significantly higher than the previously reported values of $r_o$ about 32 kΩ for short-channel MoS$_2$ FETs [19].

The self-alignment approach also facilitates the reliable fabrication of p-n vdWHs with small footprints and unique electrostatic gating control. With previously reported fabrication methods, p-n vdWHs, whether lateral or vertical, included a p-n heterojunction connected by two lateral p-type and n-type extensions (acting as FETs in series) or Schottky diodes with graphene, with the overall stack being coupled to one or two gates with alignment errors increasing with each component [3, 4, 8, 9, 20-24]. In the lateral geometry, p-n vdWHs offer electrostatically controlled doping in the constituent semiconductors but suffer from large parasitic resistance from the lateral extensions beyond the junction region [3, 8, 9, 21, 22, 24]. On the other hand, vertical p-n vdWHs that employ a graphene electrode can achieve larger current density at the cost of defect-induced leakage currents, extraneous Schottky barriers, and electrode screening issues [20, 23, 24]. For example, fully vertical BP—MoS$_2$ and WSe$_2$—MoS$_2$ p-n vdWHs using graphene contacts show poor electrostatic control of $I_D$-$V_{TG}$ characteristics, as shown in FIGS. 11A-11H. In contrast, the semi-vertical architecture addresses these shortcomings by minimizing L in the lateral semiconductor extension and exposing the heterojunction to the applied electric field in a dual-gate geometry. Furthermore, the self-aligned method minimizes L by controlling the size of the dielectric extension (about 135 nm) rather than the resolution of optical alignment and transfer methods. Employing this approach, as shown in FIGS. 3A-3C and 6, a dual-gated BP—MoS$_2$ p-n vdWH was fabricated on a Si substrate (global bottom gate (BG)) 310 and about 300 nm thermal oxide (bottom gate dielectric (BD)) 320 using CVD-grown MoS$_2$ 340 and mechanically exfoliated few-layer BP 360 contacted with overlapping Au and Ni electrodes 330 and 370, respectively, and separated by an about 35 nm thick $Al_2O_3$ extension layer 350. The top gate dielectric (TD) 380 of about 30 nm ALD-grown $Al_2O_3$ and top gate (TG) 390 of about 50 nm Au are patterned in the same fabrication step, thus requiring no additional alignment.

Given the band alignment between BP and $MoS_2$, the dual-gated BP—$MoS_2$ vdWH shows rectifying I-V characteristics with a rectification ratio up to about 50 (limited by the small band gap of BP about 0.4 eV) that can be controlled by both the top and bottom gates, as shown in FIGS. 3D-3F and 12A-12B, [15, 22, 25]. The device behavior switches from a normal p-n heterojunction diode at $V_{TG}=0$ V to a Zener-like diode at $V_{TG}=4$ V with reversed rectification at room temperature (inset FIG. 3E), similar to a previously reported dual-gated $WSe_2$—$MoS_2$ p-n heterojunction diode operated at 77 K and an ion-gel gated BP—$MoS_2$ p-n heterojunction diode [22, 26]. Band-to-band-tunneling is barely visible in the upward trend in $I_D$ at a reverse bias of $V_D=-1$ V at $V_{TG}=0$ V due to the small band gap of BP and thermal broadening of the Fermi-Dirac distribution at room temperature (FIG. 3E) [27]. Unlike previous p-n vdWHs, this device shows anti-ambipolar transfer characteristics that can be tuned continuously by the bottom gate (FIG. 3G) as uniquely enabled by the self-aligned, semi-vertical architecture [3, 4, 8, 9].

Figure 4D:
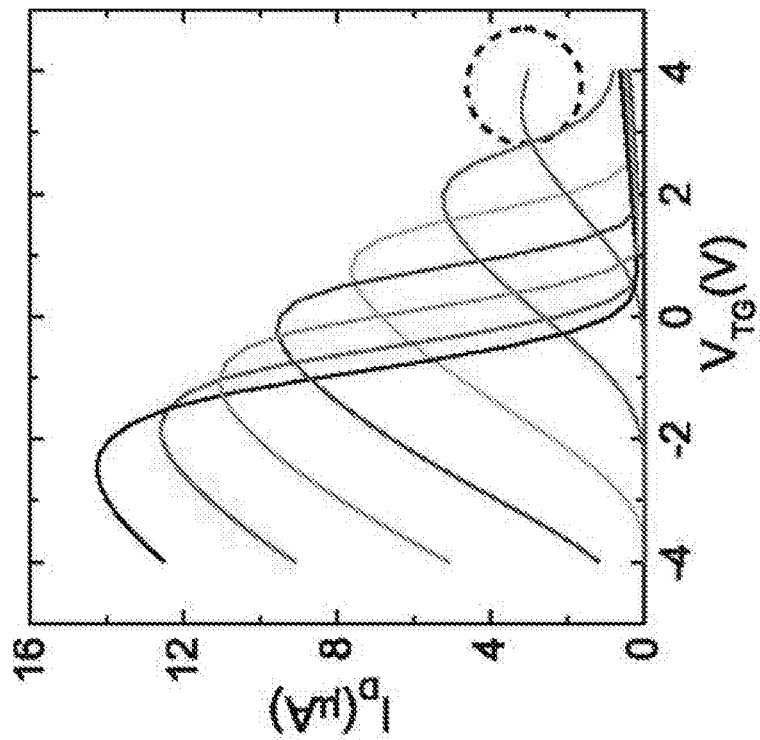
Figure 4C:
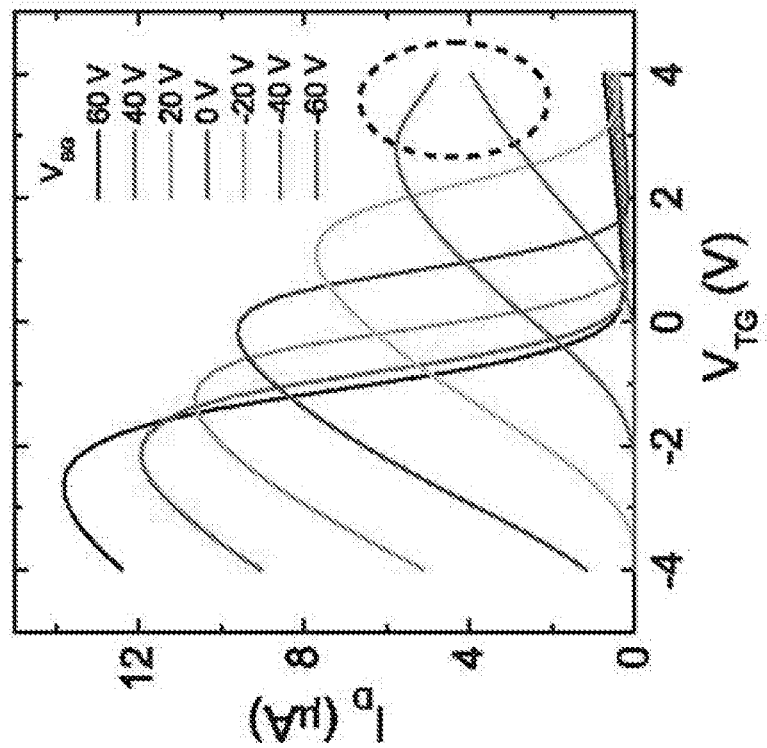
Figure 4H:
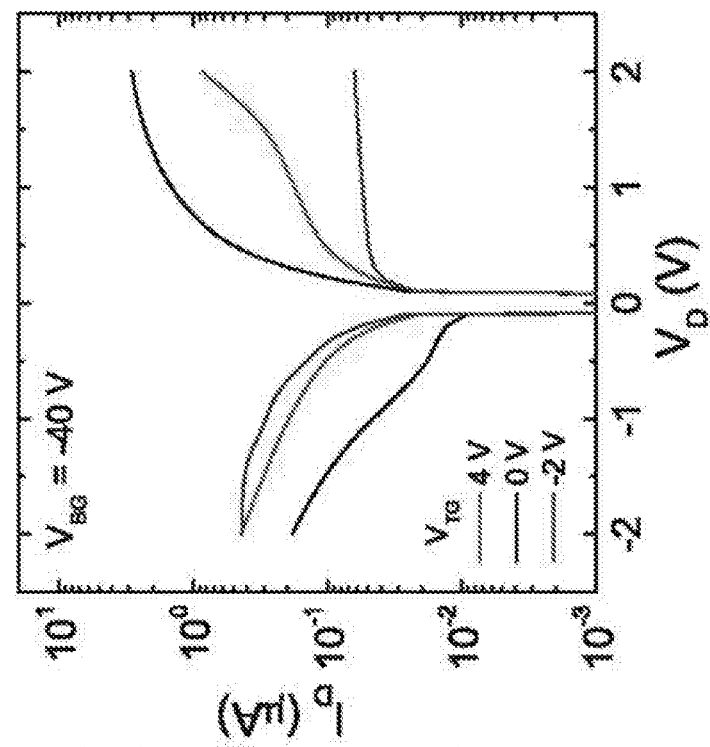
Figure 4G:
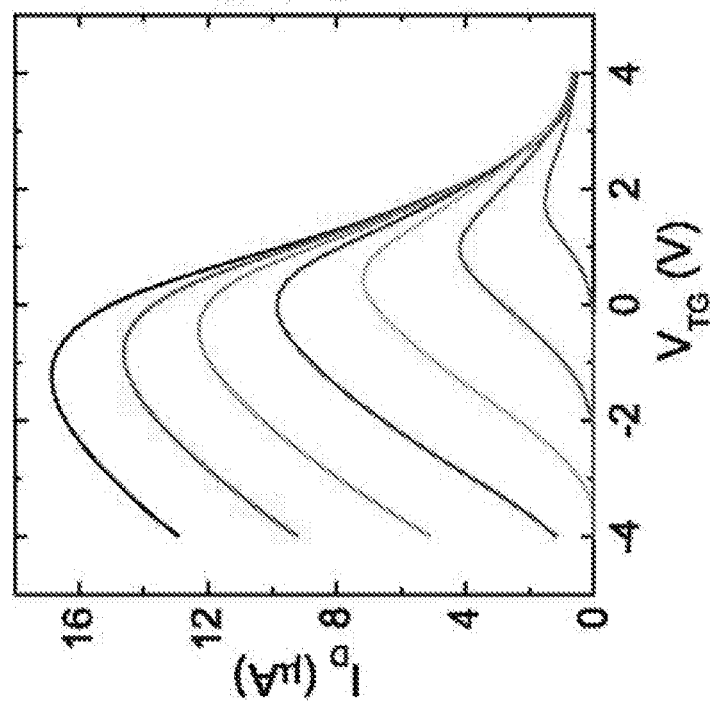
Figures 13A, 13B:
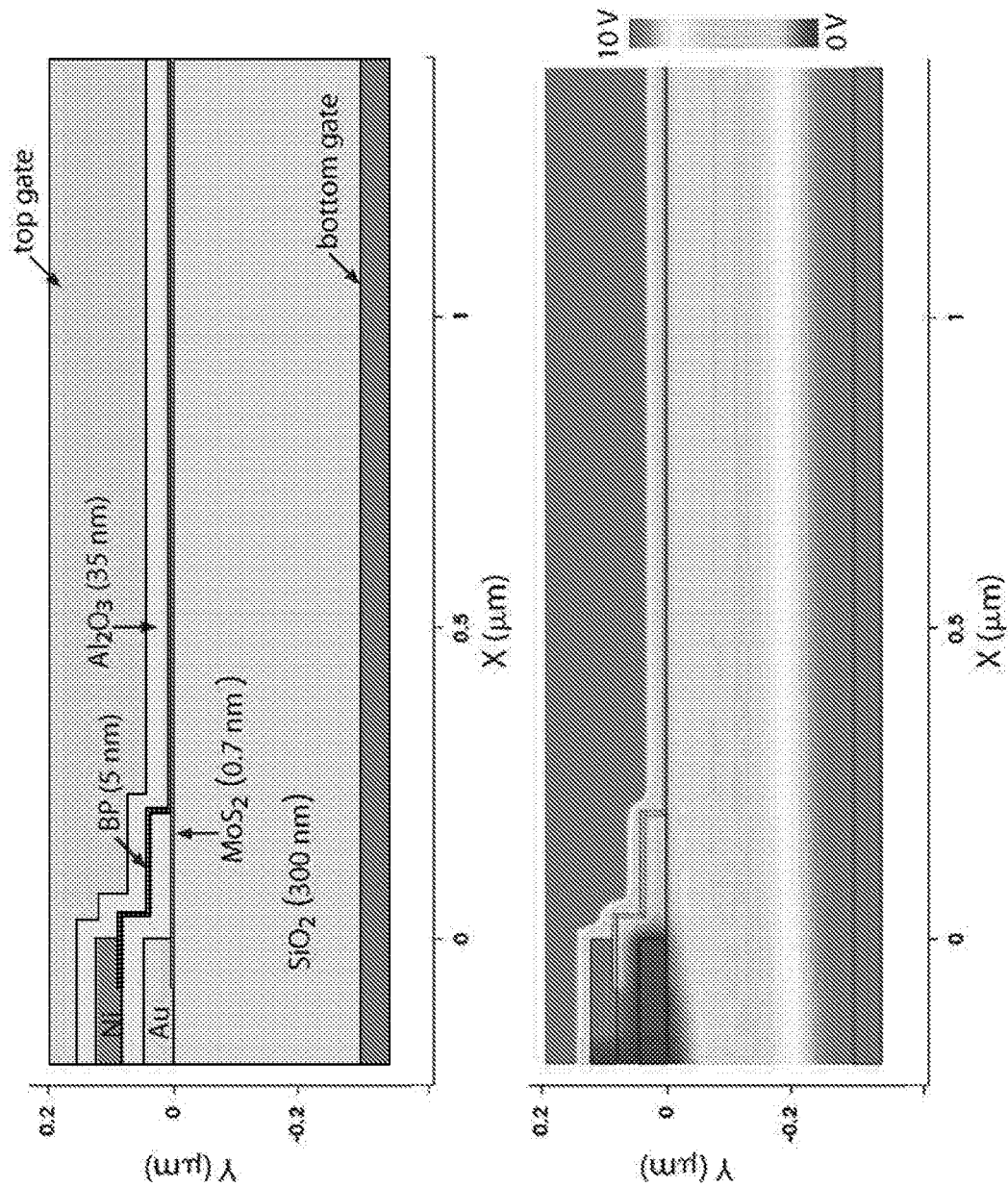
FIGS. 13A-13D show simulated 2D model, circuit diagram, and device characteristics for the self-aligned BP—$MoS_2$ vdWH with complete overlap between the semiconductors according to embodiments of the invention.
Figure 13D:
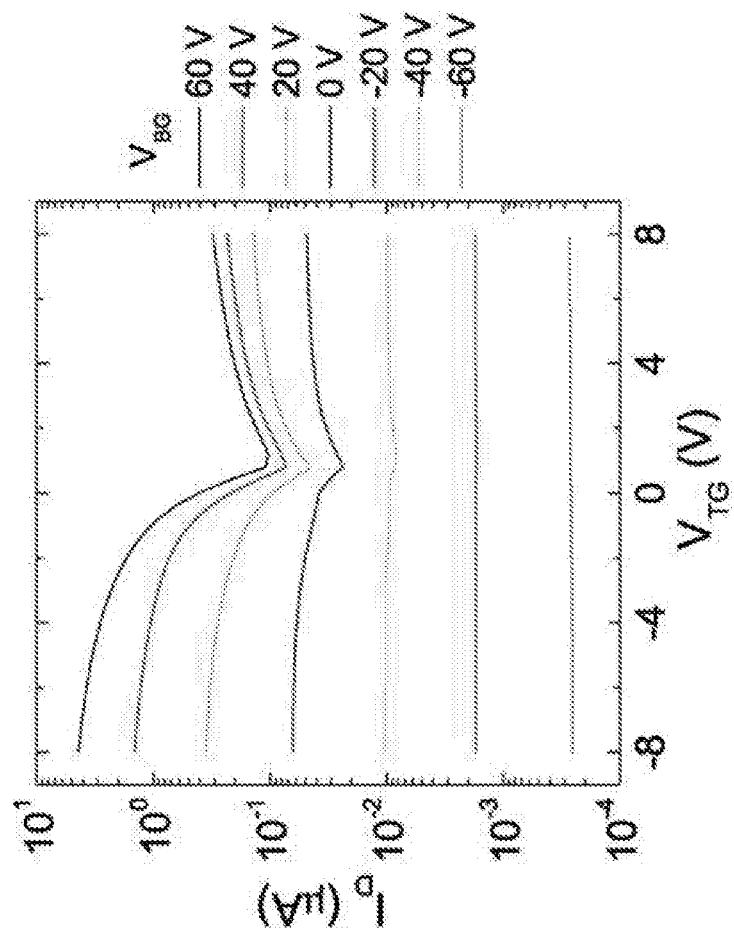
Figure 13C:
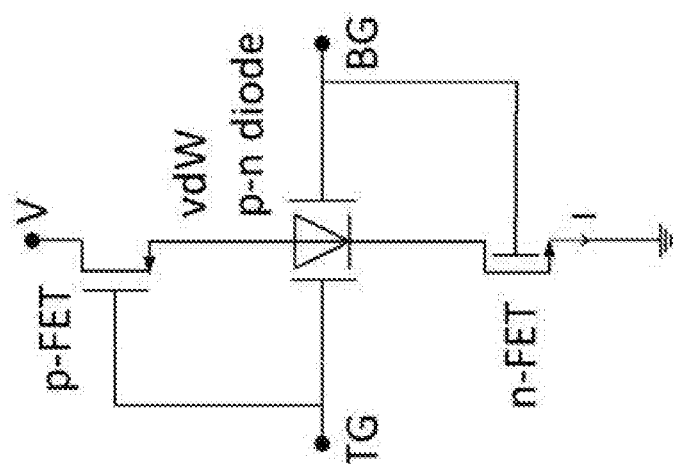
Figure 14A:
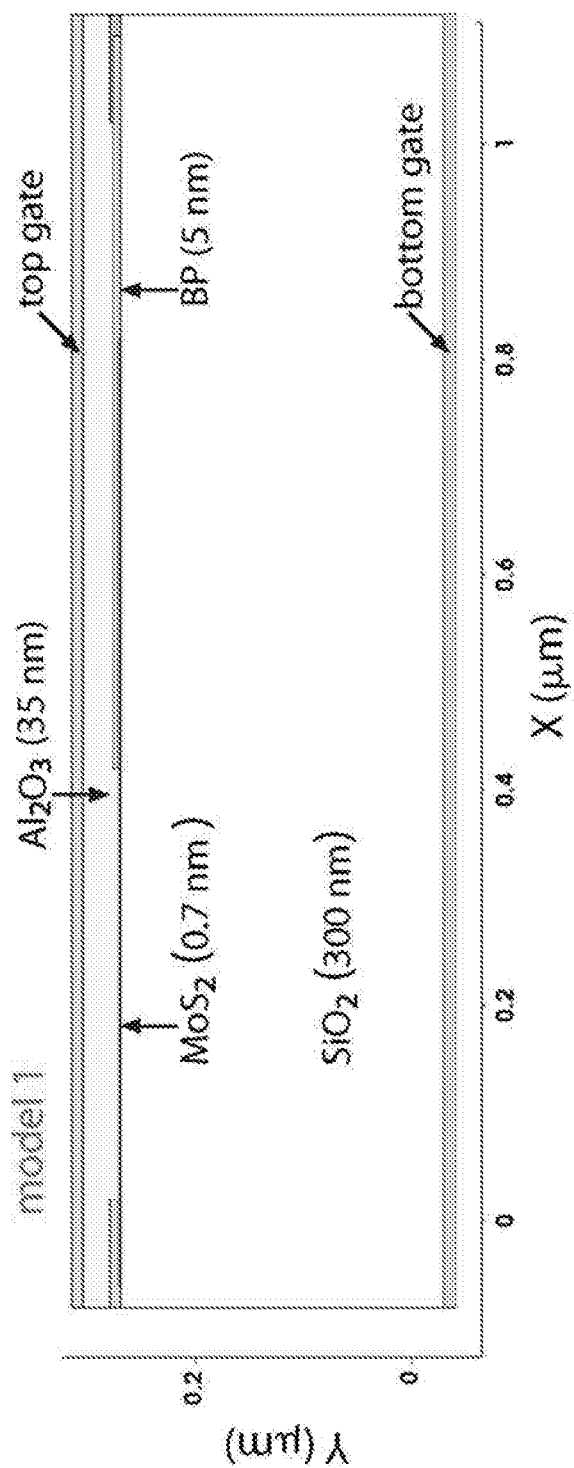
FIGS. 14A-14C show different simulation geometries for BP—MoS$_2$ vdWH according to embodiments of the invention.
Figure 14B:
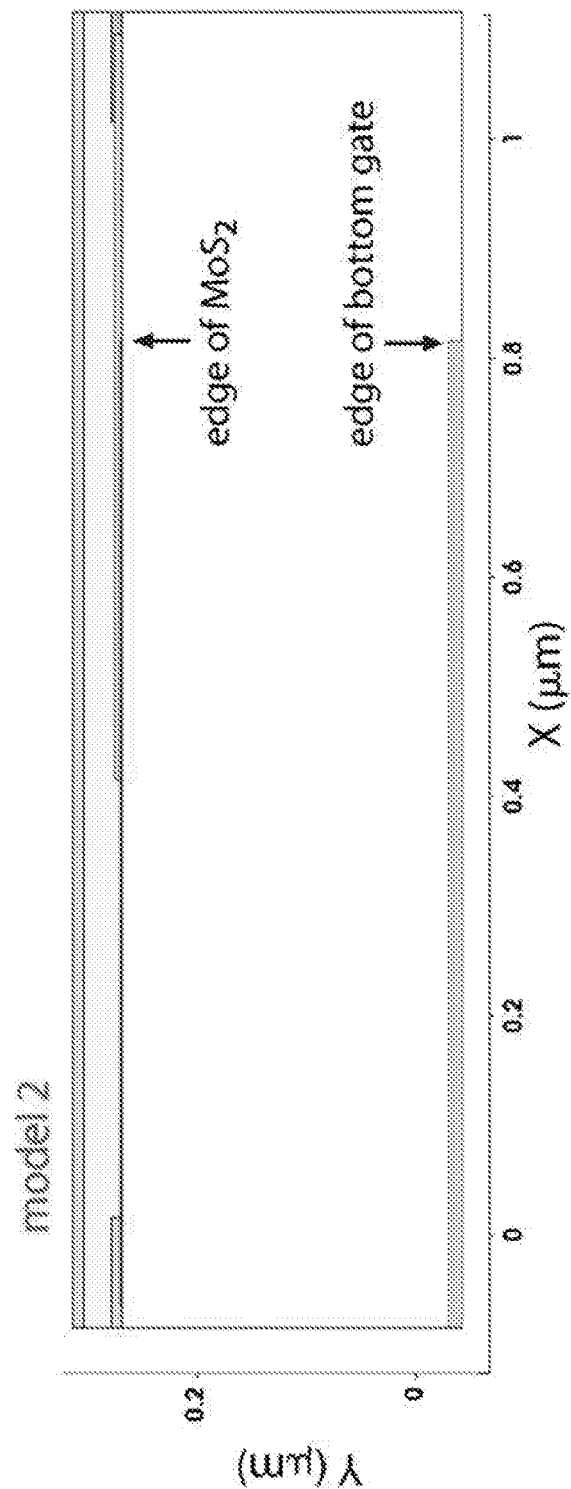
Figure 14C:
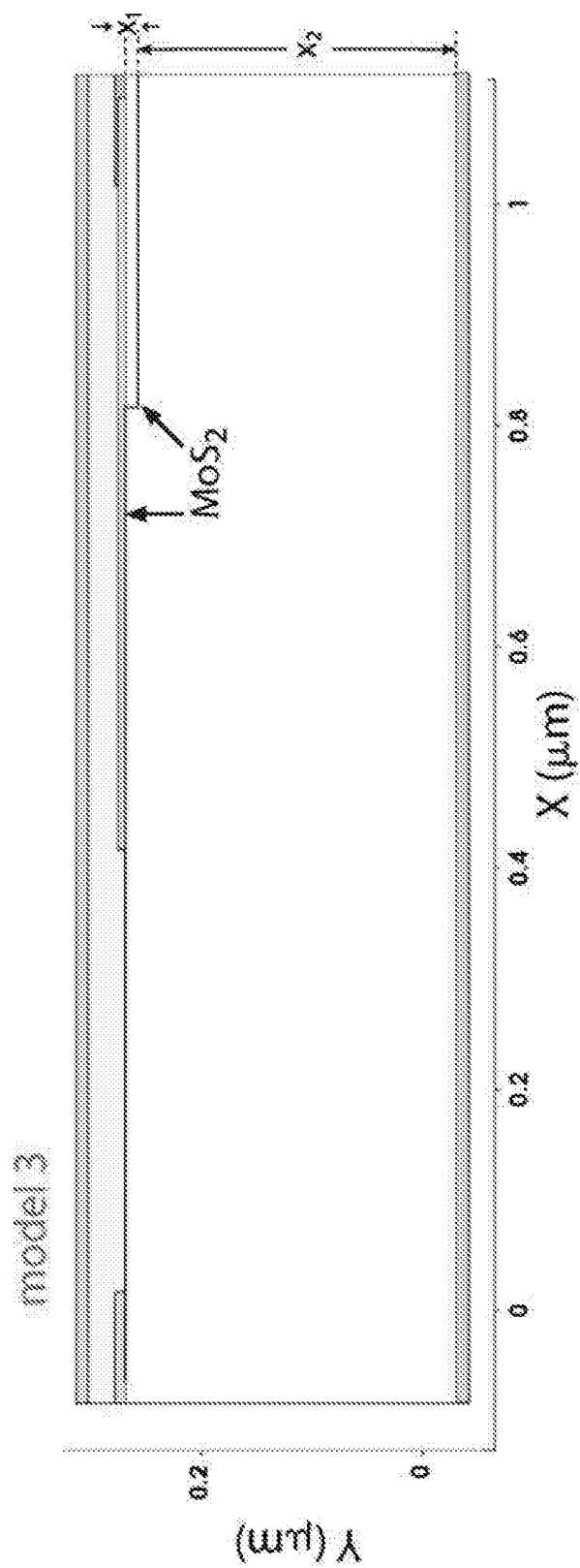
Figure 15A:
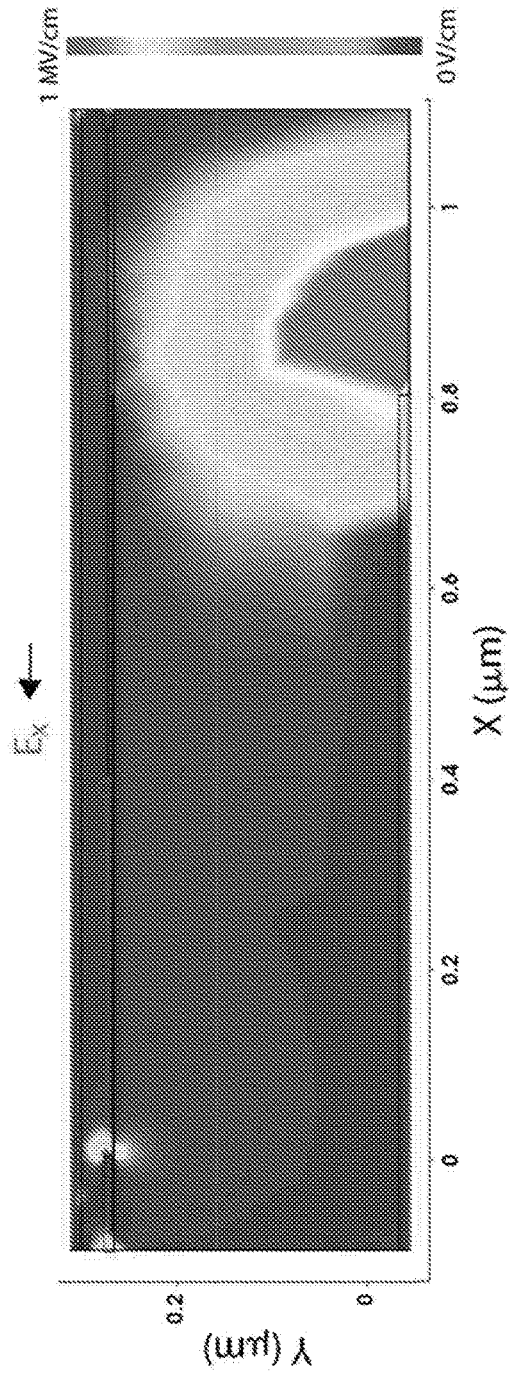
FIGS. 15A-15B show simulated electric fields of model-(2) BP—MoS$_2$ vdWH according to embodiments of the invention.
Figure 15B:
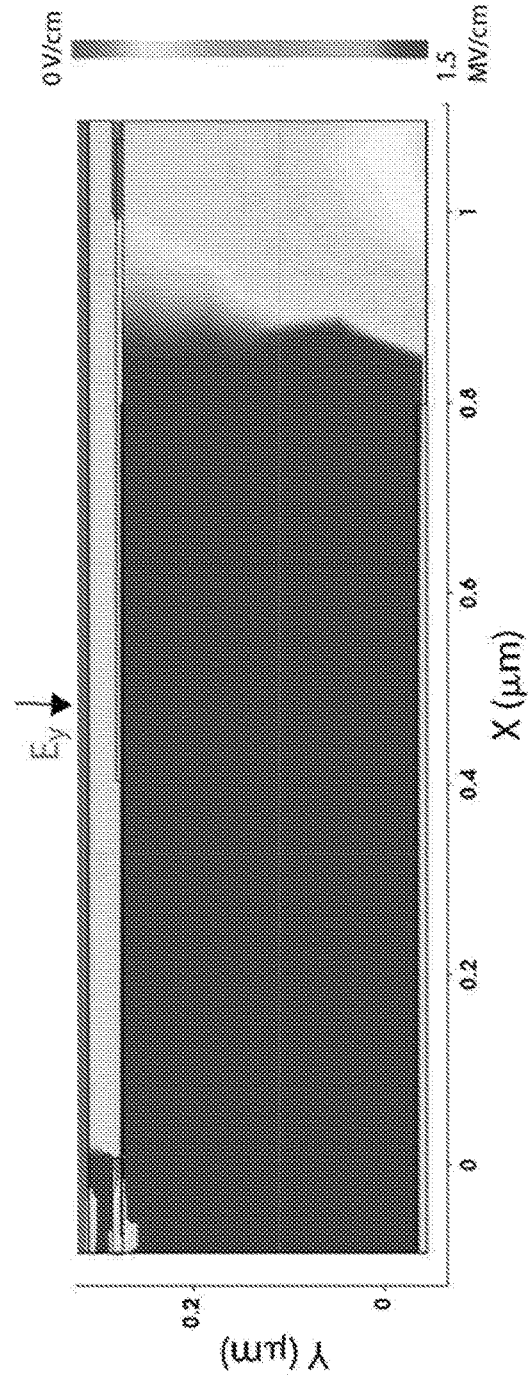
Figures 16A, 16B, 16C:
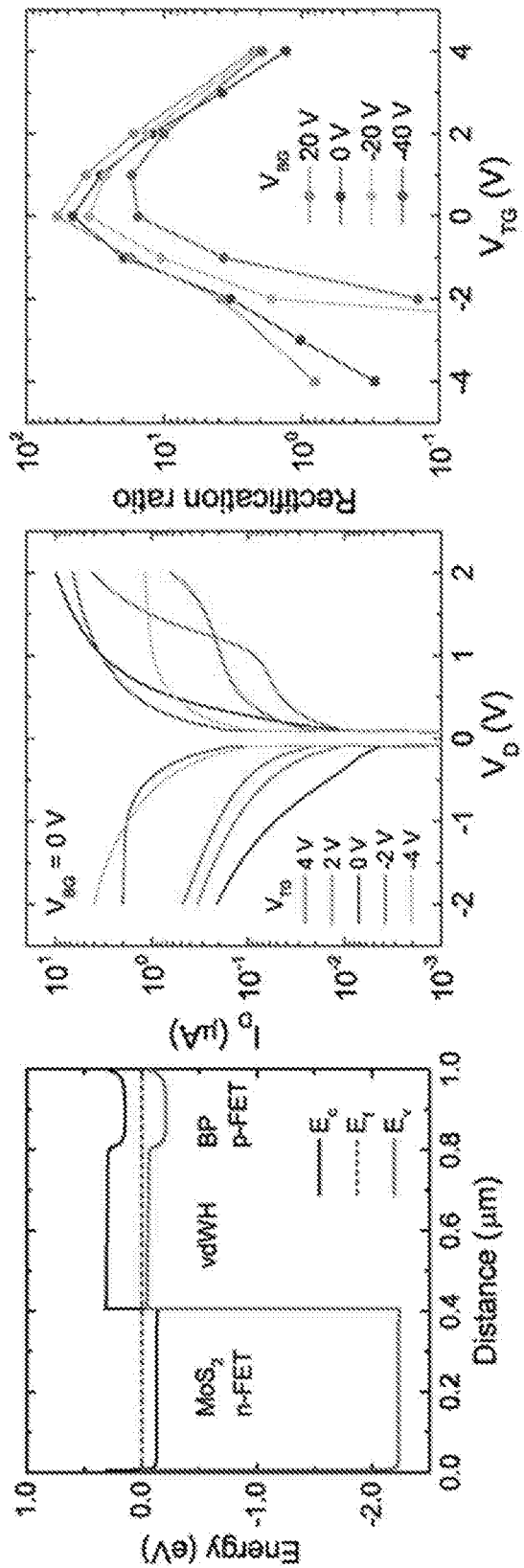
FIGS. 16A-16C show calculated energy band diagram and current-voltage characteristics for model-(3) BP—MoS$_2$ vdWH according to embodiments of the invention.
Figure 18B:
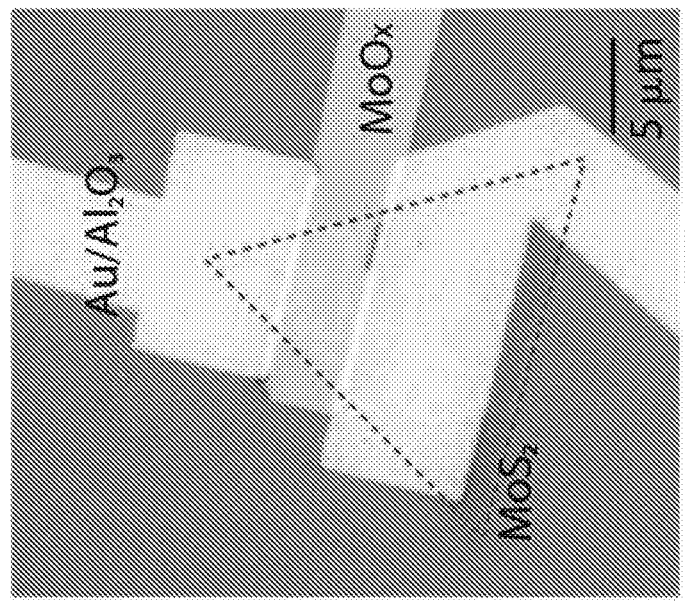
FIGS. 18A-18D show device architecture and characteristics of a self-aligned contact-doped MoS$_2$ p-n homojunction diode according to embodiments of the invention.
Figure 18A:
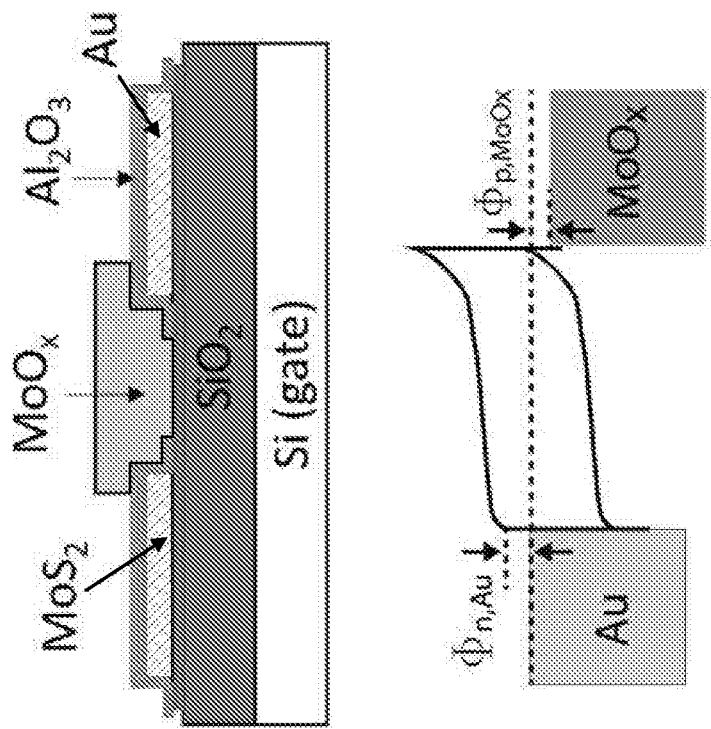
Figure 18D:
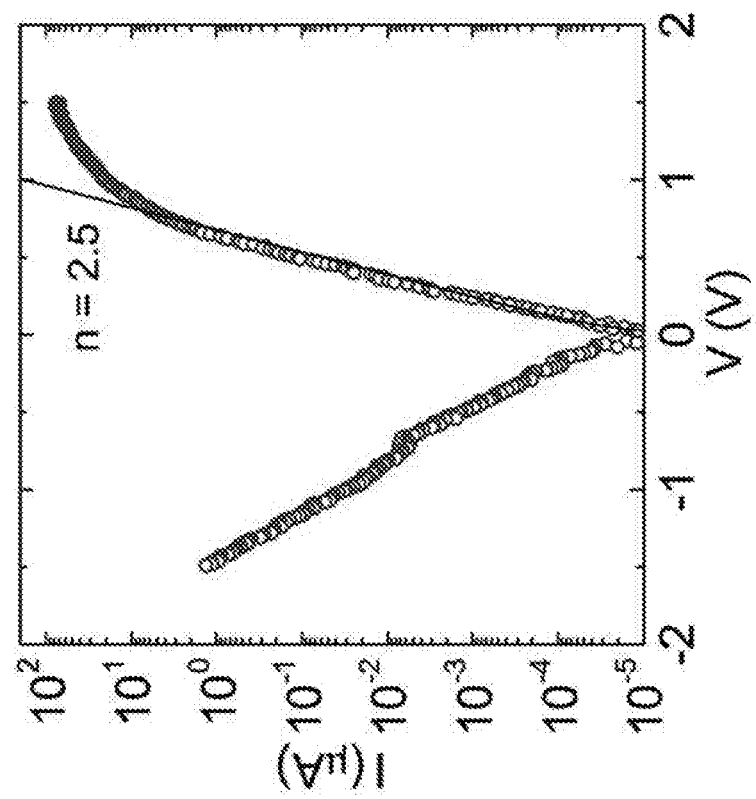
Figure 18C:
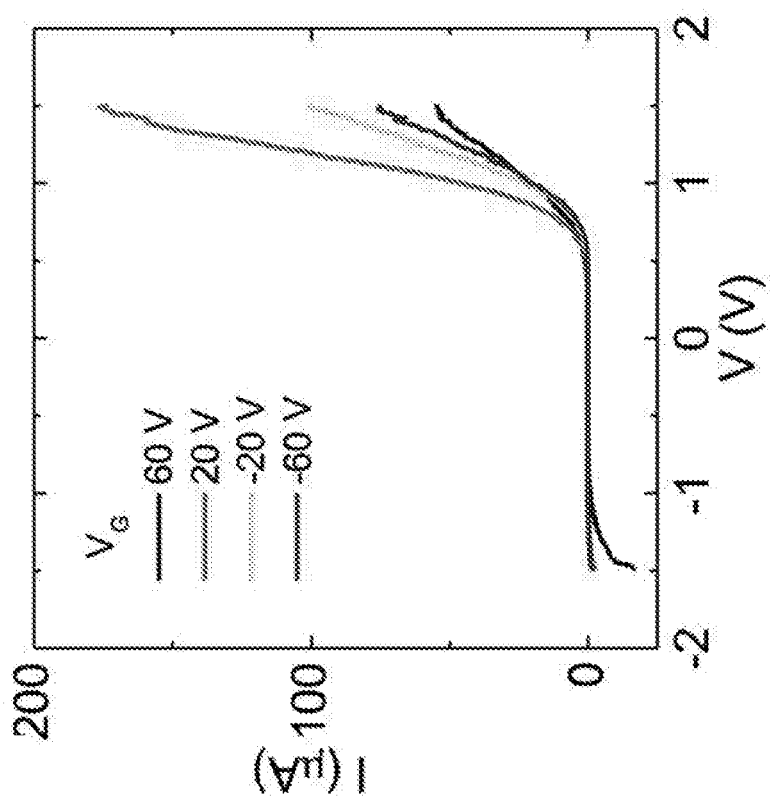
Figure 19B:
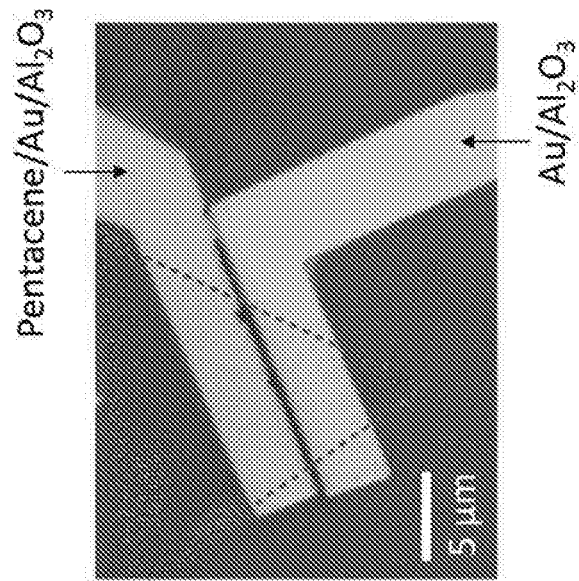
FIGS. 19A-19D show device architecture and characteristics of a semi-vertical self-aligned pentacene-MoS$_2$ vdWH according to embodiments of the invention.
Figure 19A:
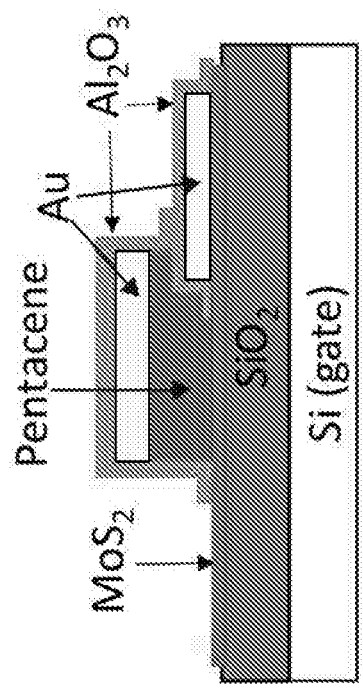
Figure 19D:
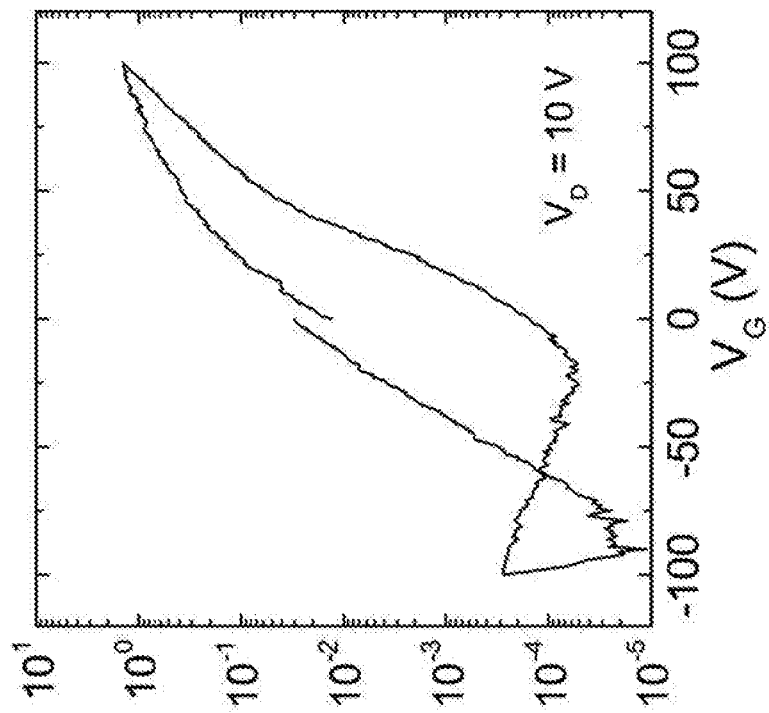
Figure 19C:
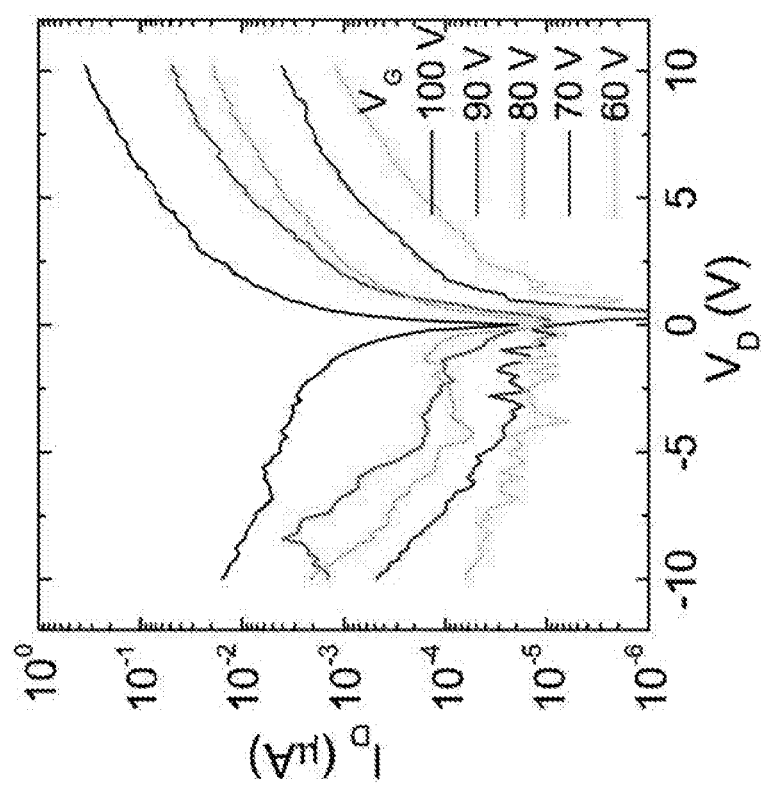

Finite-element simulations elucidate how this unique vdWH geometry improves current rectification and enables tunable anti-ambipolar behavior, as shown in FIGS. 4A-4H. Three architectures allow for gating of the lateral semiconducting extensions in dual-gated lateral vdWHs: architecture-(i) possesses individual gate control over each lateral extension, as shown in FIGS. 13A-13B; architecture-(ii) utilizes both gates to control both lateral extensions, as shown in FIGS. 4A-4D, 14A-14B and 15A-15B; architecture-(iii) allows both gates to control one of the lateral extensions while the other extension is controlled by a single gate, as shown in FIGS. 4F and 14C. In architecture-(i), both semiconductors in the heterojunction can be driven to maximum electrostatic doping without compromising series resistances. However, these devices do not show anti-ambipolar behavior because dual-gate control of at least one of the lateral extensions is required, as shown in FIGS. 13A-13D. Architecture-(ii) creates a trade-off between electrostatic control and series resistance, as shown in FIGS. 4C-4D, embodying almost all published examples of lateral vdWHs with one exception [22], where the alignment of the two gates was limited by lithographic resolution. Architecture-(iii) offers controlled electrostatic doping without compromising gate-tunability of the heterojunction, resulting in control over all characteristics of the anti-ambipolar response.

Self-aligned BP—$MoS_2$ p-n vdWHs readily enable architecture-(iii). In particular, the BP flake is controlled only by the top gate due to screening of the bottom gate by $MoS_2$. Similarly, the region of the $MoS_2$ flake directly underneath BP is controlled only by the bottom gate (I1), but the rest of the $MoS_2$ flake (i2) is influenced by both gates, as shown in FIGS. 4E-4F. Control over the relative fractions of the total current along paths i1 and i2 results in gate-tunability of the anti-ambipolar response. Simulations of the BP—$MoS_2$ vdWH device using a topologically equivalent two-dimensional model are shown in FIGS. 4F and 14C. An $MoS_2$ screening layer is embedded in the bottom gate dielectric to simulate the screening of the BP layer from the bottom gate field. This model reproduces the tunability of the anti-ambipolar transfer characteristics by restoring control of electrostatic depletion in the sub-threshold regime for BP ($V_{TG}>3$ V in FIG. 4G). Simulated tunable rectification in the charge transport characteristics also agrees well with experimental data, as shown in FIGS. 3F, 4H and 16A-16C.

Figure 20C:
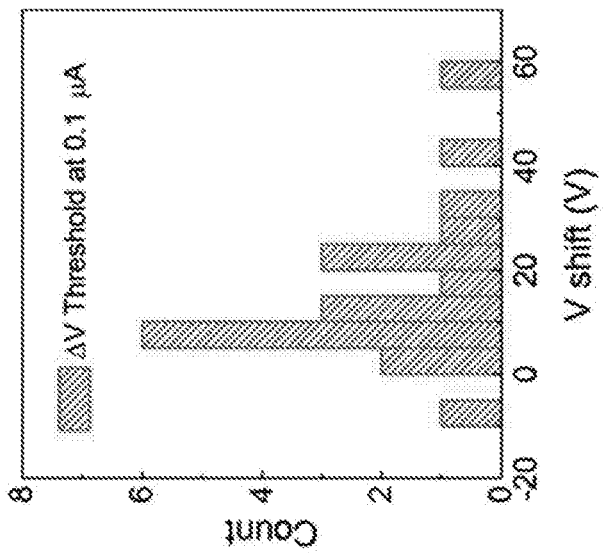
FIGS. 20A-20C show large-area scalability of self-aligned sub-wavelength transistors via photolithography according to embodiments of the invention.
Figure 20B:
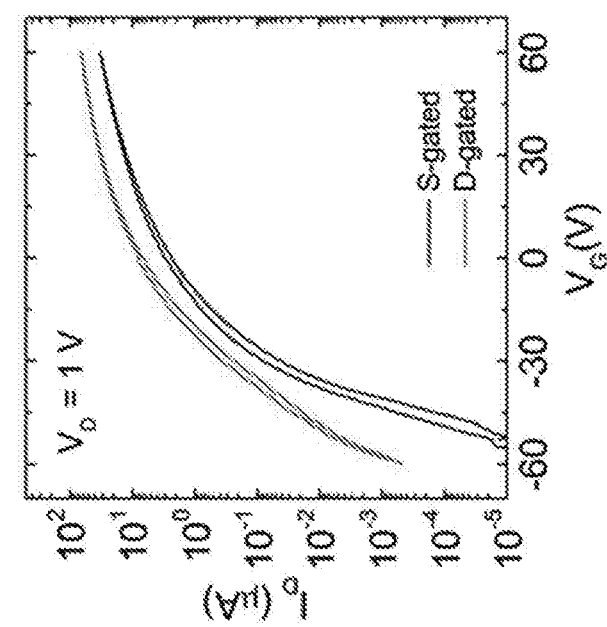
Figure 20A:
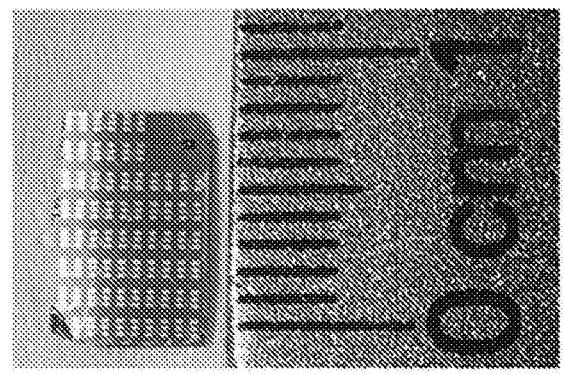

According to the invention, a self-aligned approach enables scalable fabrication of short-channel FETs and vdWHs based on 2D semiconductors. The resulting geometry provides a unique electrostatic control over charge transport including exceptional saturation characteristics in short-channel FETs and nearly complete tunability over the anti-ambipolar response in p-n vdWHs with potential implications for signal-processing applications such as frequency-shift keying and phase-shift keying, as shown in FIGS. 17A-17C [8]. The gate-tunable mean and variance over the Gaussian anti-ambipolar response in self-aligned p-n vdWHs also possess utility for highly efficient image recognition algorithms in artificial neural networks [28]. This self-aligned fabrication approach can also be generalized to other device architectures such as contact-doped homojunction diodes, as shown in FIGS. 18A-18D [29] and mixed-dimensional vdWH heterojunctions, as shown in FIGS. 19A-19D [3]. Furthermore, this self-aligned method is straightforwardly extended to large areas without compromising lateral spatial resolution as demonstrated by photolithographically defined SASC transistors on continuous $MoS_2$ films with sub-wavelength channel lengths (about 150 nm), as shown in FIGS. 20A-20C. Overall, various embodiments of the invention demonstrate a highly flexible and generalizable fabrication method with broad implications for electrostatically modulated 2D material and vdWH devices.

Compared to conventional methods of assembling 2D materials that are not scalable and do not realize ultimate device performance due to suboptimal contact geometries, the invented method integrates standard resist lithography with atomic layer deposition and metal evaporation methods to achieve short-channel devices in a self-aligned manner. The method enables complex device architectures with high conductance and gate-induced electrostatic control, and can be straightforwardly scaled to large areas.

Further, the invention may have the applications in a variety of fields, such as van der Waals heterojunctions, source-gated short-channel transistors with near-ideal current saturation, high bandwidth current amplifiers, high gain photodetectors, and large-area sub-diffraction fabrication of thin-film transistors, and so on.

These and other aspects of the present invention are further described below. Without intent to limit the scope of the invention, exemplary instruments, apparatus, methods and their related results according to the embodiments of the present invention are given below. Note that titles or subtitles may be used in the examples for convenience of a reader, which in no way should limit the scope of the invention. Moreover, certain theories are proposed and disclosed herein; however, in no way they, whether they are right or wrong, should limit the scope of the invention so long as the invention is practiced according to the invention without regard for any particular theory or scheme of action.

Fabrication Method for Self-Aligned Short-Channel Transistor

In this exemplary embodiment, self-aligned device fabrication was realized using both e-beam lithography (EBL) and photolithography. All SASC $MoS_2$ transistors discussed in FIGS. 1A-1H were fabricated using EBL. In this process, a bilayer of e-beam resist poly(methyl methacrylate)

(PMMA) from MicroChem Corp. is used to encapsulate an evaporated metal film with an ALD-grown $Al_2O_3$ dielectric using one lithographic step in a self-aligned manner. As shown in FIG. 1A, the fabrication process is: (1) Resist 1 is spin-coated at about 2500 rpm for about 45 sec followed by baking at about 180° C. for about 90 sec; then, resist 2 is spin-coated at about 4000 rpm for about 45 sec followed by baking at about 180° C. for about 90 sec. (2) An FEI Quanta ESEM (Environmental Scanning Electron Microscope) is used to pattern the devices using a working distance of about 7 mm, aperture of about 5, current of about 800-1000 pA, and accelerating voltage of about 30 kV at dosages of about 300-350 $\mu C/cm^2$. (3) The substrate is developed for about 70 sec in methyl isobutyl ketone (MIBK): isopropyl alcohol (IPA) (1:3) solution followed by about 30 sec in IPA, resulting in the structure shown in panel (i) of FIG. 1A. (4) The desired metal contacts are thermally evaporated (a directional deposition process) using a Nano38 thermal evaporator (Kurt J. Lesker, Inc.) with a 4 nm coating of Al that oxidizes immediately in ambient conditions and acts as a seeding layer for the ALD growth of the dielectric. (5) ALD growth (a conformal deposition process) of about 30 nm of $Al_2O_3$ is carried out at about 100° C. with about 30 sec intervals between the water and precursor (trimethylaluminum) pulses, resulting in the structure shown in panel (ii) of FIG. 1A. The total thickness of about 35 nm $Al_2O_3$ includes both the 4 nm of oxidized Al film and about 30 nm of ALD-grown $Al_2O_3$.

With an EBL-based process, two bilayer resist systems, MMA/PMMA A4 950 (recipe 1) and PMMA A5 495/PMMA A4 950 (recipe 2), were optimized. The magnitude of the resist undercut is better controlled by the reactivity of resist 1 to the development solution than other processing parameters that affect both resist layers. MMA was the most reactive to the development solution and produced an undercut profile that resulted in a dielectric extension on the order of 500 nm as determined by AFM analysis. On the other hand, PMMA A5 495 is only slightly more reactive than PMMA A4 950 because of their different molecular weights, so the undercut profile was reduced, resulting in a dielectric extension of less than about 200 nm, as shown in FIGS. 1D and 1E.

In certain embodiments, single-layer $MoS_2$ crystals were grown on 300 nm $SiO_2/Si$ substrates by chemical vapor deposition (CVD) using a previously described procedure [2]. Specifically, the SASC $MoS_2$ transistors shown in FIGS. 1A-1H were fabricated by transferring CVD-grown $MoS_2$ from the growth substrate onto pre-patterned local-gates. To create the local gate structures, undoped Si substrates with 300 nm $SiO_2$ were subjected to recipe 1 to deposit the local gate contact with dielectric encapsulation of about 35 nm $Al_2O_3$. After transferring the isolated $MoS_2$ flakes onto the local gates, recipe 2 was used to deposit (about 4 nm Ti)/(about 40 nm Au)/(about 4 nm Al) followed by ALD growth of about 30 nm $Al_2O_3$ for the bottom contacts. A subsequent EBL and metallization process using the aforementioned conditions was used to fabricate the top contact (about 4 nm Ti)/(about 40 nm Au) overlapping the channel and bottom electrode, as shown in FIG. 1B.

Large-area SASC $MoS_2$ transistors were fabricated using a photolithography-based process exploiting the inherent undercut in single-layer photoresists on a continuous CVD $MoS_2$ film, as shown in FIGS. 5A-5C and 20A-20C. (1) The $MoS_2$ film was patterned into rectangles using a Microposit S1813 (Shipley Company) positive resist and reactive ion etching using Ar (power=50 W, pressure=100 mTorr, and flow rate=50 sccm, time=20 sec). (2) The negative photoresist NR9-1000 PY (Futurrex, Inc.) is spin-coated from about 3000 to about 6000 rpm for about 40 sec and pre-baked at about 150° C. (3) A SUSS MABA6 Mask Aligner with wavelength of about 365 nm and intensity of about 9 $mW/cm^2$ is used to expose the desired areas of the resist for about 20-40 sec, followed by post-bake at about 100° C. (4) The substrate is then developed in RD6 (Futurrex, Inc.) for about 12-18 sec. (5) The (about 4 nm Ti)/(about 30 nm Au)/(about 4 nm Al) metal contacts are thermally evaporated. (6) ALD of 30 nm thick $Al_2O_3$ is carried out at about 100° C. with about 30 sec intervals between pulses. (7) Finally, the top electrode is fabricated using a normal photolithography process with negative resist.

Using the geometry shown in panel (iv) of FIG. 1A, SASC transistors and diodes were fabricated from $MoS_2$ using symmetric and asymmetric metal contacts, respectively, with the channel length (L) defined by the dielectric extension, as shown in FIGS. 18A-18D. Mixed-dimensional van der Waals heterojunctions (vdWHs), such as OD-2D pentacene-$MoS_2$, as shown in FIGS. 19A-19D, can be fabricated by transferring or depositing subsequent semiconductors followed by metallization steps. This semi-vertical geometry enables fabrication of a p-n junction with the second semiconductor deposited in the same step as the metal contact. Subsequent ALD growth of dielectric protects sensitive semiconductors against future processing.

Fabrication Method for Self-Aligned Semi-Vertical Van Der Waals P—N Heterojunction In this example, for dual-gated vdWHs, the contacts on the second semiconductor are deposited directly on top of the contacts for the first semiconductor, as shown in panel (iv) of FIG. 1A. The second semiconductor, such as p-type black phosphorus (BP), can be transferred via common transfer techniques, as shown in FIG. 6 [6, 21, 30, 31]. Note that in contrast to conventional transfer methods where the precision of offset between the contacts and two semiconductors is limited by optical resolution or the transfer method, the relative alignment of metal and semiconductor in the method is defined by the dielectric extension and thus significantly reduces channel lengths of extensions acting as series transistors [32]. Furthermore, electrodes for the second semiconductor can be placed before or after the transfer process to achieve bottom-contact or top-contact geometry, respectively. Finally, reversing the order of metal evaporation and ALD growth allows for a self-aligned top gate and gate dielectric in a single step. The dielectric layer also acts as an encapsulation layer for ambient sensitive materials and thus enables facile processing of BP flakes in these devices [27].

Figure 3B:
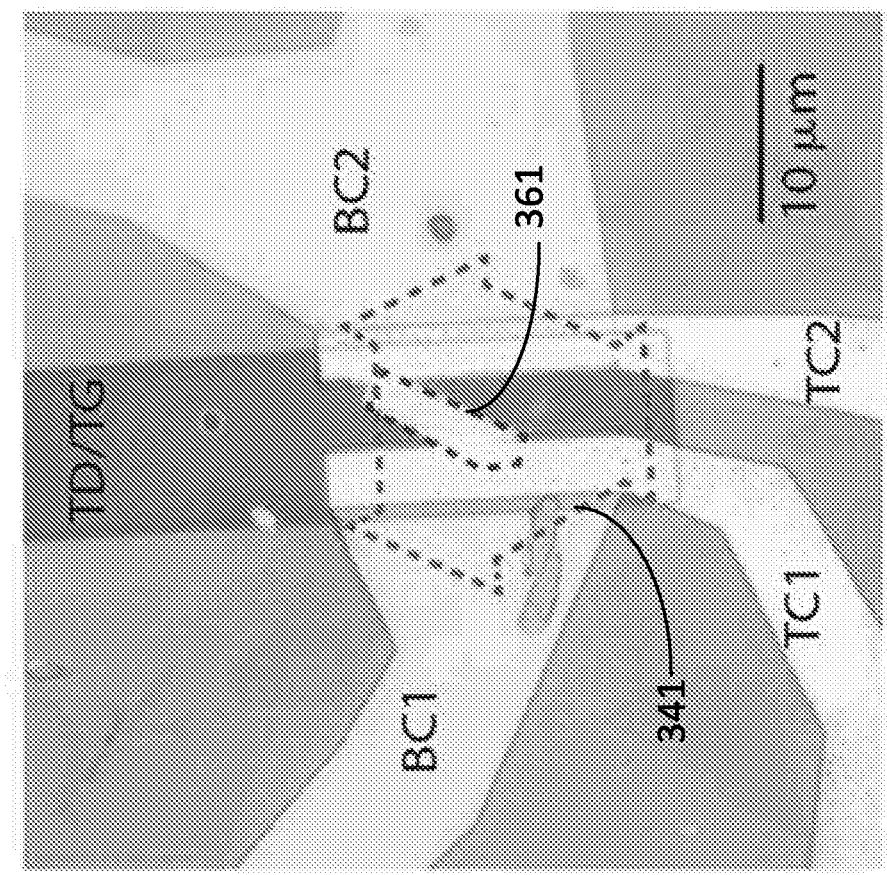
Figure 3C:
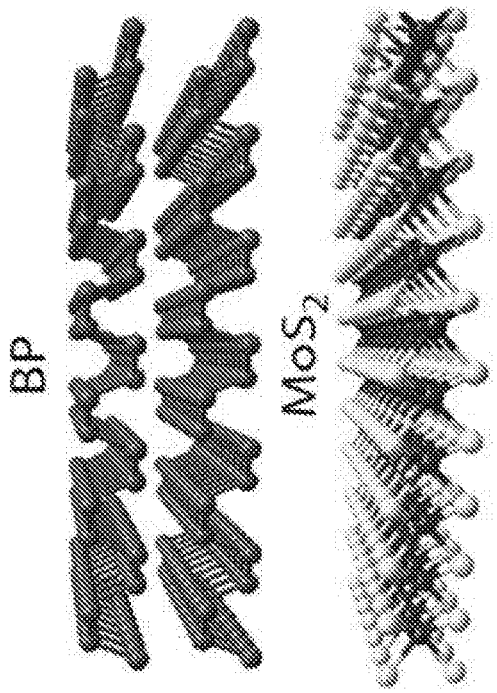
Figure 3D:
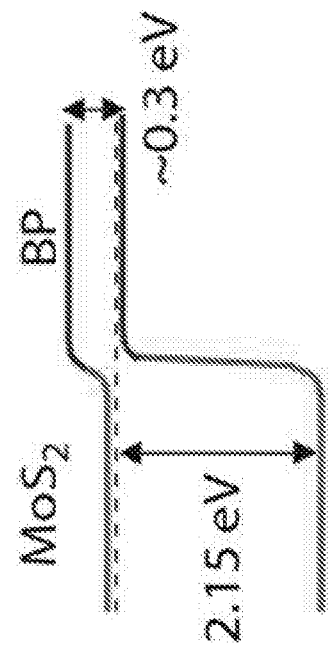
Figure 3G:
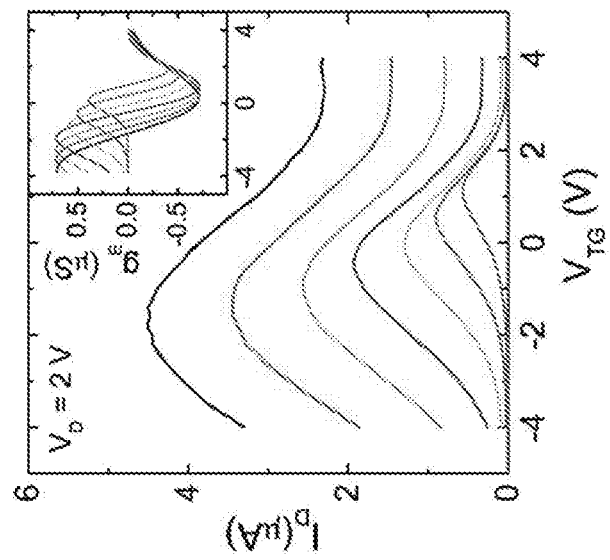
Figure 3F:
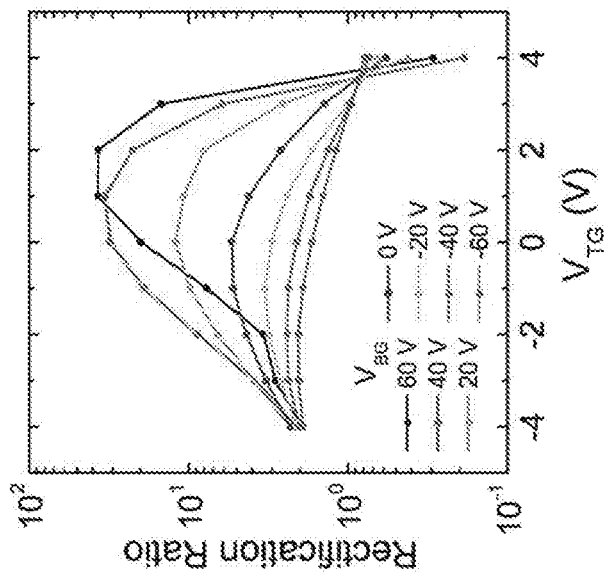

Specifically, self-aligned BP—$MoS_2$ vdWHs shown in FIGS. 3A-3G are fabricated by starting with CVD-grown $MoS_2$ on about 300 nm $SiO_2$ on heavily n-doped Si serving as a global bottom gate. Using recipe 2, contacts of (about 4 nm Ti)/(about 40 nm Au)/(about 4 nm Al) are deposited onto the $MoS_2$ and then encapsulated by about 30 nm thick $Al_2O_3$, as shown in FIG. 6. Before proceeding with the next lithography steps, the long-channel $MoS_2$ field-effect transistors (FETs) between bottom contact 1 and bottom contact 2 shown in FIG. 3B are measured to confirm the quality of the $MoS_2$ semiconductor. Mechanically exfoliated BP flakes (bulk crystal from HQ Graphene) with thicknesses of about 6-20 nm are transferred onto the device of interest using a dry transfer process via a two-stage inverted microscope with two sets of micromanipulators. Flakes exfoliated directly onto the PDMS stamp are transferred to the substrate of interest by Joule heating the substrate to about 100° C. for about 5 min. Because of the ambient instability of BP, subsequent steps are carried out quickly with minimal ambient exposure. Using a regular EBL process, (about 20 nm Ni)/(about 20 nm Au) are used to contact the transferred BP flake. After liftoff in the glovebox, recipe 1 is used to define the top gate. The encapsulation recipe that was developed to stabilize BP is used followed by growth of about 30 nm thick $Al_2O_3$ at about 100° C., metal deposition of (about 10 nm Cr)/(about 20 nm Au), and liftoff processes [27].

Figure 3E:
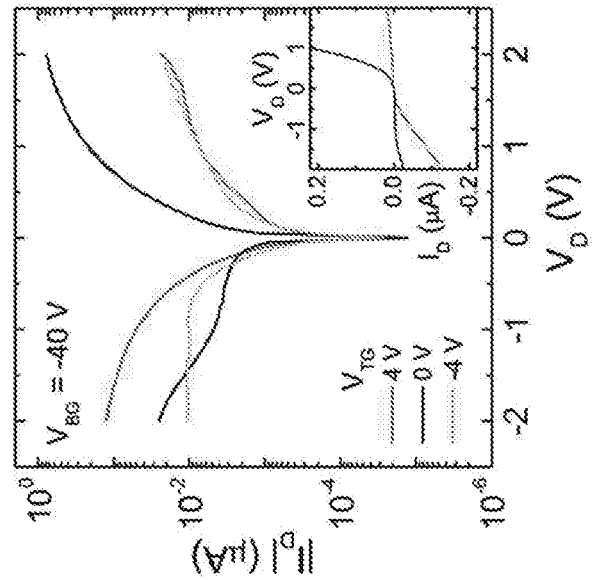

For dual-gated vdWHs, channel length L for the extension transistor with the first semiconductor is defined by the length of the dielectric extension, whereas L for the transistor with the second semiconductor is defined by the length of the dielectric extension plus the height of the first contact and the height of its encapsulation layer, as shown in FIGS. 3E and 6. Compared to a regular process with manual alignment of each layer, the self-alignment approach reduces the number of lithography steps from 3 to 2 for transistors and homojunction diodes and from 5 to 3 for vdWHs.

Materials Characterization and Electrical Measurements

Figures 7A, 7B, 7C:
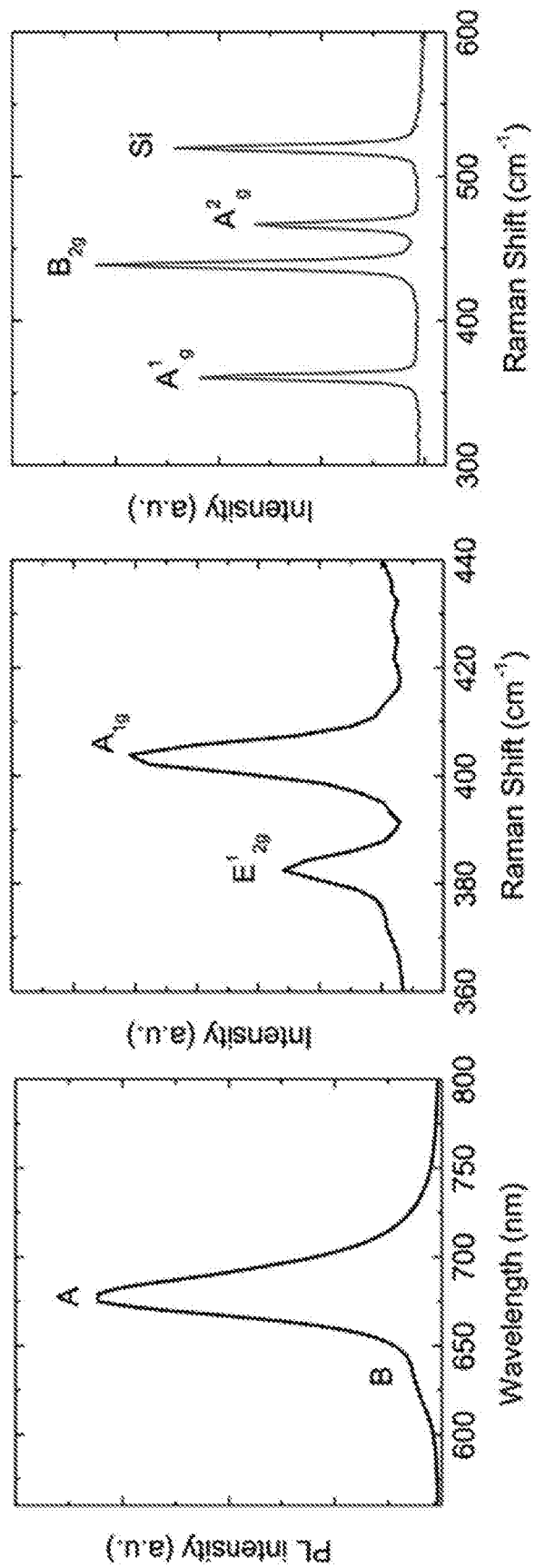
FIGS. 7A-7C show Raman and photoluminescence microscopy of $MoS_2$ and BP according to embodiments of the invention. Specifically.
Figure 9A:
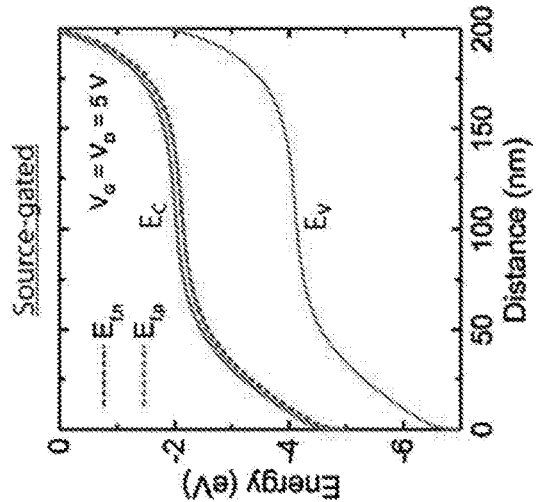
FIGS. 9A-9F show calculated energy diagrams and carrier density of source-gated, drain-gated, and back-gated transistors according to embodiments of the invention. Profile of conduction band minima ($E_c$), valence band maxima ($E_v$), quasi-Fermi level for electrons ($E_{f,n}$), and quasi Fermi level for holes ($E_{f,p}$) for the cases of a source-gated SASC $MoS_2$ transistor (FIG. 9A), a drain-gated SASC $MoS_2$ transistor (FIG. 9B), and a back-gated transistor geometry (FIG. 9C) under the same biasing conditions corresponding to FIG. 2D. The x-axis of the energy profile for the drain-gated case (FIG. 9B) is reversed to keep the biased electrode (drain) on the left side for comparison with the other two cases. $E_{f,n}$ and $E_{f,p}$ closely overlap in the plots.
Figure 9B:
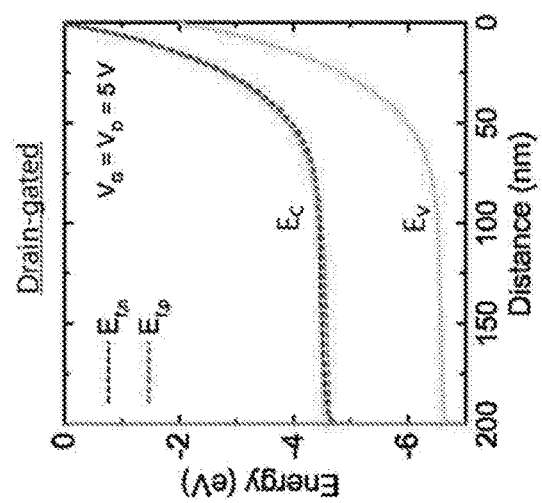
Figure 9C:
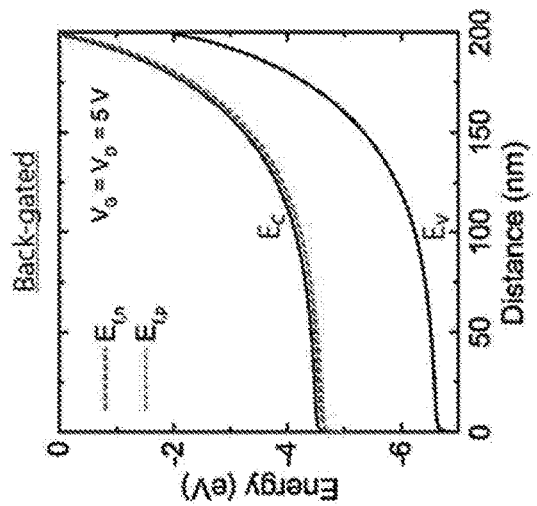
Figure 9D:
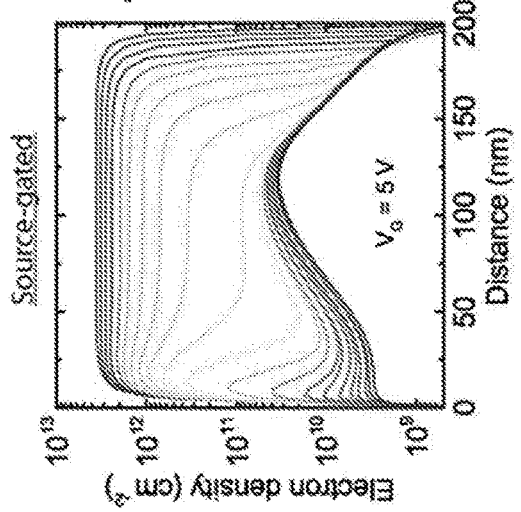
Figure 9E:
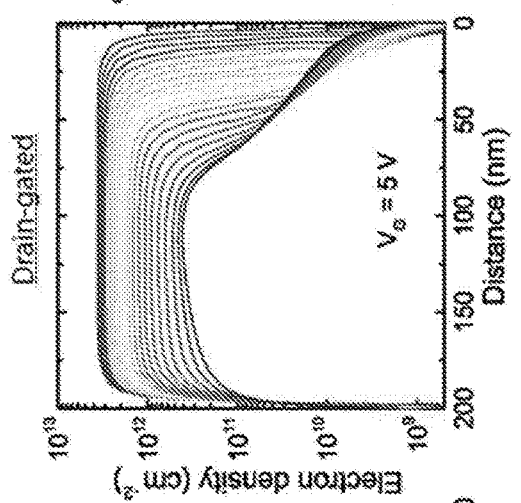
Figure 9F:
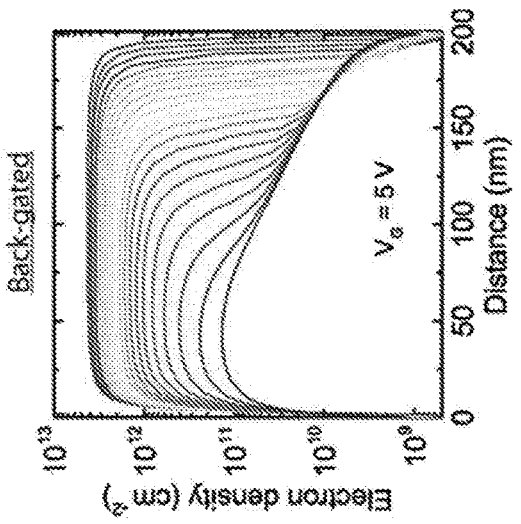
Figure 10B:
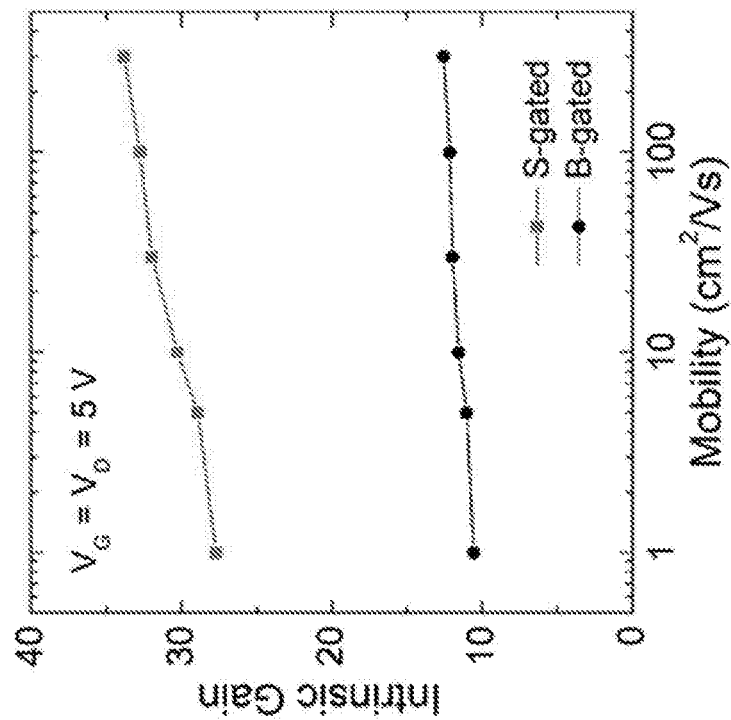
FIGS. 10A-10B show calculated conduction band minima of a drain-gated transistor and intrinsic gain versus mobility for source-gated and back-gated transistors according to embodiments of the invention.
Figure 10A:
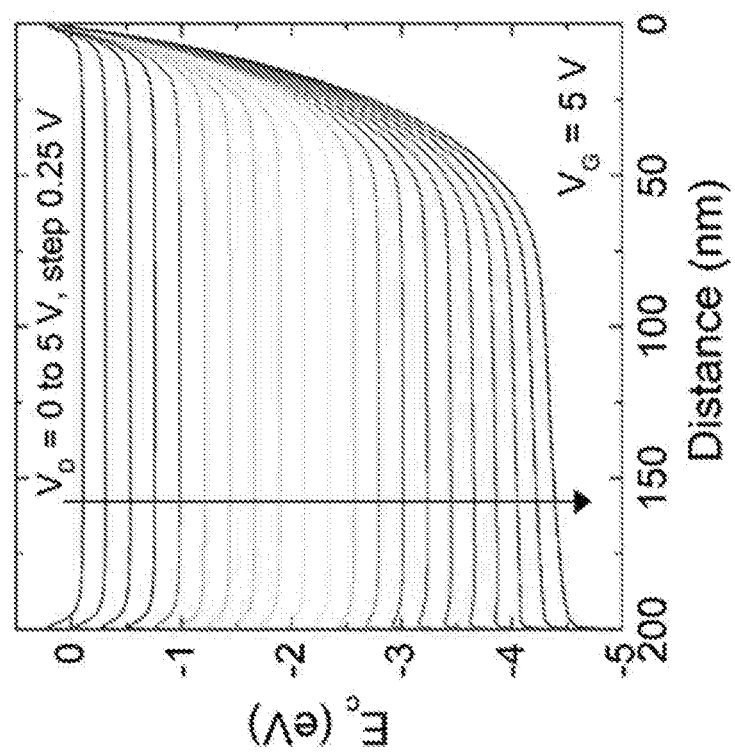
Figure 11C:
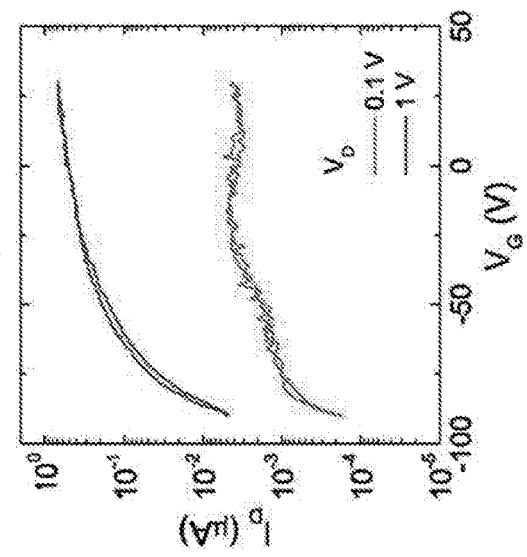
Figure 11D:
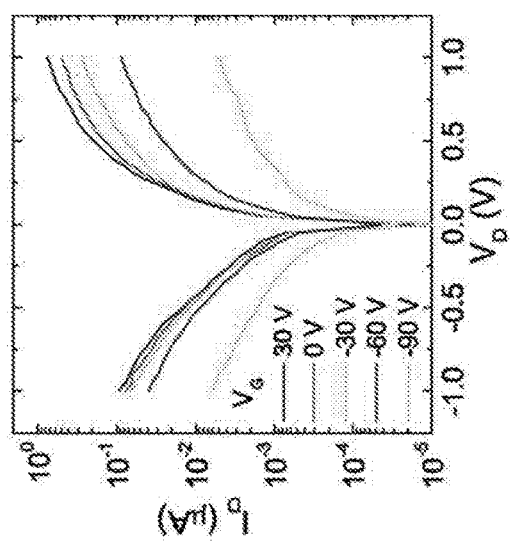
Figure 11A:
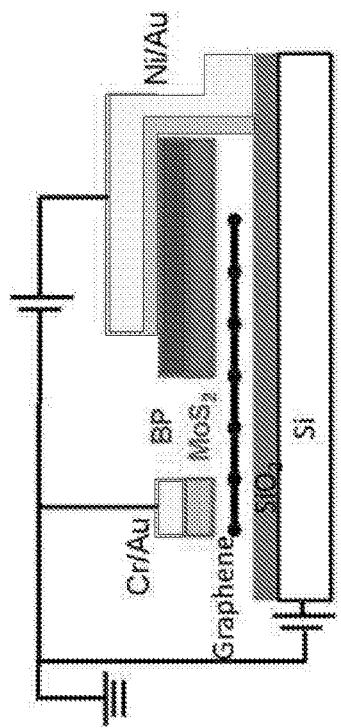
Figure 11B:
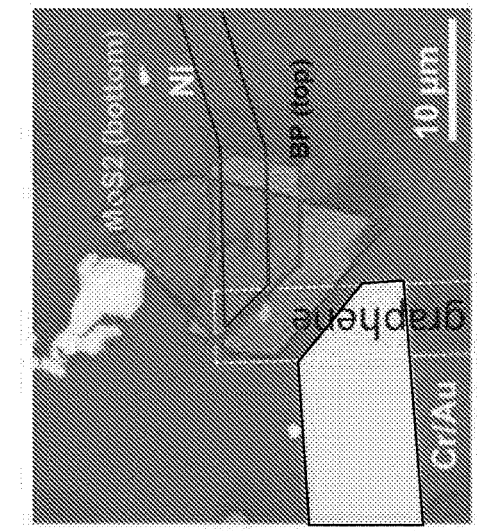

Raman and photoluminescence (PL) spectra of the 2D materials, as shown in FIGS. 7A-7C were collected using an excitation wavelength of about 532 nm with a Horiba Scientific XploRA PLUS Raman microscope with a 100× objective (spot size about 1 µm², NA=0.9). The scattered light was dispersed by an about 2400 grooves/mm grating for Raman spectra and by an about 600 grooves/mm grating for PL spectra, and collected on a CCD detector. The thicknesses of the different device layers were characterized by atomic force microscopy (AFM) in ambient using an Asylum Cypher AFM. All electrical measurements of devices were conducted in vacuum ($5 \times 10^{-5}$ Torr) using a probe station (LakeShoreCRX 4K) connected with Keithley 2400 source-meters controlled via home-made LabVIEW programs.

Device Simulations

The Sentaurus Technology Computer Aided Design (TCAD) software package (Synopsys, Inc.) [33] was used to model SASC $MoS_2$ transistors and self-aligned BP—$MoS_2$ vdWHs by solving the following steady-state coupled differential equations in two dimensions:

| | | |
|---|---|---|
| $\nabla \cdot (\varepsilon \nabla \phi) = -q(p - n + N_D - N_A) - \rho_{trap}$ | Poisson's equation | (1) |
| $\nabla \cdot \vec{J}_n = qR_{net,\,n}$ | Continuity equation for electrons | (2a) |
| $-\nabla \cdot \vec{J}_p = qR_{net,\,p}$ | Continuity equation for holes | (2b) |
| $\vec{J}_n = -nq\mu_n(\nabla \Phi_n)$ | Current equation for electrons | (3a) |
| $\vec{J}_p = -pq\mu_p(\nabla \Phi_p)$ | Current equation for holes | (3b) | where ε is the static permittivity, ϕ is the electrostatic potential, q is the electronic elementary charge, p and n are the hole and electron densities, $N_D$ and $N_A$ are the ionized donor and acceptor concentrations, $\rho_{trap}$ is the charge density contributed by traps and fixed charges, $\vec{J}_n$ and $\vec{J}_p$ are the electron and hole current densities, $R_{net,n}$ and $R_{net,p}$ are the net recombination rates for electrons and holes, $\mu_n$ and $\mu_p$ are the electron and hole mobilities, and $\Phi_n$ and $\Phi_p$ are the electron and hole quasi-Fermi potentials. The current equations can be simplified to Equations (3a) and (3b) by using the Einstein relation, $D_{n(p)} = kT\mu_{n(p)}$, that relates the diffusion coefficient $D_{n(p)}$ to the mobility $\mu_{n(p)}$, which is valid for non-degenerate semiconductors in thermal equilibrium. The model assumes Fermi-Dirac carrier statistics, complete dopant ionization, and a three-dimensional effective density of states (DOS). The finite element simulations incorporating these assumptions have successfully reproduced characteristics of $MoS_2$ transistors in previous work [3, 34].

Self-Aligned Short-Channel $MoS_2$ Transistors

The simulated device geometry (FIG. 2A, top) includes an about 0.7 nm thick and about 360 nm long $MoS_2$ region, separated by about 35 nm thick $Al_2O_3$ layers (grey) from the about 30 nm thick overlapping drain and local bottom gate electrodes (yellow) (FIG. 2A). The channel length (L) is about 200 nm in this example (FIG. 2A), defined by the edges of source and drain electrodes. The doping density ($N_D = 1.5 \times 10^{18}$ cm$^{-3}$) was estimated from the transfer characteristics of single-layer CVD $MoS_2$FETs. Predominantly, the free carriers in the K-valley ($DOS_{K\text{-}valley} \approx 20\ DOS_{Q\text{-}valley}$) are contributing to charge transport in single-layer $MoS_2$ at room temperature [35], which justifies the single-valley approximation for simulations.

The mobility of single-layer $MoS_2$ is modeled with an empirical expression for monolayer $MoS_2$, $$\mu_{MoS2} = \frac{3500}{N_I/10^{11}\text{cm}^{-2}}\left[A(\varepsilon_e) + \left(\frac{n}{10^{13}\text{cm}^{-2}}\right)^{1.2}\right]\text{cm}^2/Vs,\quad [36]$$

relating impurity concentration, $N_I$, free carrier density, n, and the effective dielectric constant, $\varepsilon_e$, of the dielectric environment whose effect is taken into account with the parameter $A(\varepsilon_e)$. In addition, the Caughey-Thomas formula [37] was implemented to account for velocity saturation at high electric fields, $$\mu_{hfield} = \mu_{MoS2}\bigg/\left[1 + \left(\frac{\mu_{MoS2}F_{hfs}}{v_{sat}}\right)^{\beta}\right]^{1/\beta},$$

where $\mu_{MoS2}$ is the low field mobility determined with the above formula, $v_{sat}$ is the saturation velocity, $F_{hfs} = |\nabla\Phi_n|$ is the driving field for electrons within the $MoS_2$ region, and β is a fitting parameter which defines the transition from low-field to saturation regime. The output characteristics of short-channel nMOSFETs were reproduced with β=1.8 [38], which was also used for SACS $MoS_2$ FETs.

The transport behavior of the back-gated FET, source-gated SASC FET, and drain-gated SASC FET is compared under the same conditions, as shown in FIG. 2B. In this case, $MoS_2$/Au interfaces were simplified as Ohmic contacts (i.e., with Dirichlet boundary condition), for which charge neutrality and equilibrium were assumed. The equilibrium potential was calculated numerically. To reproduce the experimental I-V curves with low-bias non-linearity in the drain-gated case, as shown in FIGS. 1F-1H, the $MoS_2$/Au interfaces were modeled as Schottky contacts with a barrier height $\Phi_B$ of 0.33 eV (FIG. 2C) [39]. Thermionic emission over the energy barrier $\Phi_B$ was simulated with an average thermal recombination velocity, $$\overline{v_{n,p}} = \sqrt{\frac{kT}{2m_{n,p}\pi}}.$$

Tunneling through the energy barrier was modeled employing the Wentzel-Kramers-Brillouin (WKB) approximation using reported values for degeneracy and carrier effective masses (see Table 1). A positive fixed charge concentration of $2.2\times10^{12}$ cm$^{-2}$ at the Al$_2$O$_3$/MoS$_2$ interface was found by comparing the experimental V$_{TH}$ (FIG. 1H) with V$_{TH}$ of the simulated transfer characteristics. The impurity concentration N$_1$ in the mobility expression served as a fitting parameter to reproduce the measured output curves (FIGS. 1F-1G) and was found to be N$_1$=$4\times10^{19}$ cm$^{-3}$, resulting in an electron mobility $\mu_n$≠5 cm$^2$/Vs. Although the assumption of Schottky contacts reproduces the low-bias (V$_D$<2 V) positive curvature in the drain-gated configuration, it does not reproduce the negative curvature seen at V$_D$=3.5 V (compare FIG. 2C with FIG. 1G). In prior literature [18], such negative curvature has been assigned to the formation of a pinch-off point near the drain contact that does affect the curvature of the characteristics despite the strong suppression in the drain-gated case.

TABLE 1

Material constants for MoS$_2$ used in the SASC FET.

| Parameters 1-L MoS$_2$ | Value | Reference |
|---|---|---|
| Film thickness | 0.7 nm | |
| Bandgap, E$_g$ | 2.15 eV | [40] |
| Electron affinity, χ | 4.2 eV | [41] |
| In-plane and out-of-plane dielectric constant, $\epsilon_{MoS2}$ | 4.2 | [42] |
| K-valley electron effective mass, m*$_n$ | 0.51 | [43] |
| K-valley hole effective mass, m*$_p$ | 0.54 | [43] |
| K-valley degeneracies, g$_{c,v}$ | 2 | [44] |
| Interface state density, D$_{it}$ | $6.9\times10^{11}$ cm$^{-2}$ | this invention |
| Donor concentration, N$_D$ | $1.5\times10^{18}$ cm$^{-3}$ | fitting parameter |
| Device model parameters | | |
| Schottky Barrier height at Au/MoS$_2$ interface, Φ$_B$ | 0.33 eV | [39] |
| Dielectric constant ALD AL$_2$O$_3$, $\epsilon_{Al2O3}$ | 6.5 | [45] |
| Mobility model parameters | | |
| Saturation velocity, v$_{sat}$ | $3\times10^6$ cm s$^{-1}$ | [46, 47] |
| Parameter β | 1.8 | [38] |
| Parameter A($\epsilon_e$) | 0.08 | this invention |
| Impurity concentration, N$_I$ | $4\times10^{19}$ cm$^{-3}$ | this invention |

Self-Aligned BP/MoS$_2$ vdWHs

The goal here is to understand the role and interplay of the device geometry, dielectric environment, and bias configuration for electrostatic doping in a vdWH device. The assumption is that electrostatically controlled carrier density governs transport through the vdWH. The experimental I-V curves were qualitatively reproduced using a simplified model (compared to the MoS$_2$SASC device model). Constant mobilities for BP and MoS$_2$ are justified with the low intrinsic carrier density of BP and operation in a low-field regime. Band-to-band tunneling at the BP—MoS$_2$ interface was neglected. Exposure of BP to ambient air was unavoidable during device fabrication and therefore we assume partially oxidized BP with a high impurity concentration. Acceptor and donor type trap states with an exponential distribution were included in the BP (see Table 1). Materials parameters used in the simulations for BP/MoS$_{2vdWH}$s are listed in Table 2.

TABLE 2

Material constants used to simulate BP-MoS$_2$ vdWHs.

| Parameters 5 nm BP | Value | Reference |
|---|---|---|
| Film thickness | 5 nm | |
| Bandgap, E$_g$ | 0.4 eV | [26] |
| Electron affinity, χ | 3.6 eV | [48] |
| Dielectric constant, $\epsilon_{BP}$ | 8.3 (out-of-plane) | [49] |
| K-valley electron effective mass, m*$_n$ | 0.67 | [50] |
| K-valley hole effective mass, m*$_p$ | 0.52 | [50] |
| K-valley degeneracies, g$_{c,v}$ | 2 | [51] |
| Interface state density, D$_{it}$ | $6.9\times10^{11}$ cm$^{-2}$ | this invention |
| Effective intrinsic density | $1.2\times10^{16}$ cm$^{-3}$ | |
| Device model parameters | | |
| Schottky Barrier height at Ni/BP interface, Φ$_B$ | 0.38 eV | [52] |
| Dielectric constant ALD AL$_2$O$_3$, $\epsilon_{Al2O3}$ | 6.5 | [45] |
| Dielectric constant SiO$_2$, $\epsilon_{SiO2}$ | 3.9 | |
| Interface trap charge density | $5.5\times10^{12}$ cm$^{-2}$ | |
| Acceptor and Donor type trap state density | $4\times10^{18}$ cm$^{-3}$ | |
| Mobility model parameters | | |
| Constant mobility, $\mu_{BP}$ | 20 cm$^2$/Vs | [27] |
| Constant mobility, $\mu_{MoS2}$ | 5 cm$^2$/Vs | this invention |

In sum, a general self-aligned fabrication scheme is reported here for a diverse class of electronic devices based on van der Waals materials and heterojunctions. In particular, self-alignment enables the fabrication of source-gated transistors in monolayer MoS$_2$ with near-ideal current saturation characteristics and channel lengths down to about 135 nm. Furthermore, self-alignment of van der Waals p-n heterojunction diodes achieves complete electrostatic control of both the p-type and n-type constituent semiconductors in a dual-gated geometry, resulting in gate-tunable mean and variance of anti-ambipolar Gaussian characteristics. Through finite-element device simulations, the operating principles of source-gated transistors and dual-gated anti-ambipolar devices are elucidated, thus providing design rules for additional devices that employ self-aligned geometries. For example, the versatility of this scheme is demonstrated via contact-doped MoS$_2$ homojunction diodes and mixed-dimensional heterojunctions based on organic semiconductors. The scalability of this approach is also shown by fabricating self-aligned short-channel transistors with sub-diffraction channel lengths in the range of about 150 nm to about 800 nm using photolithography on large-area MoS$_2$ films grown by chemical vapor deposition. Overall, this self-aligned fabrication method represents an important step towards the scalable integration of van der Waals heterojunction devices into more sophisticated circuits and systems.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

LIST OF REFERENCES

[1]. Bower, R. W.; Dill, R. G. *IEEE Int. Elect. Dev. Meeting* 1966, 12, 102-104.
[2]. Bettis Homan, S.; Sangwan, V. K.; Balla, I.; Bergeron, H.; Weiss, E. A.; Hersam, M. C. *Nano Lett.* 2017, 17, 164-169.
[3]. Jariwala, D.; Howell, S. L.; Chen, K.-S.; Kang, J.; Sangwan, V. K.; Filippone, S. A.; Turrisi, R.; Marks, T. J.; Lauhon, L. J.; Hersam, M. C. *Nano Lett.* 2016, 16, 497-503.
[4]. Jariwala, D.; Marks, T. J.; Hersam, M. C. *Nat. Mater.* 2016, 16, 170-181.
[5]. Desai, S. B.; Madhvapathy, S. R.; Sachid, A. B.; Llinas, J. P.; Wang, Q.; Ahn, G. H.; Pitner, G.; Kim, M. J.; Bokor, J.; Hu, C.; Wong, H.-S. P.; Javey, A. *Science* 2016, 354, 99-102.
[6]. Yan, R.; Fathipour, S.; Han, Y.; Song, B.; Xiao, S.; Li, M.; Ma, N.; Protasenko, V.; Muller, D. A.; Jena, D.; Xing, H. G. *Nano Lett.* 2015, 15, 5791-5798.
[7]. Grigorieva, I. V.; Geim, A. K. *Nature* 2013, 499, 419-425.
[8]. Jariwala, D.; Sangwan, V. K.; Seo, J.-W. T.; Xu, W.; Smith, J.; Kim, C. H.; Lauhon, L. J.; Marks, T. J.; Hersam, M. C. *Nano Lett.* 2015, 15, 416-421.
[9]. Jariwala, D.; Sangwan, V. K.; Wu, C.-C.; Prabhumirashi, P. L.; Geier, M. L.; Marks, T. J.; Lauhon, L. J.; Hersam, M. C. *Proc. Natl. Acad. Sci. U.S.A.* 2013, 110, 18076-18080.
[10]. Cheng, R.; Bai, J.; Liao, L.; Zhou, H.; Chen, Y.; Liu, L.; Lin, Y.-C.; Jiang, S.; Huang, Y.; Duan, X. *Proc. Natl. Acad. Sci. U.S.A.* 2012, 109, 11588-11592.
[11]. Liu, H.; Neal, A. T.; Ye, P. D. *ACS Nano* 2012, 6, 8563-8569.
[12]. Hattori, R.; Shirafuji, J. *J. J. Appl. Phys.* 1994, 33, 612.
[13]. Shannon, J. M.; Gerstner, E. G. *IEEE Elec. Dev. Lett.* 2003, 24, 405-407.
[14]. Valletta, A.; Mariucci, L.; Rapisarda, M.; Fortunato, G. *JAP* 2013, 114, 064501.
[15]. Sze, S. M.; Ng, K. K., *Physics of Semiconductor Devices*. Wiley-Interscience: 2006.
[16]. Balon, F.; Shannon, J. M. *Sol. Stat. Electron.* 2006, 50, 378-383.
[17]. Lindner, T.; Paasch, G.; Scheinert, S. *IEEE Trans. Electron Dev.* 2005, 52, 47-55.
[18]. Sporea, R. A.; Trainor, M. J.; Young, N. D.; Guo, X.; Shannon, J. M.; Silva, S. R. P. *Sol. Stat. Electron.* 2011, 65, 246-249.
[19]. Sanne, A.; Ghosh, R.; Rai, A.; Yogeesh, M. N.; Shin, S. H.; Sharma, A.; Jarvis, K.; Mathew, L.; Rao, R.; Akinwande, D.; Banerjee, S. *Nano Lett.* 2015, 15, 5039-5045.
[20]. Lee, C.-H.; Lee, G.-H.; van der Zande, A. M.; Chen, W.; Li, Y.; Han, M.; Cui, X.; Arefe, G.; Nuckolls, C.; Heinz, T. F.; Guo, J.; Hone, J.; Kim, P. *Nat. Nanotechnol.* 2014, 9, 676-681.
[21]. Nourbakhsh, A.; Zubair, A.; Dresselhaus, M. S.; Palacios, T. *Nano Lett.* 2016, 16, 1359-1366.
[22]. Roy, T.; Tosun, M.; Cao, X.; Fang, H.; Lien, D.-H.; Zhao, P.; Chen, Y.-Z.; Chueh, Y.-L.; Guo, J.; Javey, A. *ACS Nano* 2015, 9, 2071-2079.
[23]. Withers, F.; Del Pozo-Zamudio, O.; Mishchenko, A.; Rooney, A. P.; Gholinia, A.; Watanabe, K.; Taniguchi, T.; Haigh, S. J.; Geim, A. K.; Tartakovskii, A. I.; Novoselov, K. S. *Nat Mater* 2015, 14, 301-306.
[24]. Zhou, R.; Ostwal, V.; Appenzeller, J. *Nano Lett.* 2017, 17, 4787-4792.
[25]. Deng, Y.; Luo, Z.; Conrad, N. J.; Liu, H.; Gong, Y.; Najmaei, S.; Ajayan, P. M.; Lou, J.; Xu, X.; Ye, P. D. *ACS Nano* 2014, 8, 8292-8299.
[26]. Liu, X.; Qu, D.; Li, H.-M.; Moon, I.; Ahmed, F.; Kim, C.; Lee, M.; Choi, Y.; Cho, J. H.; Hone, J. C.; Yoo, W. *J. ACS Nano* 2017, 11, 9143-9150.
[27]. Wood, J. D.; Wells, S. A.; Jariwala, D.; Chen, K.-S.; Cho, E.; Sangwan, V. K.; Liu, X.; Lauhon, L. J.; Marks, T. J.; Hersam, M. C. *Nano Lett.* 2014, 14, 6964-6970.
[28]. Crespo, J. L.; Duro, R. J.; Pena, F. L. *IEEE Trans. Instr. & Measure.* 2003, 52, 724-732.
[29]. Chuang, S.; Battaglia, C.; Azcatl, A.; McDonnell, S.; Kang, J. S.; Yin, X.; Tosun, M.; Kapadia, R.; Fang, H.; Wallace, R. M.; Javey, A. *Nano Lett.* 2014, 14, 1337-1342.
[30]. Jariwala, D.; Sangwan, V. K.; Lauhon, L. J.; Marks, T. J.; Hersam, M. C. *ACS Nano* 2014, 8, 1102-1120.
[31]. Lotsch, B. V. *Annu. Rev. Mater. Res.* 2015, 45, 85-109.
[32]. Zhou, R.; Ostwal, V.; Appenzeller, J. *Nano Lett.* 2017, 17, 4787-4792.
[33]. https://www.synopsys.com
[34]. Howell, S. L.; Jariwala, D.; Wu, C.-C.; Chen, K.-S.; Sangwan, V. K.; Kang, J.; Marks, T. J.; Hersam, M. C.; Lauhon, L. *J. Nano Lett.* 2015, 15, 2278-2284.
[35]. Nan, M.; Debdeep, J. *2D Materials* 2015, 2, 015003.
[36]. Ma, N.; Jena, D. *Phys. Rev. X* 2014, 4, 011043.
[37]. Caughey, D. M.; Thomas, R. E. *Proceedings of the IEEE* 1967, 55, 2192-2193.
[38]. Khakifirooz, A.; Nayfeh, O. M.; Antoniadis, D. *IEEE Trans. Electron Dev.* 2009, 56, 1674-1680.
[39]. Liu, W.; Sarkar, D.; Kang, J.; Cao, W.; Banerjee, K. *ACS Nano* 2015, 9, 7904-7912.
[40]. Zhang, C.; Johnson, A.; Hsu, C.-L.; Li, L.-J.; Shih, C.-K. *Nano Lett.* 2014, 14, 2443-2447.
[41]. Sup Choi, M.; Lee, G.-H.; Yu, Y.-J.; Lee, D.-Y.; Hwan Lee, S.; Kim, P.; Hone, J.; Jong Yoo, W. *Nat. Commun.* 2013, 4, 1624.
[42]. Cheiwchanchamnangij, T.; Lambrecht, W. R. L. *Phys. Rev. B* 2012, 85, 205302.
[43]. Wickramaratne, D.; Zahid, F.; Lake, R. K. *J. Chem. Phys.* 2014, 140, 124710.
[44]. Padilha, J. E.; Peelaers, H.; Janotti, A.; Van de Walle, C. G. *Phys. Rev. B* 2014, 90, 205420.
[45]. Sangwan, V. K.; Jariwala, D.; Filippone, S. A.; Karmel, H. J.; Johns, J. E.; Alaboson, J. M. P.; Marks, T. J.; Lauhon, L. J.; Hersam, M. C. *Nano Lett.* 2013, 13, 1162-1167.
[46]. He, G.; Ghosh, K.; Singisetti, U.; Ramamoorthy, H.; Somphonsane, R.; Bohra, G.; Matsunaga, M.; Higuchi, A.; Aoki, N.; Najmaei, S.; Gong, Y.; Zhang, X.; Vajtai, R.; Ajayan, P. M.; Bird, J. P. *Nano Lett.* 2015, 15, 5052-5058.
[47]. Fiori, G.; Szafranek, B. N.; Iannaccone, G.; Neumaier, D. *Appl. Phys. Lett.* 2013, 103, 233509.
[48]. Edmonds, M. T.; Tadich, A.; Carvalho, A.; Ziletti, A.; O'Donnell, K. M.; Koenig, S. P.; Coker, D. F.; Özyilmaz, B.; Neto, A. H. C.; Fuhrer, M. S. *ACS Appl. Mater. & Inter.* 2015, 7, 14557-14562.

[49]. Nagahama, T.; Kobayashi, M.; Akahama, Y.; Endo, S.; Narita, S.-i. *J. Phys. Soc. Japan* 1985, 54, 2096-2099.

[50]. Qiao, J.; Kong, X.; Hu, Z.-X.; Yang, F.; Ji, W. *Nat. Commun.* 2014, 5, 4475.

[51]. Yuchen, D.; Adam, T. N.; Hong, Z.; Peide, D. Y. *2D Materials* 2016, 3, 024003.

[52]. Ling, Z.-P.; Sakar, S.; Mathew, S.; Zhu, J.-T.; Gopinadhan, K.; Venkatesan, T.; Ang, K.-W. *Scientific Reports* 2015, 5, 18000.

[53]. Lee, C.; Yan, H.; Brus, L. E.; Heinz, T. F.; Hone, J.; Ryu, S. *ACS Nano* 2010, 4, 2695-2700.

What is claimed is:

1. A self-aligned short-channel (SASC) electronic device, comprising:
   a first semiconductor layer formed on a substrate;
   a first metal layer formed on a first portion of the first semiconductor layer;
   a first dielectric layer formed on the first metal layer and extended with a dielectric extension on a second portion of the first semiconductor layer that extends from the first portion of the first semiconductor layer, wherein the dielectric extension defines a channel length of a channel in the first semiconductor layer; and
   a gate electrode formed on the substrate and capacitively coupled with the channel,
   wherein the substrate comprises a silicon (Si) layer that forms the gate electrode, and an oxidized silicon ($SiO_2$) layer that forms a gate dielectric layer formed between the first semiconductor layer and the gate electrode.

2. The SASC electronic device of claim 1, wherein the channel length is less than about 800 nm, preferably, less than about 200 nm, more preferably, about 135 nm.

3. The SASC electronic device of claim 1, wherein the gate electrode is formed of highly doped silicon (Si), or a conductive material rather than Si.

4. The SASC electronic device of claim 1, wherein the first semiconductor layer formed of an atomically thin material comprising $MoS_2$, $MoSe_2$, $WS_2$, $WSe_2$, InSe, GaTe, black phosphorus (BP), or related two-dimensional materials.

5. A circuitry, comprising one or more SASC electronic devices according to claim 1.

6. A self-aligned short-channel (SASC) electronic device, comprising:
   a first semiconductor layer formed on a substrate;
   a first metal layer formed on a first portion of the first semiconductor layer;
   a first dielectric layer formed on the first metal layer and extended with a dielectric extension on a second portion of the first semiconductor layer that extends from the first portion of the first semiconductor layer, wherein the dielectric extension defines a channel length of a channel in the first semiconductor layer;
   a gate electrode formed on the substrate and capacitively coupled with the channel; and
   a second metal layer formed on the first dielectric layer and a third portion of the first semiconductor layer that extends from the second portion of the first semiconductor layer.

7. The SASC electronic device of claim 6, further comprising a gate dielectric layer formed between the first semiconductor layer and the gate electrode.

8. The SASC electronic device of claim 7, wherein the gate dielectric layer is formed of oxidized silicon ($SiO_2$), or a dielectric material rather than $SiO_2$.

9. The SASC electronic device of claim 6, wherein the substrate comprises a silicon (Si) layer that forms the gate electrode, and an oxidized silicon ($SiO_2$) layer that forms a gate dielectric layer formed between the first semiconductor layer and the gate electrode.

10. The SASC electronic device of claim 6, wherein the SASC electronic device is a transistor or a contact-doped diode.

11. A self-aligned short-channel (SASC) electronic device, comprising:
    a first semiconductor layer formed on a substrate;
    a first metal layer formed on a first portion of the first semiconductor layer;
    a first dielectric layer formed on the first metal layer and extended with a dielectric extension on a second portion of the first semiconductor layer that extends from the first portion of the first semiconductor layer, wherein the dielectric extension defines a channel length of a channel in the first semiconductor layer;
    a gate electrode formed on the substrate and capacitively coupled with the channel;
    a second semiconductor layer formed on the first dielectric layer and a third portion of the first semiconductor layer that extends from the second portion of the first semiconductor layer;
    a second metal layer formed on a first portion of the second semiconductor layer that is overlapped with the first metal layer; and
    a second dielectric layer formed on the second metal layer and extended on a second portion of the second semiconductor layer that extends from the first portion of the second semiconductor layer.

12. The SASC electronic device of claim 11, wherein the first and second dielectric layers are formed of a same dielectric material or different dielectric materials.

13. The SASC electronic device of claim 12, wherein the first and second dielectric layers comprise $Al_2O_3$, $HfO_2$, $ZrO_2$, or ZnO.

14. The SASC electronic device of claim 12, wherein each of the first and second dielectric layers is formed by atomic layer deposition (ALD).

15. The SASC electronic device of claim 11, wherein the first and second semiconductor layers are formed of different semiconductors.

16. The SASC electronic device of claim 15, wherein the first semiconductor layer is formed of an atomically thin material comprising one of $MoS_2$, $MoSe_2$, $WS_2$, $WSe_2$, InSe, GaTe and black phosphorus (BP), and the second semiconductor layer is formed of a second semiconductor comprising BP, $WSe_2$, or single-walled carbon nanotubes (SWCNTs).

17. The SASC electronic device of claim 11, wherein the SASC electronic device comprises self-aligned van der Waals heterojunctions (vdWHs).

18. The SASC electronic device of claim 11, further comprising a top gate electrode formed on the second dielectric layer.

19. The SASC electronic device of claim 11, wherein the first and second metal layers are formed of a same metallic material or different metallic materials, and serve as a bottom contact (BC) and a top contact (TC) for minimum contact resistance with the first and second semiconductors, respectively.

20. The SASC electronic device of claim 19, wherein each of the first and second metal layers is formed one of gold (Au), titanium (Ti), aluminum (Al), nickel (Ni), chromium (Cr), and other conductive materials.

21. The SASC electronic device of claim 20, wherein the first and second metal layers comprise Au and Ni, respectively.

22. A method for fabricating a self-aligned short-channel (SASC) electronic device, comprising:
forming an undercut profile with a bilayer resist on a first semiconductor layer that is formed on a substrate;
forming a first metal layer on the undercut profile and the bilayer resist by a directional deposition process;
forming a first dielectric layer on the first metal layer by atomic layer deposition (ALD) so that the first dielectric layer on the first metal layer in the undercut profile has a dielectric extension conformally grown on the first semiconductor layer in a self-aligned manner; and
forming an encapsulated metal contact in the undercut profile by directional evaporation of metal of the first metal layer on the bilayer resist and lift-off process to remove the bilayer resist, wherein the encapsulated metal contact comprises the first metal covered by the first dielectric layer with the dielectric extension on the first semiconductor, so as to form an SASC electronic device, wherein the dielectric extension defines a channel length of a channel of the SASC electronic device in the first semiconductor layer,
wherein the substrate comprises a silicon (Si) layer defining a gate electrode capacitively coupled with the channel.

23. The method of claim 22, wherein the first semiconductor layer is formed of an atomically thin material on an oxidized silicon (SiO$_2$) layer of the substrate by chemical vapor deposition (CVD).

24. The method of claim 23, wherein the SiO$_2$ layer is disposed between the gate electrode and the first semiconductor layer.

25. The method of claim 22, wherein the bilayer resist comprises a first resist formed on the first semiconductor layer and a second resist formed on the first resist, wherein the first resist has a molecular weight that is lower than that of the second resist, whereby the first resist has a sensitivity to electron dose being higher than that of the second resist.

26. The method of claim 25, wherein the step of forming the undercut profile with the bilayer resist is formed by electron-beam lithography, such that the undercut profile has a first gap between edges defined by the first resist being wider than a second gap between edges defined by the second resist.

27. The method of claim 22, further comprising forming a second metal layer on the first dielectric layer with the dielectric extension and the first semiconductor layer.

28. The method of claim 27, wherein the step of forming the second metal layer is performed by evaporation of the same metal or a different metal of the first metal layer.

29. The method of claim 27, wherein the SASC electronic device is a transistor or a contact-doped diode.

30. The method of claim 22, further comprising:
forming a second semiconductor layer on the first dielectric layer with the dielectric extension and the first semiconductor;
forming a second metal layer on a first portion of the second semiconductor layer that is overlapped with the first metal layer; and
forming a second dielectric layer on the second metal layer and a second portion of the second semiconductor layer that extends from the first portion of the second semiconductor layer, by the ALD.

31. The method of claim 30, wherein the step of forming the second semiconductor layer on the first dielectric layer with the dielectric extension and the first semiconductor comprises:
mechanically exfoliating flakes of a second semiconductor onto a polydimethylsiloxane (PDMS) substrate; and
transferring the mechanically exfoliated flakes of the second semiconductor from the PDMS substrate to the first dielectric layer with the dielectric extension and the first semiconductor using a micromanipulator and/or an optical microscope.

32. The method of claim 30, wherein the first and second semiconductor layers are formed of different semiconductors.

33. The method of claim 32, wherein the first semiconductor layer is formed of an atomically thin material comprising one of MoS$_2$, MoSe$_2$, WS$_2$, WSe$_2$, InSe, GaTe and black phosphorus (BP), and the second semiconductor layer is formed of a second semiconductor comprising BP, WSe$_2$, or single-walled carbon nanotubes (SWCNTs).

34. The method of claim 30, wherein the first and second dielectric layers are formed of a same dielectric material or different dielectric materials.

35. The method of claim 30, wherein the first and second metal layers are formed of a same metallic material or different metallic materials.

36. The method of claim 30, further comprising forming a top gate electrode on the second dielectric layer.

37. The method of claim 22, wherein the SASC electronic device comprises forming van der Waals heterojunctions (vdWHs).

38. A method for fabricating a self-aligned short-channel (SASC) electronic device, comprising:
forming a two dimensional (2D) semiconductor device having a channel length being less than about 200 nm,
wherein the 2D semiconductor device comprises:
a first semiconductor layer formed of an atomically thin material on a substrate;
a first metal layer formed on the first semiconductor layer; and
a first dielectric layer formed on the first metal layer and extended with a dielectric extension on the first semiconductor layer, wherein the dielectric extension defines the channel length in the first semiconductor layer,
wherein the step of forming the 2D semiconductor device comprises:
forming an undercut profile with a bilayer resist on the first semiconductor layer by electron-beam lithography, wherein the bilayer resist comprises a first resist formed on the first semiconductor layer and a second resist formed on the first resist, wherein the first resist has a molecular weight that is lower than that of the second resist, such that the formed undercut profile has a first gap between edges defined by the first resist being wider than a second gap between edges defined by the second resist;
directionally depositing a first metal in the undercut profile to form the first metal layer; and
ALD growing a first dielectric material on the first metal layer to form the first dielectric layer with the dielectric extension conformally grown on the first semiconductor layer in the undercut profile in a self-aligned manner.

39. The method of claim 38, wherein the step of forming the 2D semiconductor device further comprises:

directionally evaporating the first metal on the bilayer resist; and removing the bilayer resist.

40. The method of claim 39, wherein the 2D semiconductor device is a transistor or a contact-doped diode.

41. The method of claim 39, wherein van der Waals heterojunctions (vdWHs) are achieved by transferring another 2D semiconductor device followed by metallization.

\* \* \* \* \*